(12) United States Patent
Smith et al.

(10) Patent No.: US 12,214,315 B2
(45) Date of Patent: Feb. 4, 2025

(54) SYSTEM AND METHOD FOR ELECTRICALLY CONDUCTIVE MEMBRANE SEPARATION

(71) Applicant: SiTration, Inc., Cambridge, MA (US)

(72) Inventors: Brendan D. Smith, Cambridge, MA (US); Jatin Patil, Cambridge, MA (US); Daniel Bregante, Cambridge, MA (US); Ahmed Helal, Cambridge, MA (US); Hee Yun Choi Kim, Cambridge, MA (US); Morgan Baima, Cambridge, MA (US); Jeffrey C. Grossman, Cambridge, MA (US); Noah Letwat, Cambridge, MA (US)

(73) Assignee: SiTration, Inc., Cambridge, MA (US)

( * ) Notice: Subject to any disclaimer, the term of this patent is extended or adjusted under 35 U.S.C. 154(b) by 0 days.

(21) Appl. No.: 18/382,884

(22) Filed: Oct. 23, 2023

(65) Prior Publication Data
US 2024/0042387 A1     Feb. 8, 2024

Related U.S. Application Data

(63) Continuation of application No. 18/212,590, filed on Jun. 21, 2023, which is a continuation-in-part of application No. 17/845,667, filed on Jun. 21, 2022.
(Continued)

(51) Int. Cl.
*B01D 61/08*     (2006.01)
*B01D 61/02*     (2006.01)
(Continued)

(52) U.S. Cl.
CPC .......... *B01D 61/08* (2013.01); *B01D 61/027* (2013.01); *B01D 67/0062* (2013.01);
(Continued)

(58) Field of Classification Search
None
See application file for complete search history.

(56) References Cited

U.S. PATENT DOCUMENTS 10,943,982 B2    3/2021    Grossman et al.
11,004,943 B2    5/2021    Smith et al.
(Continued)

FOREIGN PATENT DOCUMENTS

DE      102009015562 A1 * 10/2010 ............. B01D 61/22

OTHER PUBLICATIONS

Roselien Vercauteren, et al., Porous silicon membranes and their applications: Recent advances, Sensors and Actuators A: Physical, vol. 318, 2021, 112486 (Year: 2021).*
(Continued)

*Primary Examiner* — Jason M Greene
*Assistant Examiner* — Eric J McCullough
(74) *Attorney, Agent, or Firm* — POLSINELLI PC

(57) ABSTRACT

The present disclosure relates to systems and methods for electrically conductive membrane separation from a mixture solution via membrane nanofiltration, electro-filtration, or electro-extraction by: generating an electric field at the membrane filter, holding the membrane filter at a constant electric potential, or driving a constant current through the membrane filter; feeding a mixture solution through the membrane nanofiltration system; and separating a component from the mixture solution into a permeate solution.

19 Claims, 37 Drawing Sheets

Related U.S. Application Data

(60) Provisional application No. 63/213,085, filed on Jun. 21, 2021.

(51) Int. Cl.
- *B01D 67/00* (2006.01)
- *B01D 69/02* (2006.01)
- *B01D 71/02* (2006.01)
- *C23C 16/24* (2006.01)
- *C23C 16/50* (2006.01)
- *C23C 16/56* (2006.01)
- *G03F 7/30* (2006.01)
- *H01M 10/54* (2006.01)

(52) U.S. Cl.
CPC ......... *B01D 67/0072* (2013.01); *B01D 69/02* (2013.01); *B01D 71/0213* (2022.08); *C23C 16/24* (2013.01); *C23C 16/50* (2013.01); *C23C 16/56* (2013.01); *G03F 7/30* (2013.01); *H01M 10/54* (2013.01); *B01D 2313/365* (2013.01); *B01D 2323/28* (2013.01); *B01D 2325/02833* (2022.08); *B01D 2325/26* (2013.01)

(56) References Cited

U.S. PATENT DOCUMENTS

| | | |
|---|---|---|
| 2003/0106798 A1 | 6/2003 | Seabrook |
| 2004/0124147 A1 | 7/2004 | Fissell |
| 2005/0072675 A1 | 4/2005 | Dudziak |
| 2008/0067071 A1 | 3/2008 | Haas |
| 2009/0001009 A1 | 1/2009 | Linder et al. |
| 2012/0234694 A1 | 9/2012 | Vectis |
| 2014/0076728 A1* | 3/2014 | Prakash ............ B01D 65/08 204/627 |
| 2017/0271459 A1 | 9/2017 | Grossman et al. |
| 2019/0030492 A1 | 1/2019 | Chu et al. |
| 2019/0345044 A1 | 11/2019 | Brisea |

OTHER PUBLICATIONS

C. Lupi et al., "Nickel and cobalt recycling from lithium-ion batteries by electrochemical processes," Waste Management, vol. 25, Issue 2, 2005, pp. 215-220 (Year: 2005).

International Search Report/Written Opinion issued Oct. 27, 2022 in related International Application PCT/US22/34343, 15 pgs.

Kabaa, E.A., Abdulateef, S.A., Ahmed, N.M et al. A novel porous silicon multi-ions selective electrode based extended gate field effect transistor for sodium, potassium, calcium, and magnesium sensor. Appl. Phys. A 125, 753 (2019). https://doi.org/10.1007/s00339-019-3056-0 (Year: 2019).

* cited by examiner

SYSTEM AND METHOD FOR ELECTRICALLY CONDUCTIVE MEMBRANE SEPARATION

CROSS-REFERENCE TO RELATED APPLICATIONS

The present application is a continuation of U.S. application Ser. No. 18/212,590, filed Jun. 21, 2023, which is a continuation-in-part of U.S. application Ser. No. 17/845,667, filed Jun. 21, 2022, which claims the benefit of U.S. Provisional Application No. 63/213,085, filed Jun. 21, 2021, the contents of which are herein incorporated by reference in their entirety.

GOVERNMENT SUPPORT

This invention was made with government support under DE-AR0001498 awarded by the Advanced Research Projects Agency-Energy. The government has certain rights in the invention.

TECHNICAL FIELD

This invention relates generally to the field of electrically conductive membrane separation, and more specifically to a new and useful system and method for electrically conductive membrane-based ionic separation.

BACKGROUND

As battery technology has become an integral part of today's society, the need for recycling of batteries, battery components, and critical battery materials is rapidly increasing. Of particular importance, are lithium (Li), cobalt (Co), manganese (Mn), and nickel (Ni). Current methods typically include grinding the important battery components (e.g., the anode and the cathode) down into a "black mass", leaching the black mass by exposing it to strong acids (e.g., $H_2SO_4$ and HCl), adding neutralizing agents (e.g., sodium compounds, such as sodium carbonate and sodium hydroxide), and precipitating out the valuable materials. Solvent extraction and thermal crystallization are also common process stages to enable further separation and purification of critical materials.

Although these methods are useful, they are suboptimal with respect to capital cost, operating cost, and environmental impact. Additionally, using chemical precipitation techniques ends up invariably contaminating the black mass such that extraction of lithium becomes difficult due to residual sodium and other chemicals. Thus, there is a need in the field of hydrometallurgical battery recycling to create a new and useful system and method for low-cost and environmentally sustainable critical materials extraction that minimizes chemical precipitation, thermal crystallization, and solvent exchange. This invention provides such a new and useful system and method.

SUMMARY

An aspect of the present disclosure is a system for electrically conductive membrane separation comprising: a membrane filter comprising a nanoporous structure; an electrical contact in contact with the membrane filter; and a counter electrode above a top surface of the membrane electrode. The membrane filter, via the electrical contact, and the counter electrode are configured to generate an electric field between the membrane filter and the counter electrode, to hold the membrane filter at a constant electric potential, or to flow constant current into the membrane filter. The membrane filter is configured to separate a component from a mixture solution. In some examples, the component may be separated into a permeate solution.

In some aspects, the system may be used in a hydrometallurgical separation process. In an aspect, mixture solution comprises a black mass leachate. In other aspects, the mixture solution is from mining waste, a mining-affected water source, or other refining applications. For example, the component of the mixture solution may be selected from the group consisting of Co, Ni, Al, Mn, Fe, Li, Cu, Ag, Zn, Pt, Au, Pd, U, La, Ce, Pr, Nd, Pm, Sm, Eu, Gd, Tb, Dy, Ho, Er, Tm, Yb, Lu, Sc, Y, ions thereof, or mixtures thereof. The mixture solution comprises an acid and may have a pH less than 4.0. In some examples, the acid is $H_2SO_4$. The system may be configured to recycle up to 50% of the acid. In some aspects, Li is the component separated in the permeate solution. In an aspect, the components not in the permeate solution exit the system in a retentate solution. The system may be configured to recycle the retentate solution. In other aspects, the retentate solution may pass through another membrane filter for separation of one or more additional components of the mixture solution. In an aspect of the disclosure, the membrane filter comprises silicon. The membrane filter may have pore sizes ranging from 1 nm to 500 nm, 1 nm to 1,000 nm, 500 nm to 1,000 nm, 1 μm to 20 μm, 1 μm to 10 μm, 20 μm to 100 μm, 20 μm to 50 μm, 50 μm to 100 μm, 100 μm to 500 μm, 100 μm to 300 μm, 300 μm to 500 μm, 500 μm to 1 mm, 500 μm to 700 μm, 700 μm to 1 mm, 700 μm to 1.2 mm, 1 mm to 2 mm, 2 mm to 3 mm, 3 mm to 5 mm, 5 mm to 7 mm, 5 mm to 10 mm, 7 mm to 10 mm, or 1 mm to 10 mm. Likewise, the membrane filter may have an average pore size ranging from 1 nm to 500 nm, 1 nm to 1,000 nm, 500 nm to 1,000 nm, 1 μm to 20 μm, 1 μm to 10 μm, 20 μm to 100 μm, 20 μm to 50 μm, 50 μm to 100 μm, 100 μm to 500 μm, 100 μm to 300 μm, 300 μm to 500 μm, 500 μm to 1 mm, 500 μm to 700 μm, 700 μm to 1 mm, 700 μm to 1.2 mm, 1 mm to 2 mm, 2 mm to 3 mm, 3 mm to 5 mm, 5 mm to 7 mm, 5 mm to 10 mm, 7 mm to 10 mm, or 1 mm to 10 mm. In another aspect, the membrane filter may have greater than or equal to 50% of the total number pores that are ranging in size from 1 nm to 500 nm, 1 nm to 1,000 nm, 500 nm to 1,000 nm, 1 μm to 20 μm, 1 μm to 10 μm, 20 μm to 100 μm, 20 μm to 50 μm, 50 μm to 100 μm, 100 μm to 500 μm, 100 μm to 300 μm, 300 μm to 500 μm, 500 μm to 1 mm, 500 μm to 700 μm, 700 μm to 1 mm, 700 μm to 1.2 mm, 1 mm to 2 mm, 2 mm to 3 mm, 3 mm to 5 mm, 5 mm to 7 mm, 5 mm to 10 mm, 7 mm to 10 mm, or 1 mm to 10 mm. In yet another aspect, the membrane filter may have greater than or equal to 75%, 80%, 85%, 90%, 95%, 97%, 98%, 99%, 99.5%, or 100% of the total number pores that are ranging in size from 1 nm to 500 nm, 1 nm to 1,000 nm, 500 nm to 1,000 nm, 1 μm to 20 μm, 1 μm to 10 μm, 20 μm to 100 μm, 20 μm to 50 μm, 50 μm to 100 μm, 100 μm to 500 μm, 100 μm to 300 μm, 300 μm to 500 μm, 500 μm to 1 mm, 500 μm to 700 μm, 700 μm to 1 mm, 700 μm to 1.2 mm, 1 mm to 2 mm, 2 mm to 3 mm, 3 mm to 5 mm, 5 mm to 7 mm, 5 mm to 10 mm, 7 mm to 10 mm, or 1 mm to 10 mm.

The system may contain a membrane filter in a cross-flow or dead-end configuration. In some examples, a flow-through configuration may be used with electro-extraction, where components aren't rejected at the membrane surface (i.e. everything flows through), but target components are selectively immobilized within the membrane filter pores via electrochemical reduction or oxidation. The system may further include a pressure cell configured to house the membrane filter and counter electrode. The pressure cell may further include an opening configured to receive the electrical contact. The pressure cell may be operable to operate at pressures up to 3000 psi. In various aspects, the system may include modules for size filtration, charge filtration, electro-filtration, electro-extraction, or combinations thereof. In an aspect, the system may be configured for electro-filtration and the electric field is applied between the membrane filter and the counter electrode. In this aspect, the membrane filter may have pore sizes of 1 nm to 10 nm, 1 nm to 100 nm, 10 nm to 50 nm, 50 nm to 100 nm, 1 µm to 20 µm, 1 µm to 10 µm, 20 µm to 100 µm, 20 µm to 50 µm, 50 µm to 100 µm, 100 µm to 500 µm, 100 µm to 300 µm, 300 µm to 500 µm, 500 µm to 1 mm, 500 µm to 700 µm, 700 µm to 1 mm, or 1 mm to 10 mm, and the system may be configured to operate at a pressure greater than 600 psi, greater than 650 psi, greater than 700 psi, greater than 750 psi, greater than 800 psi, greater than 850 psi, or greater than 900 psi. In another aspect, the system may be configured for electro-extraction and the membrane filter is held at a constant electric potential or has a constant current driven through the membrane filter. For example, the pore walls may deliver an electric current to components (e.g. ions) within close proximity in the mixture solution, resulting in the ions being reduced. In this aspect, the membrane filter may have pore sizes of 50 nm to 100 nm, 100 nm to 500 nm, 500 nm to 1,000 nm, 1 µm to 20 µm, 1 µm to 10 µm, 20 µm to 100 µm, 20 µm to 50 µm, 50 µm to 100 µm, 100 µm to 500 µm, 100 µm to 300 µm, 300 µm to 500 µm, 500 µm to 1 mm, 500 µm to 700 µm, 700 µm to 1 mm, or 1 mm to 10 mm, and the system may be configured to operate at a pressure less than 500 psi. In an aspect, the system may be configured for size and charge selective filtration.

In some aspects of the present disclosure, the system is a cross-flow configuration. In various aspects, the system may include modules for size filtration, charge filtration, electro-filtration, electro-extraction, or combinations thereof. The system may be configured for electro-filtration and the electric field is applied between the membrane and counter electrode. In an aspect, the system is configured for size and charge selective filtration.

The electric field is adjustable to select for the desired component. For example, 0.1 V to 5 V may be applied to the electrical contact and counter electrode to generate the electric field, the constant electric potential, or the constant current in the membrane filter.

Further aspects of the present disclosure include a method for electrically conductive membrane separation from a mixture solution comprising: generating an electric field above or within a membrane filter, holding the membrane filter at a constant electric potential, or flowing constant current into the membrane filter; feeding a mixture solution through the membrane nanofiltration system; and separating a component from the mixture solution into a permeate solution. For example, holding the membrane filter at a constant electric potential or flowing constant current into the membrane filter may include driving/running an electrochemically reducing or oxidizing current through the membrane filter.

The method may further include: providing a membrane nanofiltration system comprising: a membrane filter comprising a nanoporous structure; an electrical contact in contact with the membrane filter; and a counter electrode above a top surface of the membrane electrode.

In some aspects, the mixture solution comprises a black mass leachate. In other aspects, the mixture solution is from mining waste, a mining-affected water source, or other refining applications. The component of the mixture solution to be separated may be selected from the group consisting of ions of Co, Ni, Al, Mn, Fe, Li, Cu, Ag, Zn, Pt, Au, Pd, U, La, Ce, Pr, Nd, Pm, Sm, Eu, Gd, Tb, Dy, Ho, Er, Tm, Yb, Lu, Sc, Y, ions thereof, or mixtures thereof. The mixture solution may include an acid and the mixture solution may have a pH less than 4.0. For example, the acid is $H_2SO_4$. In some aspects, the method further includes recycling up to 50% of the acid. In an aspect, Li is the component in the permeate solution.

In various aspects, the method may further include removing a retentate solution comprising the components not in the permeate solution. The electric field may be configured to separate components with lower charges into the permeate solution and components with higher charges into the retentate solution. For example, the permeate solution may include components with an ionic charge of 1+ or lower and the retentate solution may include components with an ionic charge of 2+ or greater. In some aspects, the method may further include recycling the retentate solution back to the leaching process. In additional aspects, the method may further include separating a second component from the recycled mixture solution. In yet further aspects, the method may further include passing the retentate solution through the one or more additional membrane filters to separate one or more additional components of the mixture solution.

In some aspects, the membrane filter comprises silicon and may have pore sizes ranging from 1 nm to 500 nm, 500 nm to 1,000 nm, 1 µm to 20 µm, 1 µm to 10 µm, 20 µm to 100 µm, 20 µm to 50 µm, 50 µm to 100 µm, 100 µm to 500 µm, 100 µm to 300 µm, 300 µm to 500 µm, 500 µm to 1 mm, 500 µm to 700 µm, 700 µm to 1 mm, or 1 mm to 10 mm. The system may be a flow-through, dead-end configuration, and/or a cross-flow configuration. The component may be separated from the mixture solution via electro-filtration and the electric field is above the membrane filter and/or the component (or additional components) may be separated from the mixture solution via electro-extraction and electrochemically oxidizing/reducing current is conducted through the membrane filter such that the membrane filter is held at a constant electric potential or has a constant current driven through the membrane filter. In other or additional aspects, the component may be separated from the mixture solution via size and charge selective filtration and the electric field is 0 V/m.

In some aspects, the method may further include adjusting the electric field to select for the desired component. For example, 0.1 V to 5 V may be applied to the electrical contact connected to the membrane filter and the counter electrode to generate the electric field, electric potential, or current in the membrane filter.

In an aspect, one or more components of the mixture not in the permeate solution may be retained within the pores of the membrane filter by electrochemical oxidation or reduction, chemical or physical affinity, adsorption, or absorption. The method may further include reversing the polarity of the electric potential or direction of the current and passing a pure draw solution through the membrane filter. In some aspects, the pure draw solution comprises water or sulfuric acid. In some aspects, the method further includes leaching the one or more components retained in the membrane filter into a pure product stream comprising the pure draw solution and the one or more components. The pure draw solution may have a volume that is 1% to 50% of the mixture solution volume, generating a concentrated solution of the one or more components.

In some aspects, the method may further comprise precipitating the component from the permeate solution, the retentate solution, the pure product stream, or the pure draw solution.

Another aspect of the present disclosure is a method for electrically conductive membrane separation from a mixture solution comprising: holding a membrane filter at a constant electric potential or driving a constant current through the membrane filter; feeding a mixture solution through the membrane filter; and separating a component from the mixture solution into a permeate solution.

Yet another aspect of the present disclosure is a method for electrically conductive membrane separation from a mixture solution comprising: generating an electric field orthogonal or perpendicular to a membrane filter; feeding a mixture solution through the membrane; and separating a component from the mixture solution into a permeate solution.

An even further aspect of the present disclosure is a method for electrically conductive membrane separation from a mixture solution comprising: applying an electric field orthogonal or perpendicular to a membrane filter; feeding a mixture solution through the membrane; and separating a component from the mixture solution into a permeate solution.

In an aspect, the solution comprises a monovalent ion component and polyvalent ion component, and the monovalent ion component and polyvalent ion component are filtered differently based on their charge. In another aspect, the solution comprises a first polyvalent ion component and second polyvalent ion component, and the first and second polyvalent ion components comprise different charges. In this aspect, the first polyvalent ion component and second polyvalent ion component are filtered differently based on their charge.

In some aspects, the method further includes isolating the monovalent ion component and/or isolating the polyvalent ion component.

Another aspect of the present disclosure is a membrane nanofiltration system for electrically conductive membrane separation comprising: a conductive membrane filter comprising a silicon wafer, wherein the silicon wafer comprises a first region having pores with pore sizes ranging from 1 μm to 1 mm and a second region having pores with pore sizes ranging from 1 nm to 5 μm; an electrical contact in contact with the membrane filter, wherein electrical current can flow from the electrical contact to the conductive membrane filter; and a counter electrode above a top surface of the membrane electrode. The membrane filter, via the electrical contact, and the counter electrode are configured to: generate an electric field between the membrane filter and the counter electrode; hold the membrane filter at a constant electric potential; or flow constant current into the membrane filter, and the membrane filter is configured to separate a component from a mixture solution.

In some aspects, the component of the mixture solution is selected from the group consisting of Co, Ni, Al, Mn, Fe, Li, Cu, Ag, Zn, Pt, Au, Pd, U, La, Ce, Pr, Nd, Pm, Sm, Eu, Gd, Tb, Dy, Ho, Er, Tm, Yb, Lu, Sc, Y, ions thereof, or mixtures thereof.

In various aspects, the pore size of the pores in the first region are different from the pore size of the pores in the second region. In addition, the silicon wafer, including the first region and the second region, may be monolithic silicon.

A further aspect of the present disclosure is a membrane nanofiltration system for electrically conductive membrane separation comprising: a conductive membrane filter comprising a silicon wafer and a dielectric, wherein the silicon wafer comprises pores with pore sizes ranging from 1 μm to 1 mm; an electrical contact in contact with the membrane filter, wherein electrical current can flow from the electrical contact to the conductive membrane filter; and a counter electrode above a top surface of the membrane electrode.

In some aspects, the dielectric is deposited on a surface of the silicon wafer to narrow the pores of the silicon wafer to 1 nm to 5 μm. The dielectric may include, but is not limited to Al oxides, Si oxides, Ti oxides, Hf oxides, Sn oxides, Fe oxides, or combinations thereof. In additional aspects, the inclusion of the dielectric allows the counter electrode to be 0 nm to 1 μm from the conductive membrane filter.

An additional aspect of the present disclosure is a method of making a conductive membrane filter, the method comprising: depositing a layer of silicon on a surface of a silicon wafer; etching pores in the silicon wafer from a first surface of the silicon wafer, wherein the pores in the silicon wafer have a size ranging from 1 μm to 1 mm; and fine etching pores in the silicon layer from a second surface of the silicon wafer, wherein the pores in the silicon wafer have a size ranging from 1 nm to 5 μm.

In some aspects, the deposited silicon layer acts as an etch stop for the etched pores from the first surface. The method may further include flipping the silicon wafer 180° before each of the etching steps.

In an aspect, the pores in the silicon wafer and/or the silicon layer may be etched using MACE. The silicon layer may be deposited using plasma-enhanced chemical vapor deposition.

In some aspects, the method may further include adding a protective layer of etch protectant on top of the silicon layer before etching pores in the silicon wafer. The method may then include removing the protective layer after etching the pores in the silicon wafer and before fine etching pores in the silicon layer.

A further aspect of the present disclosure is a method of making a conductive membrane filter, the method comprising: laser-drilling pores through a silicon wafer; depositing transition or noble metal nanoparticles on a surface of the silicon wafer; and chemically etching the surface of the silicon wafer to create a roughened surface. In some aspects, the transition or noble metal nanoparticles are also deposited on the interior surfaces of the pores.

An even further aspect of the present disclosure is a method of making a conductive membrane filter, the method comprising: etching holes into a surface of a silicon wafer, wherein the holes do not extend the entire thickness of the membrane; and etching pores from the opposite surface of the wafer to meet the previously etched holes, producing a selective membrane layer between the end of the holes and an opposite surface of the wafer. The pores in the selective membrane layer are smaller than the size of the holes in the silicon wafer.

In some aspects, the holes in the silicon wafer are etched using deep reactive ion etching. In an aspect, the method may further include using an $SiO_2$ etching mask in the deep reactive ion etching process to control the geometry and density of the holes in the silicon wafer. The pores in the selective membrane layer may be etched using MACE.

Another aspect of the present disclosure is a method of making a conductive membrane filter, the method comprising: etching pores in a silicon wafer; and vapor-depositing a thin layer on a surface of the silicon wafer. The thin layer narrows the pores at the surface of the silicon wafer and does not completely cover the pores, while providing a dielectric surface that allows a counter electrode to contact the silicon membrane.

BRIEF DESCRIPTION OF THE FIGURES

FIG. 11B is a schematic of one example system implementing size and charge selective filtration in a cross-flow configuration.

DETAILED DESCRIPTION

Figure 1A:
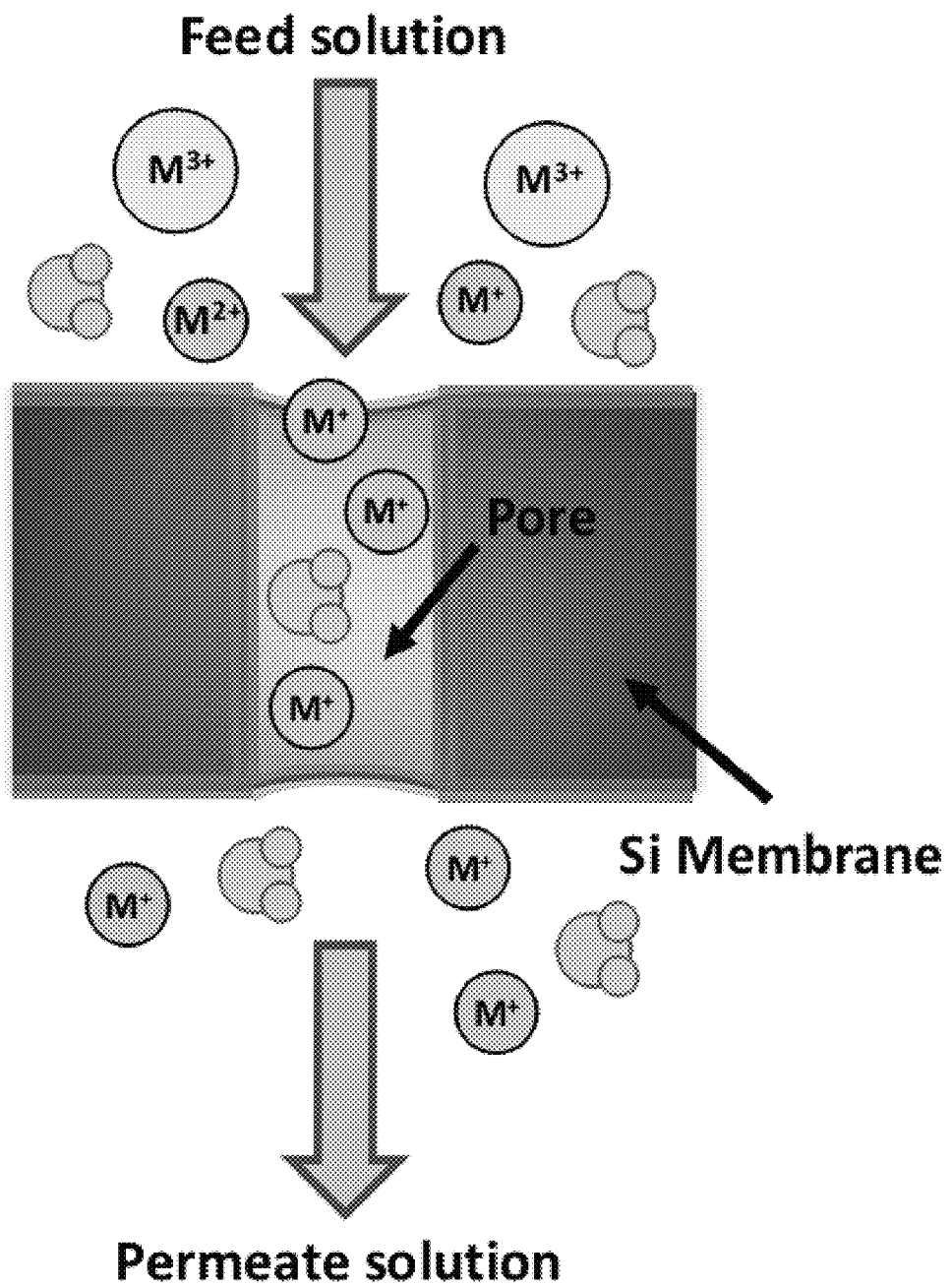
FIG. 1A is a schematic of one example system implementing size and charge selective filtration in a dead-end configuration.

The following description of the embodiments of the invention is not intended to limit the invention to these embodiments but rather to enable a person skilled in the art to make and use this invention.

Overview

The systems and methods described herein may be useful for the extraction of a broad range of target materials across many applications, including but not limited to lithium-ion battery recycling, mining, a mining-affected water source, and various other recycling and refining applications. For example, the systems and methods disclosed herein may be used to extract, recycle, and/or refine one or more of critical matter materials (e.g. lithium (Li), cobalt (Co), nickel (Ni), copper (Cu), iron (Fe), manganese (Mn) (as manganese oxide), and aluminum (Al) (as aluminum oxide)), precious metals (e.g. platinum (Pt), gold (Au), silver (Ag), and palladium (Pd)), and/or rare earth elements or other rare elements (e.g. uranium (U), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc), yttrium (Y)), and ions, oxides, and hydroxides thereof. In various aspects, the materials may be extracted as the pure material or as oxide or hydroxide compounds of the material.

A system and method for a nanofiltration method includes: a membrane filter, comprising a nanoporous structure; and one or more electrodes configured to apply an electric potential to the membrane filter, or drive an electric current into the membrane filter. For example, the system may include an electrical contact in contact with the membrane filter and a counter electrode, and the system may be configured to generate an electric field between the membrane filter and the counter electrode, to hold the membrane filter at a constant electric potential, or to flow constant current into the membrane filter. In an example, the system may be operable to separate a component from a mixture solution when the mixture solution has a pH of 5.0 or less. For example, the system may be operable at a pH of 2 to 5, less than 5, less than 4, less than 3, less than 2, less than 1, or less than 0. In some examples, the membrane filter may further include a coating, comprising a functional coating within and around the porous structure of the membrane filter.

In an embodiment, the system and method further includes feeding a mixture solution through the membrane filter, thereby separating a desired component (i.e. compound/compounds/ion) from the mixture solution. The component separated from the mixture solution may be selected from Co, Ni, Al, Mn, Fe, Li, Cu, Ag, Zn, Pt, Au, Pd, U, La, Ce, Pr, Nd, Pm, Sm, Eu, Gd, Tb, Dy, Ho, Er, Tm, Yb, Lu, Sc, Y, ions thereof, or mixtures thereof. Non-limiting examples of ions include $Co^{2+}$, $Co^{3+}$, $Ni^{2+}$, $Al^{3+}$, $Mn^{2+}$, $Fe^{2+}$, $Fe^{3+}$, $Li^+$, $Cu^{2+}$, $Ag^+$, $Zn^{2+}$, and combinations and variations thereof. The system and method function to build and employ a membrane filtration system uniquely able to separate nanoscale compounds at a low pH, using size, charge, and/or compound/membrane interactions.

The system and method may enable multiple variants of separation, wherein in a first method of separation, the mixture is separated by driving it through the membrane system under high pressure (e.g., via a hydraulic pressurization of the feed mixture solution) with small pore sizes in the membrane filter (e.g. less than 100 nm). The system and method may also enable different forms of separation, wherein components are separated by diffusion through, or across, the membrane, driven by a concentration gradient (or other type of gradient). In an embodiment, the system and method may perform separation using electro-filtration, using high pressure and small pore size in an electrified membrane to separate a desired compound/compounds/ion from the mixture solution. In another embodiment, the system and method may perform separation using electroplating, using low pressure and large pore size in an electrified membrane to separate a desired compound/compounds/ion from the mixture solution.

The system and method may be generally applicable to any field of nanoscale (or larger) separation and/or extraction.

The system and method may be applicable for the extraction of small charged ions, elements, and compounds from a mixture, wherein the system and method may be particularly useful for molecular (i.e., nanometer scale) extraction at lower pH (i.e., less than pH 5.0). The system and method may further enable nanoscale extraction at pH less than 2.0 or less than 1.0. The system and method may also be applicable for atomic scale (i.e., order of angstroms) extraction (e.g., element or ion extraction), wherein the system and method may be particularly useful for atomic extractions at low pH (i.e., less than pH 5.0) or very low pH (i.e., less than pH 2.0 or 1.0). In various examples, the system may be operable at a pH ranging from −1 to 0, 0 to 5, 0 to 4, 0 to 3, 0 to 1, 0.5 to 5, 0.5 to 4, 0.5 to 3, 0.5 to 2, 0.5 to 1, 0.1 to 5, 0.1 to 4, 0.5 to 3, 0.1 to 2, 0.1 to 1, 1 to 5, 1 to 4, 1 to 3, 1 to 2, 2 to 4, or 2 to 5. In some examples, the system may be operable at a pH of 2 to 5, less than 5, less than 4, less than 3, less than 2, or less than 1. This compound extraction can be particularly useful in the field of hydrometallurgy wherein small compounds and elements may be filtered and/or extracted without the requirement for chemical precipitation, chemical pH neutralization techniques, liquid-liquid extraction (solvent exchange), thermal distillation, or thermal crystallization.

The system and method may be particularly applicable for material extraction from a battery leachate solution (e.g., as applied to battery recycling). That is, the system and method may be applicable for extraction of typical battery compounds (e.g., lithium carbonate, lithium hydroxide, cobalt sulfate, nickel sulfate, manganese oxide) from a battery or battery leachate solution (e.g., black mass leachate). In some examples, major black mass components may include but are not limited to Al, Co, Cu, Fe, Li, Ni, Ag, Zn, Mn, graphite, F, P, and ions thereof.

The system and method may provide a number of potential benefits. The system and method are not limited to always providing such benefits, and are presented only as exemplary representations for how the system and method may be put to use. The list of benefits is not intended to be exhaustive and other benefits may additionally or alternatively exist.

Some benefits of the system and method include a reduced system complexity and/or a reduced number of process stages/footprint due to being able to recover multiple components of a mixture solution without further difficult processing steps and/or the ability to recycle one or more components of the system. This may lead to reduced capital and operating cost and reduced usage of chemicals and heat.

One potential benefit of the system and method is that the system and method enable membrane separation in acidic conditions.

Additionally, the system and method may provide the potential benefit of being used for multiple forms of membrane separation. For example, in some implementations, the system and method may enable utilization of membrane separation to separate by molecular/atomic/ionic size, charge, and/or membrane interaction.

As part of battery recycling implementation, the system and method may enable separation and extraction of valuable metals with exceptionally high selectivity and/or yield. This potentially provides a significant benefit over current chemical precipitation/solvent extraction/thermal crystallization techniques that end up contaminating battery mixtures and requiring high capital and operational cost, thereby limiting extraction.

As part of a battery recycling implementation, the system and method may further provide the potential benefit of a means for lithium extraction. Using current means of battery recycling, the battery mixtures typically become too contaminated for most extraction techniques to be applied at a reasonable cost of resources and time. Specifically, for battery chemistries such as lithium-iron-phosphate, wherein lithium is the only high-value material, recycling is particularly challenging from an economics standpoint. The system and method may be especially beneficial in such cases.

System

A system for a low pH capable nanofiltration, includes a membrane filter comprising a porous structure with pore sizes ranging from the order of 1 nanometer to the order of 10 mm. In an embodiment, the system includes at least one electrode operable to drive an electric current into the membrane filter, or hold the filter at a constant electric potential. For example, the system may be configured to generate an electric field between the membrane filter and the counter electrode, to hold the membrane filter at a constant electric potential, or to flow constant current into the membrane filter. In other embodiments, the membrane filter may include a coating, comprising a functional coating within and around the porous structure of the membrane filter. The system functions as a membrane particularly suited for filtration of nanometer or atomic scale compounds at low pH (i.e., below pH 5.0), or very low pH (i.e., below pH 2.0). In various examples, the system is operable at a pH ranging from −1 to 0, 0 to 5, 0 to 4, 0 to 3, 0 to 1, 0.5 to 5, 0.5 to 4, 0.5 to 3, 0.5 to 2, 0.5 to 1, 0.1 to 5, 0.1 to 4, 0.5 to 3, 0.1 to 2, 0.1 to 1, 1 to 5, 1 to 4, 1 to 3, 1 to 2, 2 to 5, less than 5, less than 4, less than 3, less than 2, or less than 1. In other examples, the system may operate at a neutral pH ranging from 6 to 8 or operate at a basic pH ranging from 8 to 14. In at least one example, the system may be used with mixture solutions comprising sulfuric acid. In some embodiments, the system may be operable to recycle at least a portion of the sulfuric acid. As shown in FIGS. 1A-3B, the system and/or membrane filter may have multiple variations and may be implemented to separate by size, charge, and/or through membrane/compound interaction(s) (e.g., membrane sorption, electrochemical reduction and/or oxidation, or substrate binding). FIGS. 4A-6C show example membrane nanofiltration systems.

The system may be particularly useful for filtration of battery metals and chemicals from a battery leachate solution (e.g., as part of a method for battery recycling). For example, the system may be implemented for lithium (Li) extraction from battery solution (e.g., black mass leachate solution). As desired, the system may be implemented for filtration of other battery metals or chemicals, such as: cobalt (Co), manganese (Mn), and nickel (Ni). Additionally or alternatively, the system may be implemented for filtration of other chemicals or minerals in use today, or used in future batteries.

The system may include a membrane filter. The membrane filter functions as the primary filtration body, wherein the membrane filter comprises a porous body. That is, the membrane filter comprises a porous structure, such that fluids may flow through the membrane filter wherein, dependent on implementation, certain compounds (or elements/ions) within the fluid selectively pass through the membrane filter at differing rates.

As a porous body, the membrane filter may be implemented with any desired porosity. For general filtration purposes the membrane filter may be implemented such that it has a desired porosity between 1% to 5%, 5% to 10%, 10% to 20%, 20% to 30%, 30% to 40%, or 40% to 50%. Alternatively, the membrane filter may have a porosity less than or greater than the suggested range. For example, in an industrial high flow, high throughput implementation, the membrane filter may comprise a thick column (e.g., 20 µm to 1 cm thickness) with a high porosity (e.g., 70% porosity).

Pores within and through the membrane filter may vary dependent on implementation. Unless stated otherwise, as used herein, for simplicity of explanation, pores within the membrane filter are described as relatively cylindrical and pore size refers to the approximate diameter of the pore. In actuality, pores within the membrane filter may have any shape, and the pore size refers to the size of some generic non-charged globular molecule or spherical non-charged particle that may travel through the pore at a reasonable rate. In some variations, particularly for larger molecule filtration (e.g., polymers), the pore shape may be controlled to match the shape of a complex shaped molecule. In these variations, discussion of pore sizes may be ignored and the relative permeability of molecules will be discussed instead.

The membrane filter may generally have pores of approximately nanometer length, micrometer length, millimeter length, or larger. In some examples, the pores may extend through the membrane filter such that there is a path for at least one component of a mixture solution to pass through the pores in the membrane filter from a top side to a bottom side. In various embodiments, the membrane filter pore size may be approximately between 1 nm to 10 nm, 1 nm to 100 nm, 10 nm to 50 nm, 10 nm to 100 nm, 50 nm to 100 nm, or 100 nm to 500 nm, 500 nm to 1,000 nm, 1 µm to 20 µm, 1 µm to 10 µm, 20 µm to 100 µm, 20 µm to 50 µm, 50 µm to 100 µm, 100 µm to 500 µm, 100 µm to 300 µm, 300 µm to 500 µm, 500 µm to 1 mm, 500 µm to 700 µm, or 700 µm to 1 mm. In some examples, the pore size of the membrane filter may be 1 nm to 10 nm, 10 nm to 20 nm, 20 nm to 30 nm, 30 nm to 40 nm, 40 nm to 50 nm, 50 nm to 60 nm, 60 nm to 70 nm, 70 nm to 80 nm, 80 nm to 90 nm, 90 nm to 100 nm. In some embodiments, the pore size may be considered to be small if it is less than 100 nm, less than 50 nm, or less than 10 nm. In other examples, the pore size may be approximately between 100 nm to 150 nm, 150 nm to 200 nm, 200 nm to 250 nm, 250 nm to 300 nm, 300 nm to 350 nm, 350 nm to 400 nm, 400 nm to 450 nm, 450 nm to 500 nm, 500 nm to 550 nm, 550 nm to 600 nm, 600 nm to 650 nm, 650 nm to 700 nm, 700 nm to 750 nm, 750 nm to 800 nm, 800 nm to 850 nm, 850 nm to 900 nm, 900 nm to 950 nm, or 950 nm to 1,000 nm. In some embodiments, the pore size may be considered to be large if it is greater than 100 nm. In additional examples, the pore size may be approximately between 1 µm to 20 µm, 20 µm to 40 µm, 40 µm to 60 µm, 60 µm to 80 µm, 80 µm to 100 µm, 100 µm to 150 µm, 150 µm to 200 µm, 200 µm to 250 µm, 250 µm to 300 µm, 300 µm to 350 µm, 350 µm to 400 µm, 400 µm to 450 µm, 450 µm to 500 µm, 500 µm to 600 µm, 600 µm to 700 µm, 700 µm to 800 µm, 800 µm to 900 µm, 900 µm to 1 mm, 1 mm to 2 mm, 2 mm to 3 mm, 3 mm to 4 mm, or 4 mm to 5 mm, 5 mm to 10 mm, or any range therebetween. In other embodiments, the pore size may be considered to be large if it is 1 µm or larger. In certain situations, larger pore sizes may present advantages as compared to much smaller pore sizes, including but not limited to reduced resistance to liquid flow through the membrane and increased volume for extracted metal to form within the pore. Alternatively, the membrane filter pore sizes may be larger or smaller (e.g., 1 Å, 1 µm, 10 µm, etc.). Dependent on implementation, the variance and distribution of the membrane filter pore size may be controlled.

As is common in many filtration implementations, the pore sizes may be relatively similar. That is the pore size may have a low variance. For example, the pore size variance may be approximately 1% of the pore size. Generally, the pore size variance may be in any range. For example, in one implementation the pore size variance is approximately 1% to 5% of the pore size; in another implementation the pore size variance is approximately 5% to 10% of the pore size; in another implementation the pore size variance is approximately 10% to 20% of the pore size;

in another implementation the pore size variance is approximately 20% to 30% of the pore size; in another implementation the pore size variance is approximately 30% to 40% of the pore size; in another implementation the pore size variance is approximately 40% to 50% of the pore size; in another implementation the pore size variance is approximately 50% to 60% of the pore size; in another implementation the pore size variance is approximately 60% to 70% of the pore size; in another implementation the pore size variance is approximately 70% to 80% of the pore size; in another implementation the pore size variance is approximately 80% to 90% of the pore size; in another implementation the pore size variance is approximately 90% to 100% of the pore size, etc.

The membrane filter thickness may vary, wherein the thickness may be chosen to meet a particular filtration implementation. For typical implementations, the membrane filter may commonly have a thickness in the range of 10 µm to 50 µm, 50 µm to 100 µm, 100 µm to 150 µm, 150 µm to 200 µm, 200 µm to 250 µm, 250 µm to 300 µm, 300 µm to 350 µm, 350 µm to 400 µm, 400 µm to 450 µm, 450 µm to 500 µm, 500 µm to 1000 µm, or 1000 µm to 10,000 µm. In an embodiment, the membrane filter has a thickness of 1 µm or greater, 5 µm or greater, 10 µm or greater, 25 µm or greater, 50 µm or greater, 75 µm or greater, 100 µm or greater, 150 µm or greater, 200 µm or greater, 250 µm or greater, 300 µm or greater, or 350 µm or greater. In at least one example, the membrane filter may have a thickness of 280 µm. Alternatively, the membrane filter thickness may be less. For example, in one implementation, the membrane filter thickness is approximately 1 µm thick. Generally, the membrane filter thickness is only limited by mechanical constraints (e.g., the membrane should be sufficiently thick such that it doesn't break or buckle while filtering) and the membrane pore size (i.e., the membrane thickness must be sufficiently large to incorporate a desired pore size, or pore size range) and porosity. In the case where the membrane is thin, it may be supported by a mechanically stable thick layer with larger pore size. In this embodiment, the thin membrane and the thick supporting layer may be monolithic (part of a continuous piece of material). In the case where the membrane is thick (thicker than 1 µm), the membrane filter may be a single body monolithic membrane without a supporting layer. The membrane filter may be any shape or size sufficient to be used in the systems and method described herein. In some embodiments, the membrane filter may be a wafer, a flat disc, or a sheet (e.g. circle, oval, square, rectangular, etc. shape) with a length or diameter of 1 in to 1.5 in, 1.5 in to 2 in, 2 in to 2.5 in, 2.5 in to 3 in, 3 in to 3.5 in, or 3.5 in to 4 in. In at least one example, the membrane filter may have a diameter of 2 inches. In at least one example, the membrane filter may have a diameter of 0.4 meters.

The membrane filter may be composed of an inorganic element or compound (or compounds). In some embodiments, the membrane filter is composed of a conductive material. In one variation, the inorganic compound membrane filter comprises a body composed primarily of silicon. In one example, the silicon body comprises a monolithic piece of silicon, or alternatively nanoporous silicon. The fabrication process for the porous silicon may be reductive, i.e. starting with a single piece, and removing material to produce the porous membrane filter, without adding anything. For example, membrane filter may be a silicon wafer that has been modified to have pores ranging from 1 nm to 500 nm, 1 nm to 1,000 nm, 1 µm to 20 µm, 20 µm to 100 µm, 100 µm to 500 µm, 500 µm to 1 mm, or 1 mm to 10 mm. In an embodiment, the membrane may only include monolithic silicon. Therefore, the membrane filter may be a single, continuous piece of silicon. The monolithic silicon membrane may be modified to be porous. In some examples, the membrane only includes a porous monolithic silicon body with no further layers or coatings (i.e., wherein the monolithic silicon body is devoid of coatings). In an example, the membrane filter is unlayered. In another example, the monolithic structure is substantially free from elements other than silicon. In yet another example, the monolithic structure is pure silicon. In a further example, the monolithic structure is not encumbered or blocked with non-silicon components. In an example, the silicon is substantially free to interact with ions. Alternatively, the silicon body may include multiple pieces (e.g., layers of silicon, layers of silicon with other materials, coatings, etc.). In various examples, the membrane filter may comprise at least 98%, at least 99%, at least 99.5%, at least 99.9%, or 100% silicon.

In an alternative variation, the membrane filter is composed of an organic compound (or compounds). In one variation, the organic compound membrane filter comprises a body composed of a polymer. Examples of the polymer material may include: polyamide, polysulfone, polycarbonate, PTFE, and/or polyimide. In some variations, the membrane filter may comprise multiple layers of the same polymer, or a composite of multiple layers of different polymers. In this variation, the polymeric membrane could be made electrically conductive via functionalization of the membrane with electrically conductive materials.

As per the intended system implementation, the membrane filter may be enabled for one or more types of filtration. Dependent on implementation, the membrane filter may be structured such that it may filter based on size, charge, electrochemical reduction and oxidation potentials, and/or through membrane/compound interaction(s). In some examples, the system may be configured for size and charge selective filtration, electro-filtration, or electro-extraction. Additionally or alternatively, the membrane filter may be enabled for filtration based on hydrophobicity, chirality, solubility, redox potential, coordination number and/or some other molecule/compound property.

In some variations, the membrane filter may comprise a structure to enable size filtration. In these variations, the membrane filter may comprise pore size "tuned" to allow one or more type(s) of compounds/molecules/atoms/ions to permeate, while retaining all other species. That is, the membrane filter is constructed with a desired porosity and desired pore size to enable filtration and/or separation of compounds/molecules/atoms/ions dependent on the effective size of those entities. For example, for a black mass leachate solution, Li may pass through the membrane filter, wherein Co, Ni, and Mn are retained. This size exclusion may not be based only atomic mass/size, but may also be based on additional coordination effects (e.g., hydration and ionic charge), which can result in different effective sizes for the filtered compounds.

In some variations, the membrane filter may comprise a structure that enables filtration by electrical charge. In these variations, the membrane filter may be composed of material that can carry charge or is conductive (e.g., silicon). That is, the membrane filter is constructed with a desired conductivity, or range of conductivities to enable filtration and/or separation of compounds/molecules/ions dependent on an effective charge. In some examples, the membrane filter may have a resistivity ranging from 100 ohm·cm to 0.001 ohm·cm, 100 ohm·cm to 50 ohm·cm, 50 ohm·cm to 10 ohm·cm, 10 ohm·cm to 1 ohm·cm, 1 ohm·cm to 0.1 ohm·cm, 0.1 ohm·cm to 0.01 ohm·cm, or 0.01 ohm·cm to 0.001 ohm·cm. For charge separation, the system may further include a current source, or sources, and may include a current sink, or sinks; wherein a desired current or currents is driven through or formed above the membrane filter, or a constant electric potential is applied to the membrane filter.

Figure 1B:
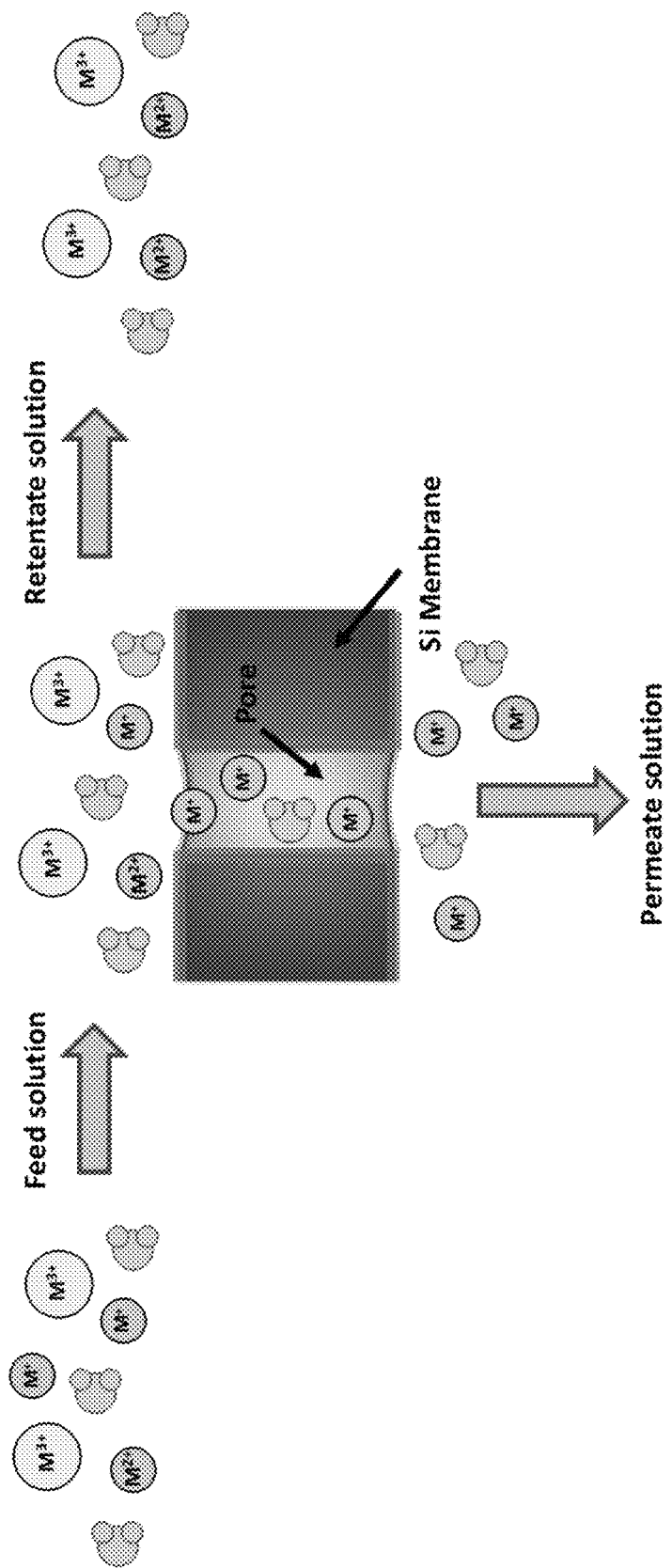
Figure 2A:
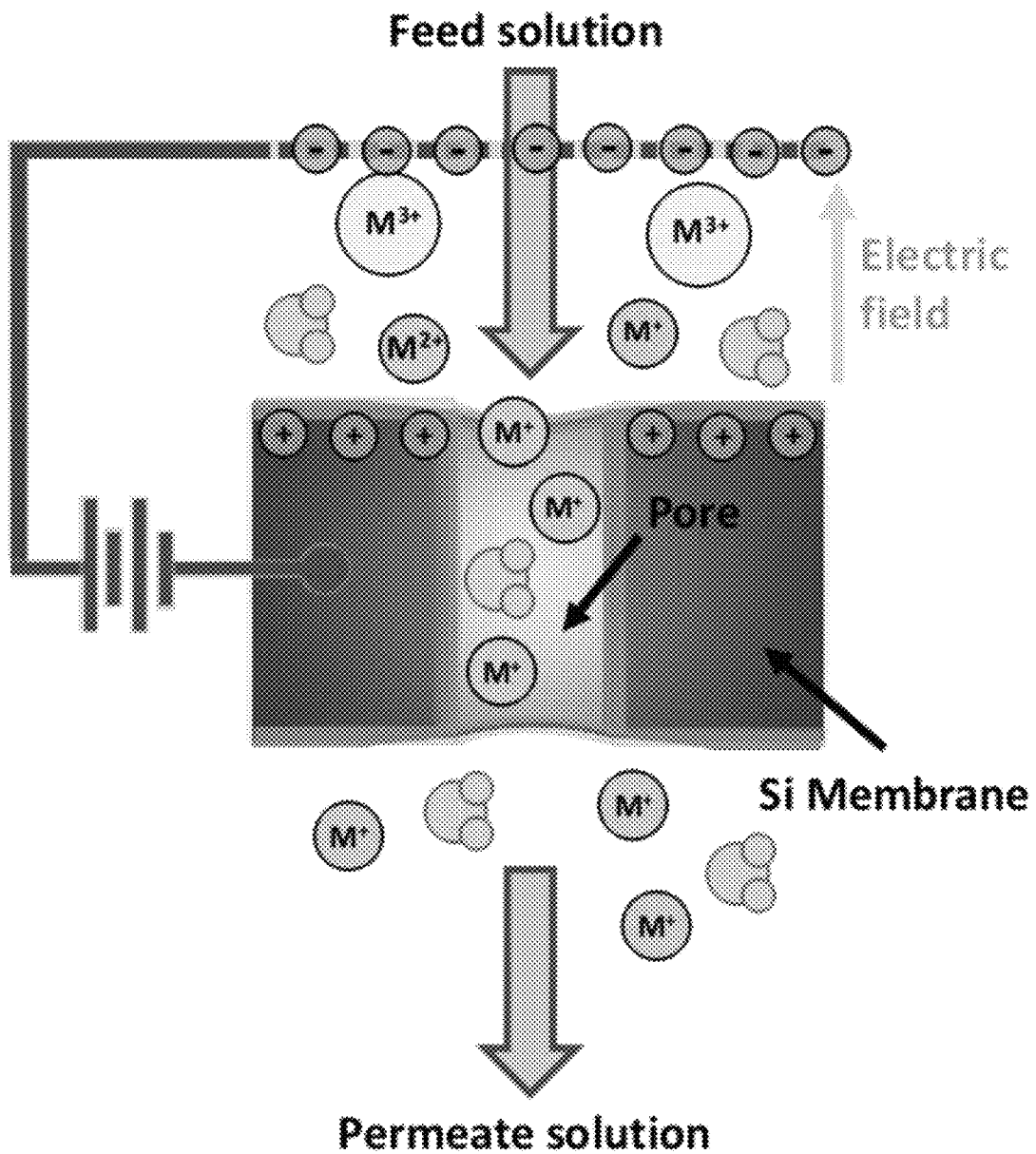
FIG. 2A is a schematic of one example system implementing electro-filtration in a dead-end configuration.
Figure 2B:
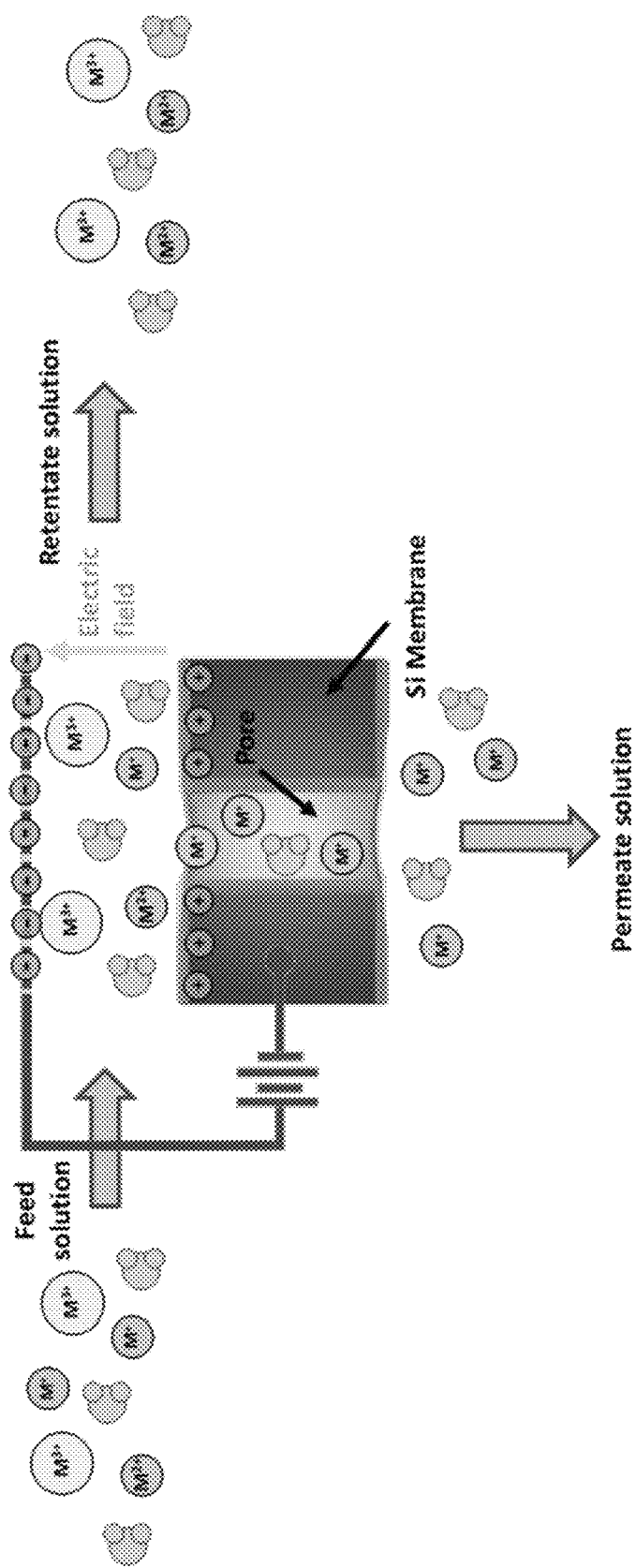
FIG. 2B is a schematic of one example system implementing electro-filtration in a cross-flow configuration.
Figure 3A:
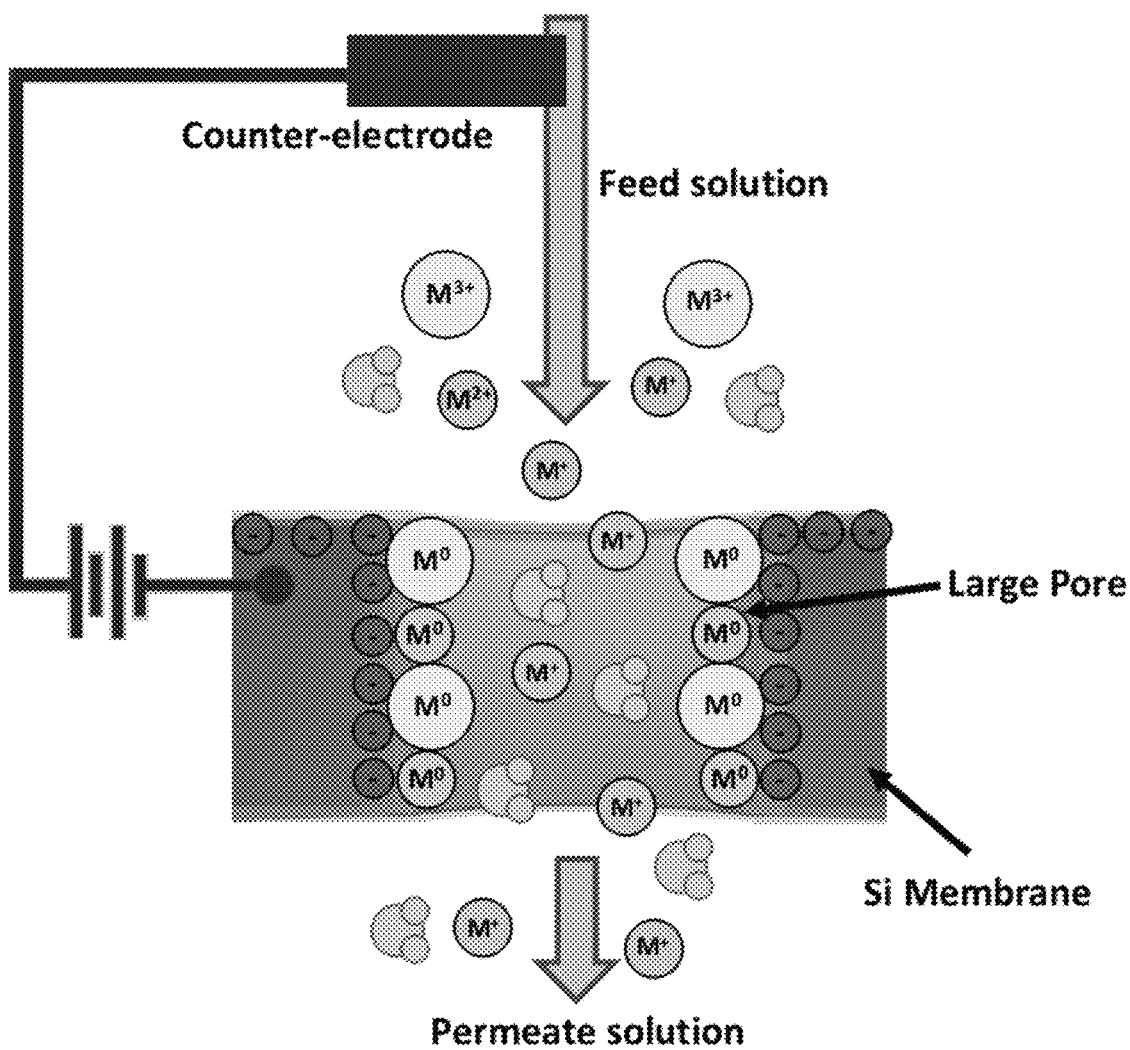
FIG. 3A is a schematic of one example system implementing a first step in electro-extraction in a flow-through configuration.

The membrane filter may be implemented with different directional flows. In addition to flows directly through the membrane, the membrane filter may be used with flows parallel to the membrane surface and/or in a direction askew to the membrane. The system may be configured in a flow-through configuration, dead-end configuration, or a cross-flow configuration. In a flow-through or dead-end configuration, the mixture solution may be fed downward through the top side of the membrane filter (e.g. perpendicular to the membrane filter) and the permeate solution is collected below the membrane filter. FIGS. 1A, 2A, and 3A show example dead-end/flow-through configurations. In a cross-flow configuration, the mixture solution may be fed across the top side of the membrane filter (e.g parallel to the membrane filter) such that the permeate solution is collected below the membrane filter and the retentate solution remains above the membrane filter. FIGS. 1B and 2B show example cross-flow configurations. In some embodiments, the separation may be operated in a continuous mode and/or allow for recycling of one or more components of the mixture solution.

The system may use size filtration, electro-filtration, electro-extraction, or combinations thereof to separate at least one component from the mixture solution. In some embodiments, such as in electro-filtration as seen in FIGS. 2A and 2B, an electrical contact may be placed such that it makes electrical contact with the membrane filter and a counter electrode may be placed above the surface of the membrane filter. The counter electrode may include silicon in some examples. In an example, the electrified membrane filter may be a cathode and the counter electrode may be an anode. When a voltage is applied between the electrified membrane filter and the counter electrode, an electric field is generated above the top surface of the membrane filter such that the electric field prevents higher charged components (compounds/molecules/atoms/ions) from passing through the pores while components (compounds/molecules/atoms/ions) with lower charge may pass through the pores. In other words, the electric field is configured to separate components with lower charges into the permeate solution and components with higher charges into the retentate solution. In other examples, the electric field may act to "pull" ions through the membrane, where higher charges would be more likely to be pulled through into the permeate solution. In some embodiments, the permeate solution comprises components with an ionic charge of 1+ or lower and the retentate solution comprises components with an ionic charge of 2+ or greater. For example, for a black mass leachate solution, the electric field may allow Li to pass through the membrane filter, while Co, Ni, Mn, etc. are retained above the membrane filter. In some embodiments, the separation of one component and the retention of other components in the mixture solution may also be based on additional coordination effects (e.g., size, polarity, hydration), which can result in different effective permeabilities for the filtered compounds.

Referring to FIG. 2A, in some embodiments, the system may be configured for electro-filtration in a dead-end configuration. FIG. 2A shows a feed solution (i.e. mixture solution) entering the membrane filter from the top side and passing through the electric field between the top surface of the electrified membrane filter and the counter electrode. $M^x$ represents an ion dissolved in an aqueous solution, with ionic charge x. The components with lower charges (represented generically as $M^+$) pass through the pores of the membrane filter as the permeate solution while components with higher charges (represented generically as $M^{2+}$ and $M^{3+}$) are retained in the electric field above the membrane filter. In some examples, uncharged components may pass through the pores into the permeate solution or may be retained above the membrane filter due to size selection of the pore size. In some embodiments, the strength of the electric field may be adjusted to select for different charged components.

Referring back to FIG. 2B, in some embodiments, the system may be configured for electro-filtration in a cross-flow configuration. FIG. 2B shows a feed solution (i.e. mixture solution) flowing across the top of the membrane filter and passing through the electric field between the top surface of the electrified membrane filter and the counter electrode. The components with lower charges (represented generically as $M^+$) pass through the pores of the membrane filter as the permeate solution while components with higher charges (represented generically as $M^{2+}$ and $M^{3+}$) are retained in the electric field above the membrane filter and exit as a retentate solution. In some examples, uncharged components may pass through the pores into the permeate solution or may be retained above the membrane filter due to size selection of the pore size. In some embodiments, the strength of the electric field may be adjusted to select for different charged components.

In some embodiments, the membrane filter may have small pores when used for electro-filtration with the electric field at the surface of the membrane filter. For example, the membrane filter may have pore sizes of 1 nm to 10 nm, 10 nm to 20 nm, 20 nm to 30 nm, 30 nm to 40 nm, 40 nm to 50 nm, 50 nm to 60 nm, 60 nm to 70 nm, 70 nm to 80 nm, 80 nm to 90 nm, or 90 nm to 100 nm when used with electro-filtration.

Figure 3B:
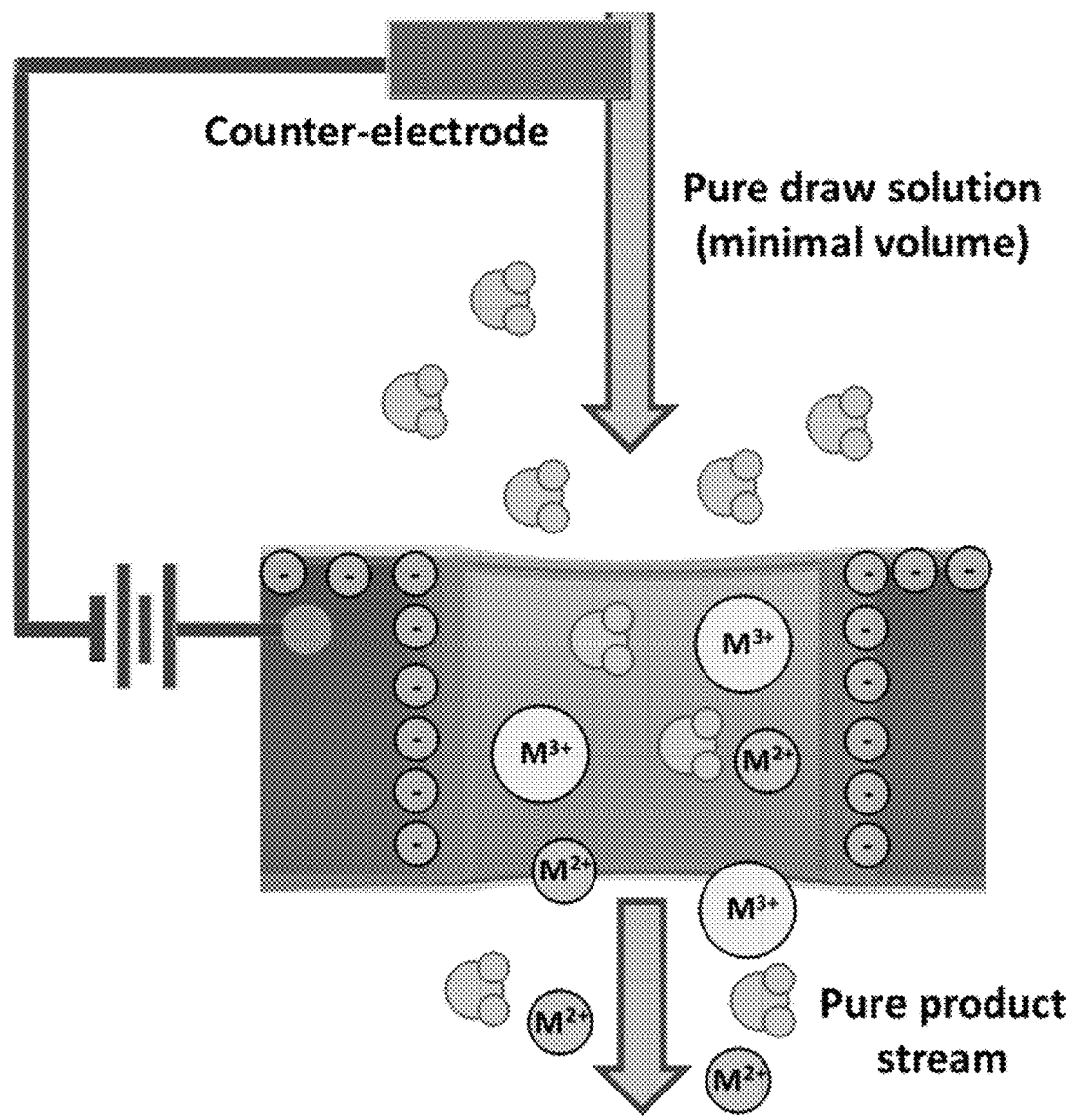
FIG. 3B is a schematic of one example system implementing a second step in electro-extraction in a flow-through configuration.

In other embodiments, such as in electro-extraction (e.g. electroplating) as seen in FIGS. 3A and 3B, an electrical contact may be placed on the membrane filter and a counter electrode may be placed above the membrane filter to hold the membrane filter at a constant electric potential or to flow constant current into the membrane filter such that the pore walls within the membrane filter are charged to attract and electrochemically reduce or oxidize certain components (compounds/molecules/atoms/ions), fixing them to the pore wall while letting other components pass through. In some embodiments, for electro-extraction, the membrane filter is held at a constant electric potential or has a constant current driven through the membrane filter. In some examples, the potential and/or current may fluctuate. Therefore, as used herein, a "constant" electric potential or "constant" current may be controlled to be within a threshold of a set parameter (e.g. ±10% of the desired constant electrical potential or constant current). The electro-extraction may be used in a constant-flow system or a batch pressure cell.

The specific component(s) may be fixed within the pores of the membrane filter, either at the pore wall surface or absorbed within the membrane material. The initial feed solution (mixture solution) may then be replaced with pure solution (e.g., water or sulfuric acid), into which the specific component(s) of interest is released. In this example, the polarity of the electric field may be reversed to aid in releasing the components retained in the membrane filter. In this example, the total volume of the pure solution passed through the membrane may be much less (1-50%) of the volume of the mixture solution from which the component was extracted, resulting in a more concentrated solution of the target component. In another example, a mixture solution may flow across the membrane filter, where multiple components travel freely through the membrane but only one (or multiple specified) component(s) of the mixture solution is/are retained by the membrane filter. Then, a pure solution is passed through (optionally with a reversed polarity electric field) and the specified retained component(s) are released into it. The components retained within the membrane filter and/or passing through the membrane filter may be selected from Li, Co, Ni, Al, Mn, Fe, Cu, Al, Ag, Zn, etc. In one example, as seen in FIG. 3A, a feed solution (e.g. a battery leachate solution) may pass through the membrane filter where some components (compounds/molecules/atoms/ions) such as Co, Ni, Al, Mn, Fe, Cu, Al, Ag, Zn, etc. may be retained within the pores of the membrane filter while other components such as Li may pass through the pores. In some embodiments, as seen in FIG. 3B, the polarity of the electric field may be reversed and a pure draw solution (e.g. water) may be passed through the system to extract the components (compounds/molecules/atoms/ions) trapped in the pores of the membrane filter and exit the system as a pure product stream. In some examples, an acid flush may be needed to achieve 100% or close to 100% deplating.

In some embodiments, the membrane filter may have larger pores when used for electro-extraction with the electric field inside the membrane filter. For example, the membrane filter may have pore sizes of 100 nm to 150 nm, 150 nm to 200 nm, 200 nm to 300 nm, 300 nm to 400 nm, 400 nm to 500 nm, or 500 nm to 1,000 nm when used with electro-extraction.

In some embodiments, the system may be configured for recycling of acids and other materials used in the system. Batteries ground into black mass are usually dissolved in acids such as sulfuric or hydrochloric acid to form a leachate solution. Typically, low-value materials in the leachate solution such as Fe and Al that were not wanted were precipitated, which also required heat and the addition of neutralizing chemicals (sodium hydroxide and sodium bicarbonate) such that sulfuric acid couldn't be recovered. The present system and process does not require heat, precipitation, or the addition of other chemicals, allowing at least a portion of the sulfuric acid to be recovered and recycled for further use in the leaching system/process. For example, up to 10%, up to 20%, up to 30%, up to 40%, or up to 50% of the sulfuric acid may be recovered and recycled back into the system/process. Thus, the system allows for continuous reuse of sulfuric acid.

In additional embodiments, the process may be run multiple times and the electric field may be adjusted to select for different components. For example, the retentate solution and/or permeate solution may be recycled back as the mixture solution or into the mixture solution such that a second component can be separated. In other embodiments, multiple electro-filtration and/or electro-extraction modules may be combined in series to extract a series of components.

FIGS. 4A-4I show an embodiment of a system that may be used for electro-filtration or electro-extraction. The system 100 may include a pressure cell 102 that is operable to enable electrification of the membrane filter 104 and introduce an electric field 101 at the membrane filter 104 surface. In an embodiment, the pressure cell 102 may include the membrane filter 104, a counter electrode 106, and an electrical contact 134. In various embodiments, the system may further include a porous support piece 108, an inlet pressure port 110, an O-ring 112, a housing 114, an insulated wire (i.e. counter electrode lead) 116, a plastic shim 118, a shim 120, a clamp 122, an endcap 124, a spout 126, a plastic rod 128, centering spacers 130, and/or quick disconnect terminals 132.

Figure 4A:
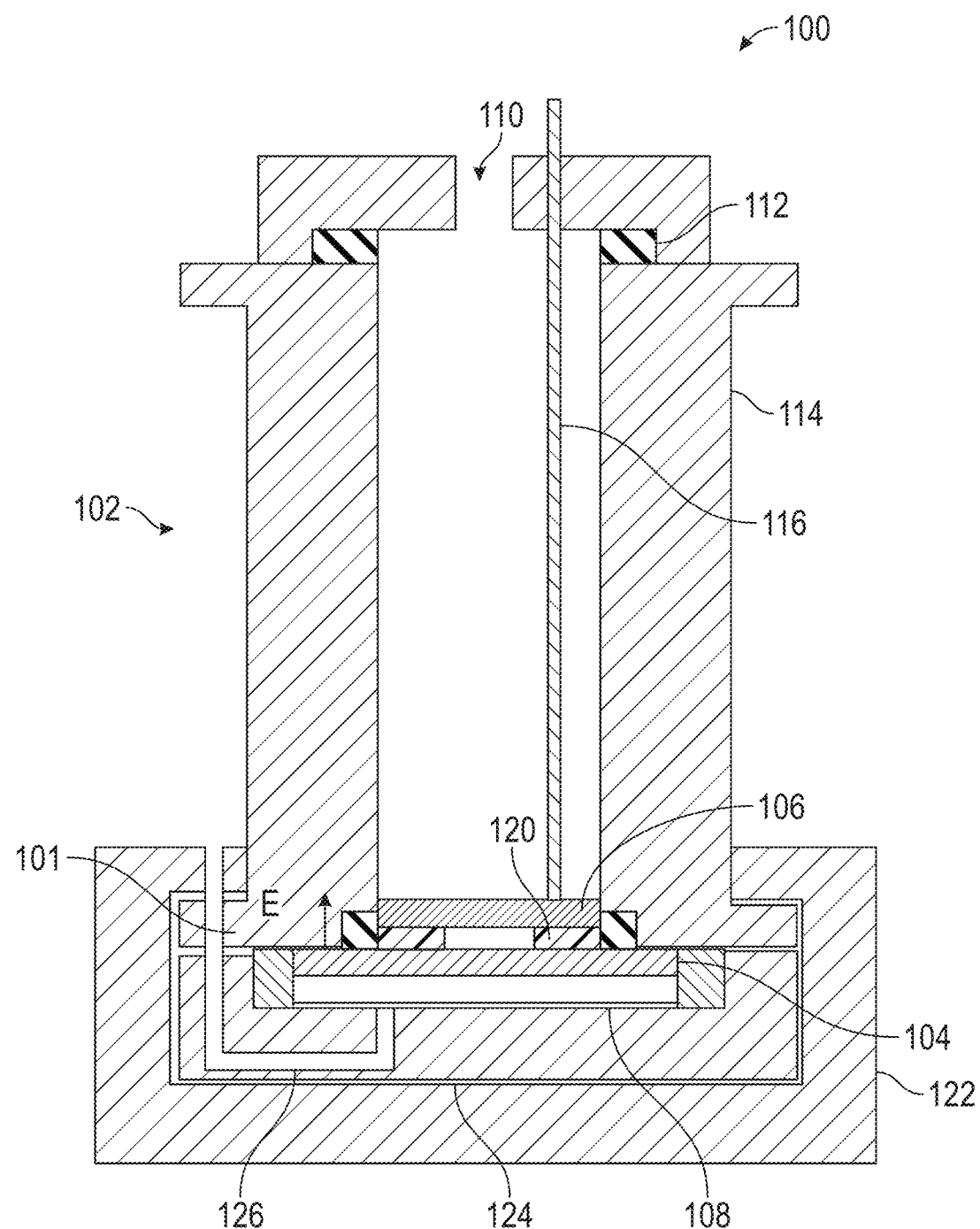
FIG. 4A is one example membrane filtration system with an electrified membrane filter in a pressure cell.
Figure 4B:
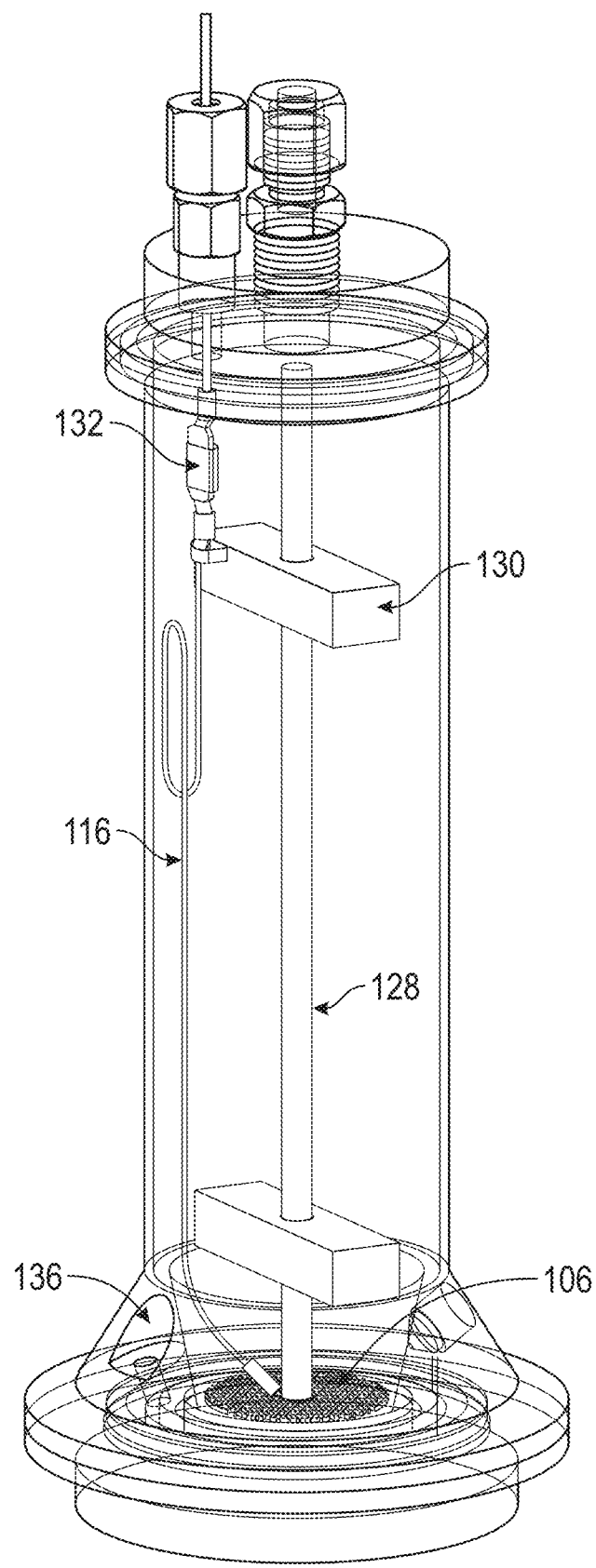
FIG. 4B is one example membrane filtration system with an electrified membrane filter in a pressure cell.
Figure 4C:
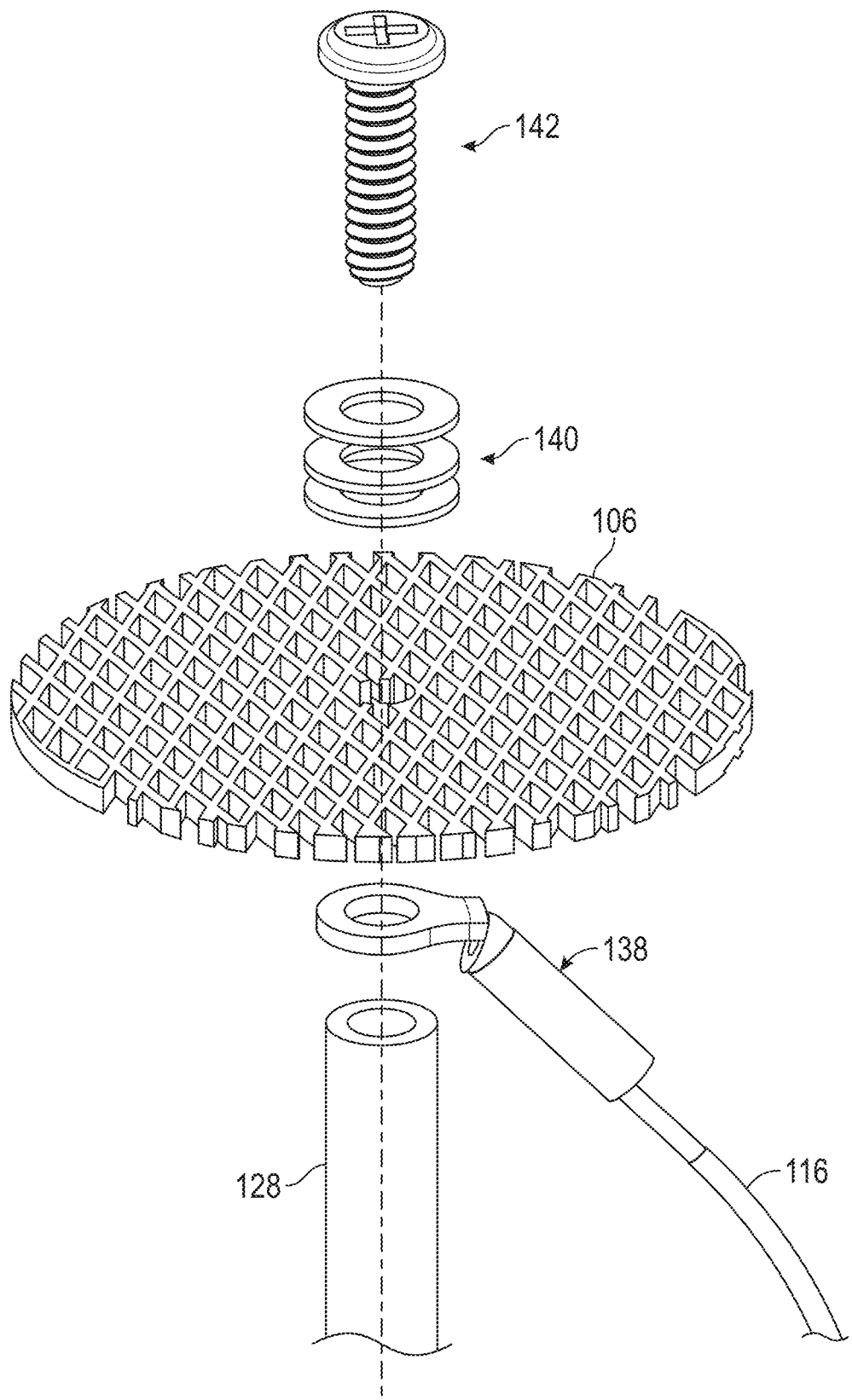
FIG. 4C shows how a ring terminal connects to a counter electrode, in one example.
Figure 4D:
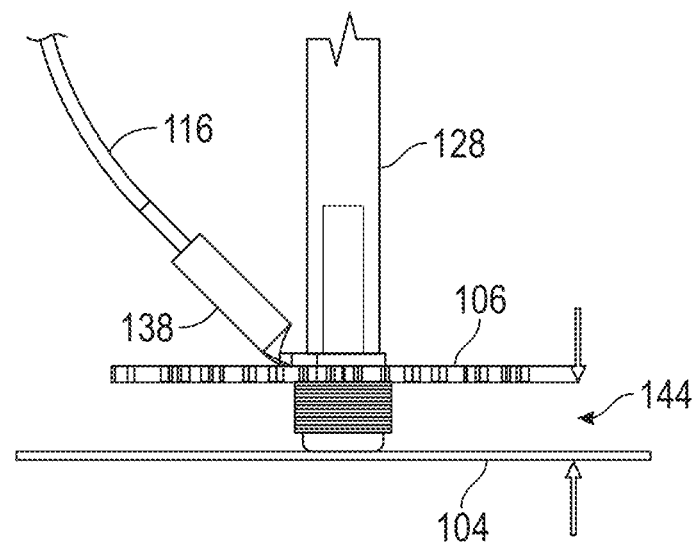
FIG. 4D shows the distance between the counter electrode and the membrane filter, in one example.
Figure 4E:
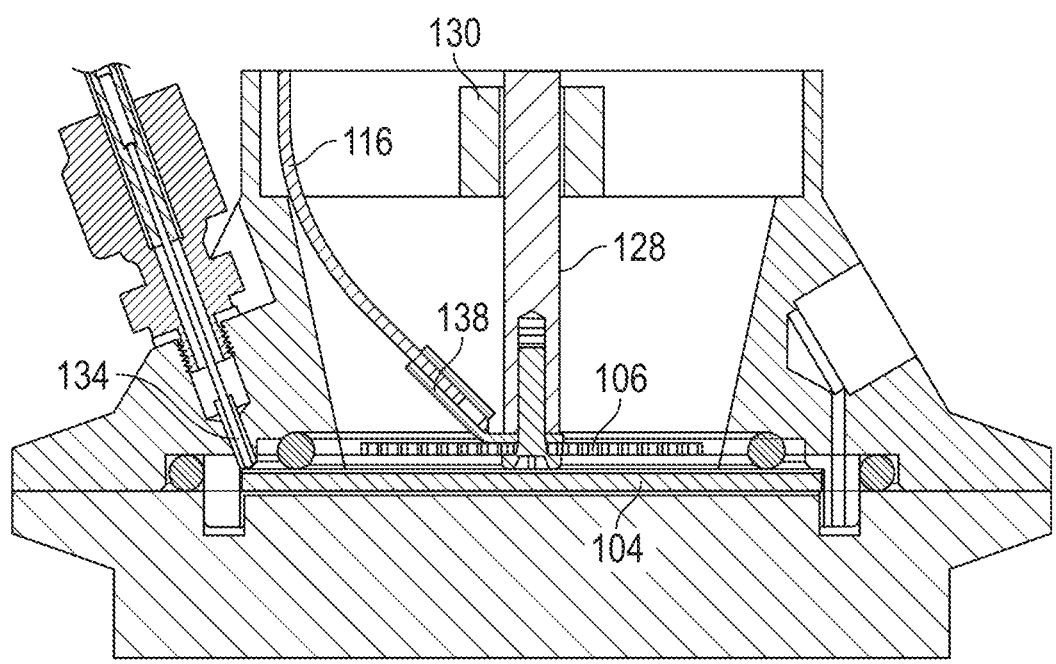
FIG. 4E shows a cross-section of a bottom portion of a pressure cell in an example membrane filtration system.
Figure 4F:
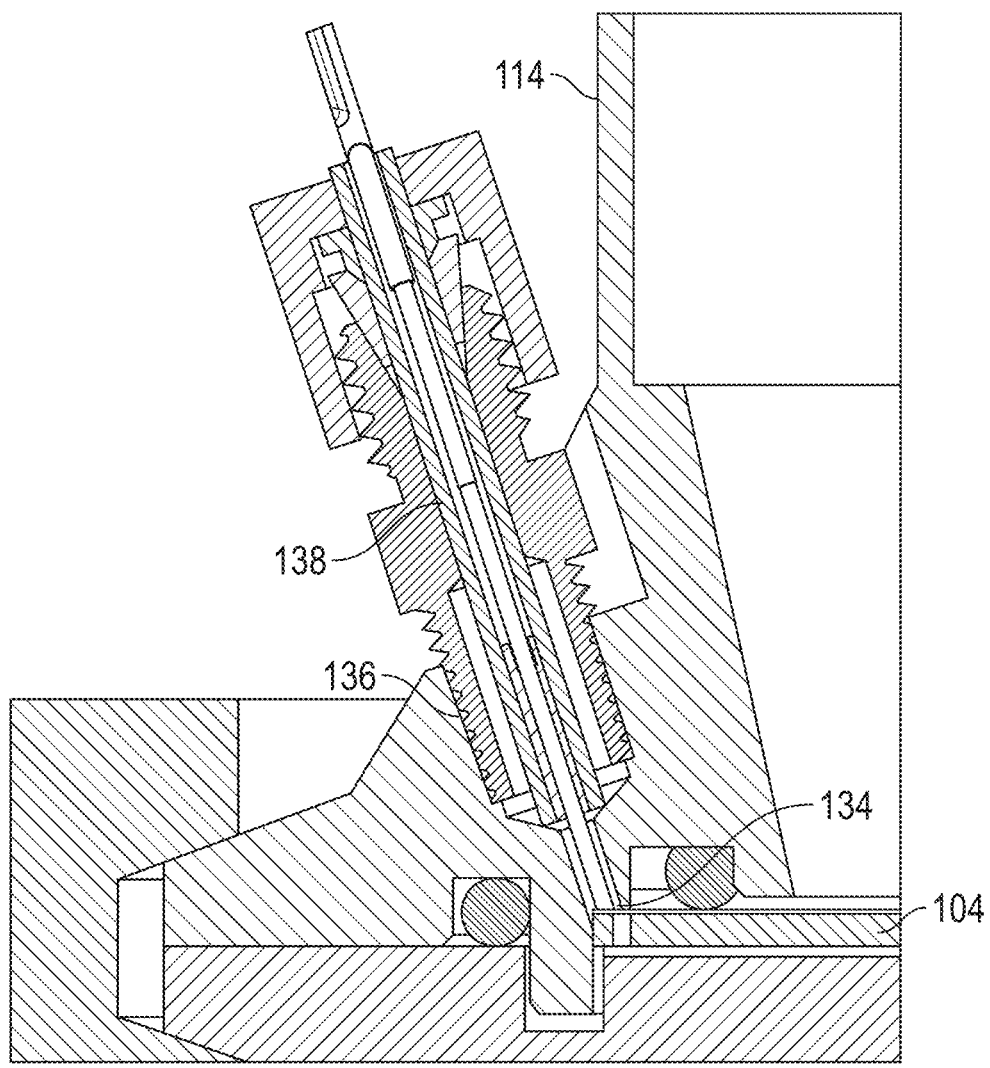
FIG. 4F shows an example spring-loaded electrical contact in an example membrane filtration system.
Figure 4G:
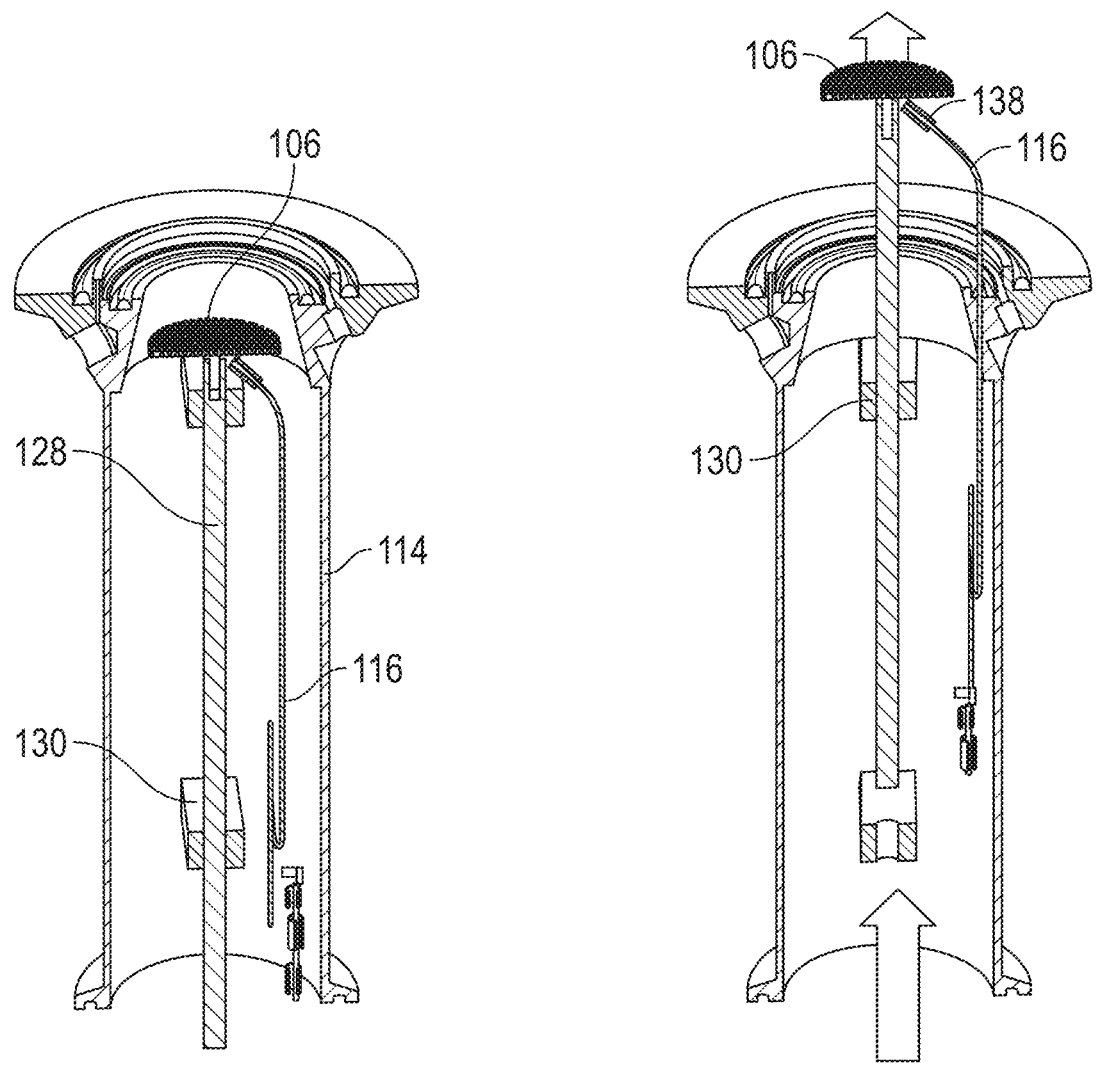
FIG. 4G, FIG. 4H, and FIG. 4I show portions of an example membrane filtration system being assembled or disassembled.
Figure 4H:
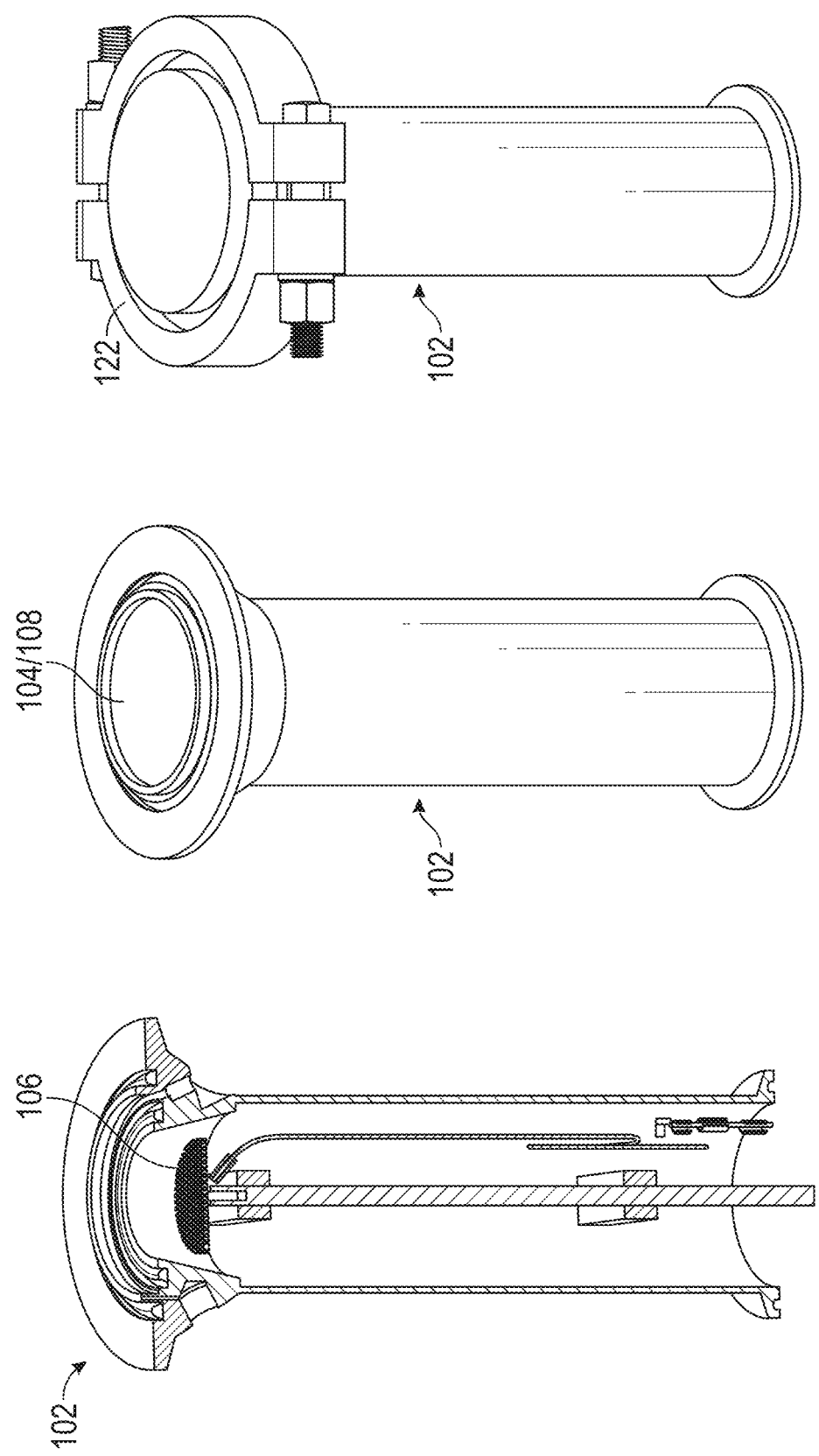
Figure 4I:
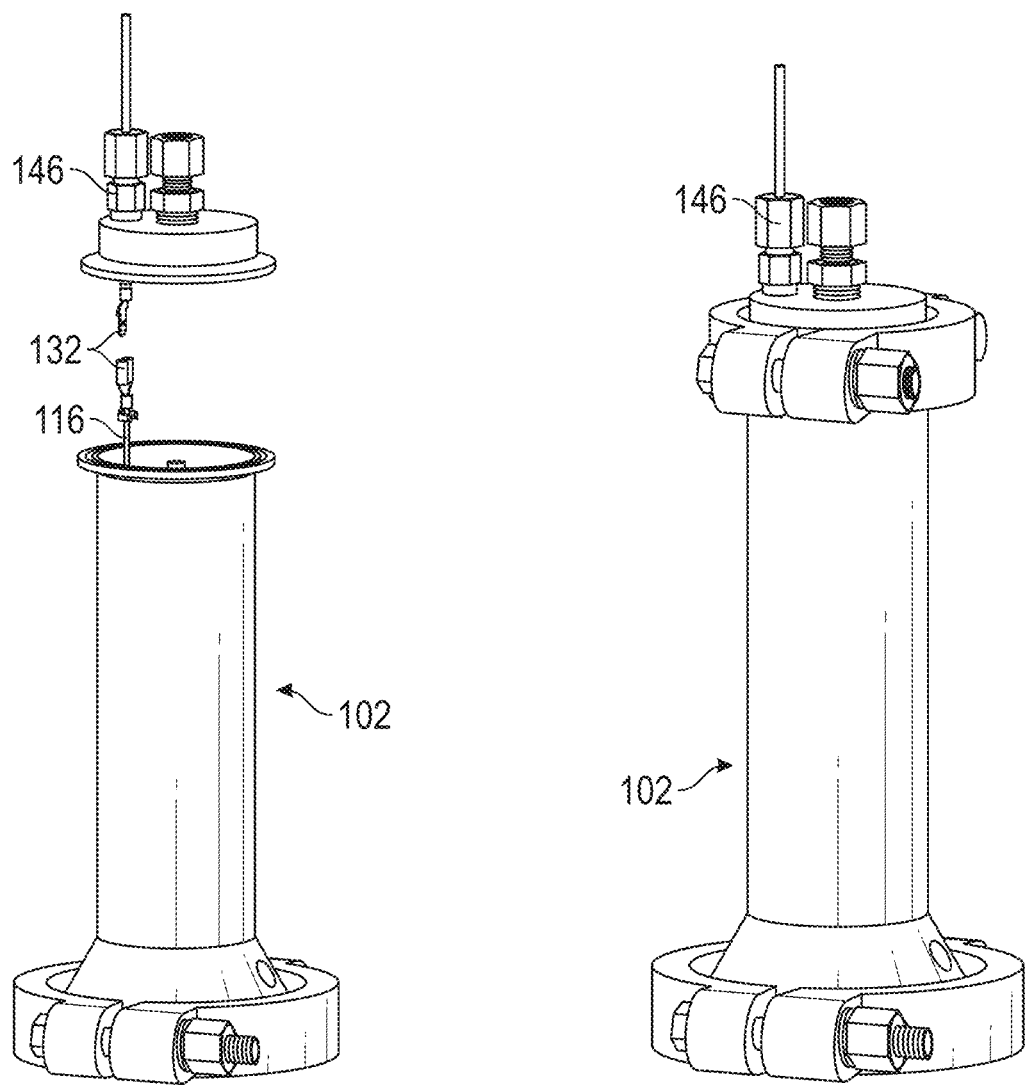

In some embodiments, the counter electrode 106 may be comprised of a conductive mesh with a large porosity to let all compounds/ions through. In at least one example, the counter electrode 106 is a platinum mesh. In another example, the counter electrode 106 comprises silicon. FIGS. 4B-4D further show that the counter electrode 106 may be supported by a rod 128 running the length of the pressure cell 102 housing 114. In some embodiments, the rod 128 may be supported by at least one centering spacer 130. In some examples, the rod 128 comprises a plastic material and the centering spacers 130 comprise a plastic material or PTFE. The two centering spacers 130 may be press-fit into the pressure cell 102. FIG. 4G shows how the rod 128, counter electrode 106, insulated wire 116, and related elements may be removed through the bottom of the pressure cell when needed for cleaning, modification, or replacement. FIG. 4H shows how the counter electrode 106 may be re-installed through the bottom of the pressure cell 102, the membrane filter 104 and porous support piece 108 installed, and the clamp 122 clamped on the bottom of the pressure cell 102. FIG. 4I shows how the insulated wire 116 is connected to the lid pass-through 146 using the quick connect/disconnect terminal 132

The insulated wire 116 may be an electrical lead connected to the counter electrode 106. As seen in FIG. 4B, the insulated wire 116 may have quick disconnect terminals 132. In one example, they may be ¼" quick disconnect terminals 132. The insulated wire 116 may be an epoxied wire, such as a PTFE insulated wire. In some examples, as seen in FIG. 4C, the insulated wire 116 may connect to the counter electrode 106 via a gold-plated ring terminal 138. The ring terminal 138 may be held in place using one or more washers 140 and a mounting screw 142. Referring to FIG. 4D, the distance 144 between the counter electrode 106 and the membrane filter 104 may be controlled by the number of washers 140 added below the mounting screw 142. The distance 144 between the counter electrode 106 and the membrane filter 104 may range from 0.1 mm to 10 mm. In some non-limiting examples, the distance 144 may be 0.1 mm to 0.5 mm, 0.5 mm to 1 mm, 0.5 mm to 1.5 mm, 1.25 mm, 2.5 mm, 3.75 mm, or 5 mm. In some embodiments, the washers 140 may be PTFE washers and the mounting screw 142 may be a PEEK mounting screw. Other materials known in the art are contemplated for the ring terminal 138, washers 140, and screw 142. In some examples, the washers 140 and screw 142 may be made of non-conducting materials.

In an embodiment, the electrical contact 134 is a spring-loaded electrical contact. For example, the electrical contact 134 may be a pogo pin. As seen in FIG. 4F, the wiring/lead 138 for the electrical contact 134 sits inside an insulating plastic tube and passes through a Swagelok fitting. The housing 114 may further include an opening 136 operable to receive the electrical contact 134. The electrical contact 134 may contact the membrane filter 104 on the top side of the membrane filter 104. FIGS. 5A-5F show an example system with the electrical contact 134 inserted through the opening 136 in the side of housing 114 the pressure cell 102.

Figure 5A:
FIG. 5A, FIG. 5B, FIG. 5C, FIG. 5D, FIG. 5E, and FIG. 5F show portions of an example membrane filtration system with an electrified membrane filter in a stainless-steel pressure cell.
Figure 5B:
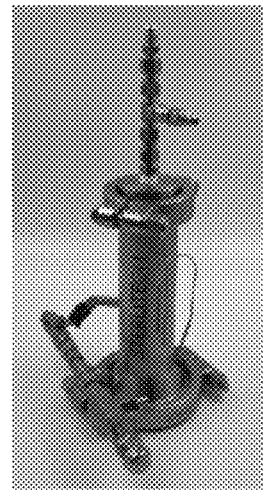
Figure 5C:
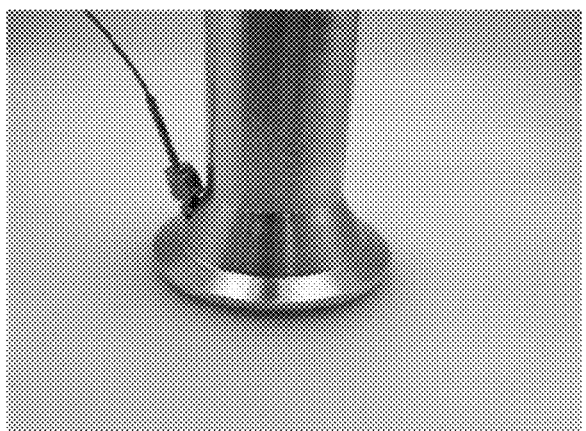
Figure 5D:
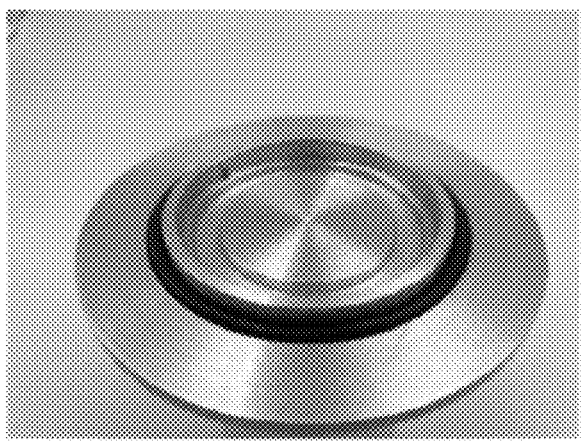
Figure 5E:
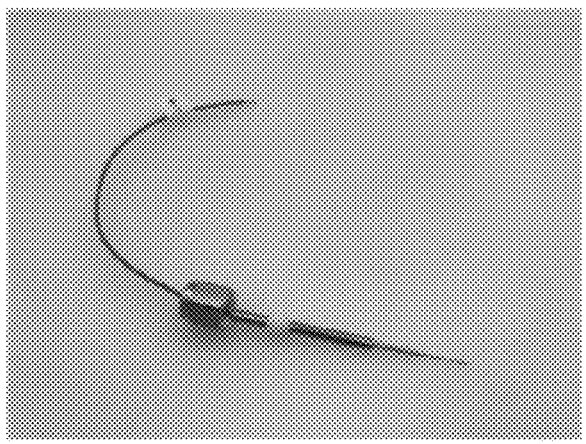
Figure 5F:
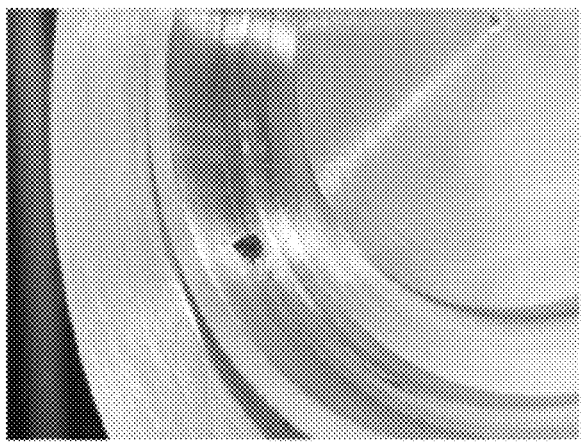
Figure 5G:
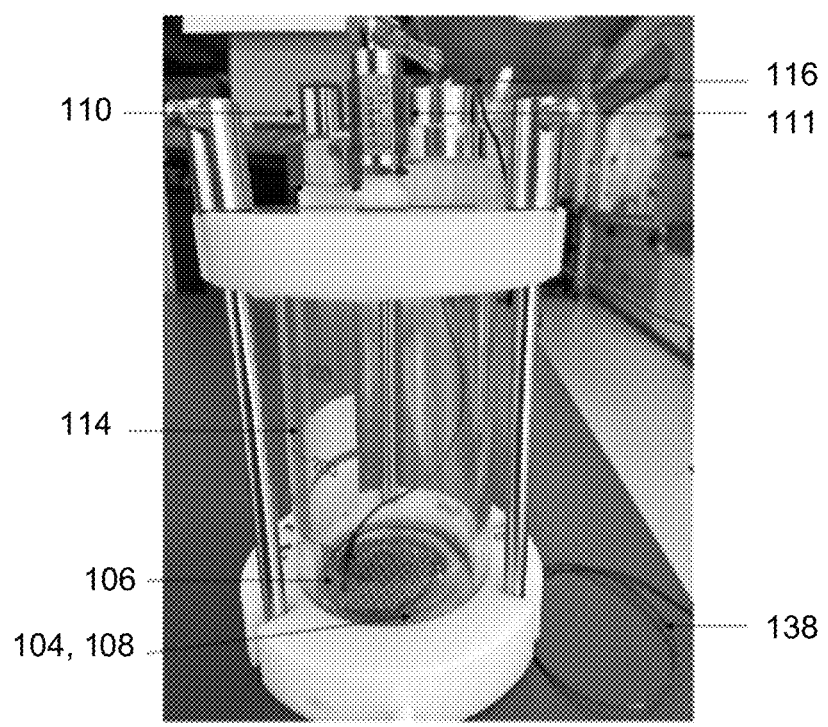
FIG. 5G shows an example membrane filtration system with an electrified membrane filter in a polycarbonate pressure cell.

In an embodiment, the pressure cell 102 is made of stainless steel, such as seen in FIGS. 5A-5F, for example. In some embodiments, the pressure cell 102 is made of polycarbonate, Teflon, PFA, or other chemically-resistant materials. FIG. 5G shows an example polycarbonate pressure cell 102. The pressure cell includes an inlet pressure port 110, a relief valve 111 (60 psi), a counter electrode lead 116, a counter electrode 106, a membrane filter 104, and a porous support piece 108.

In various examples, the pressure cell may operate under pressures ranging from 0 psi to 50 psi, 50 psi to 100 psi, 100 psi to 200 psi, 200 psi to 300 psi, 300 psi to 400 psi, 400 psi to 500 psi, 500 psi to 1000 psi, 1000 psi to 1500 psi, 1500 psi to 2000 psi, 2000 psi to 2500 psi, or 2500 psi to 3000 psi. The system may be operable at pressures up to 3000 psi whether the system is electrified not non-electrified. In some examples, a low pressure condition may refer to pressures less than 500 psi. In other examples, a high pressure condition may refer to pressures greater than 500 psi. The stainless steel pressure cell may be operated under both low and high pressure conditions and the polycarbonate or Teflon pressure cell may be operated under low pressure conditions. In an example, a stainless steel pressure cell may be coated internally with a chemically-resistant polymer to enable operation at high pressure with low pH solutions (pH<2). In an example, the stainless steel pressure cell may be operable to withstand pressures up to 3000 psi. In an embodiment, a system with small pore sizes (e.g. 1 nm to 100 nm) may be used with high pressures, while a system with larger pore sizes (e.g. 100 nm to 1,000 nm) may be used with low pressures. In at least one example, system with a membrane filter with a pore size of 10 nm may operate at pressures greater than 700 psi.

In various embodiments, the system may further include a pump operable to pump the mixed solution, permeate solution, and/or retentate solution through the system at the desired pressures.

In some embodiments, the housing of the pressure cell may have a polymeric or other electrically-insulating coating. This may prevent conduction of the electrical current throughout the pressure cell and allow it to be contained at the membrane filter or between the membrane filter and the counter electrode.

Additionally or alternatively, the application of an electric current to the membrane may not act to pull a specific ion through the membrane, but may instead act to enhance the ionic separation selectivity of the membrane, allowing for greater specificity in the separation of target materials. In this embodiment, transport through the membrane may be driven by either a concentration gradient or pressure-driven flow. As part of charge separation, the membrane filter may enable separation of multiple compounds/elements within the solution, wherein molecules/ions of different magnitudes of charge may be positionally separated in the solution as the entire sample solution, or a portion of the sample solution travels through the membrane filter.

In some variations, the membrane filter may comprise a structure that enables filtration by interaction of the membrane with molecules/compounds/ions in solution. In these variations, the membrane filter may be composed of material that enables interaction with a particular molecule(s)/ion(s)/atom(s), type of molecule(s). In some variations, this may comprise binding sites, wherein a substrate may bind the membrane to enable/disable passage across the membrane.

Additionally or alternatively, the membrane filter may comprise a semi-permeable membrane that allows passage of certain types of molecules/ions while preventing other types of molecules/ions to pass. For example, in one implementation the membrane filter may comprise a semipermeable membrane that allows passage of polar molecule and prevents passage of non-polar molecules. In other variations, the membrane filter may allow unique interactions with certain molecule(s) or types of molecules. For example, a silicon-based membrane filter may enable unique interactions with lithium ions, enabling their passage, while blocking other ions and other molecules from passing through the membrane filter. In this example, properties of the silicon membrane filter may be leveraged to enable sorption of the Li by the membrane filter followed by desorption to enable release of the Li. In this example, a coating may be applied within the pores of the membrane and at the membrane surface that allows, or improves, the selective oxidation or reduction of Li, Ni, Co, Al, Fe, Cu, Mn, or other components via a current applied to the conductive silicon membrane.

In some variations, the system may comprise multiple membrane filters. Multiple membrane filters may function to provide enhanced filtration of a specific type, multiple types of filtration, and/or provide other filtration utility.

In one example, multiple membrane filters constructed for size filtration may be stacked upon each other to improve size filtration. In one implementation of this example, multiple membrane filters of decreasing or increasing pore sizes may be stacked in a row to enable filtration of multiple compounds of different sizes. These stacked multiple filters may be used in this manner to create a molecular size gradient within the solution or to filter/separate out multiple compounds/ions.

Figure 6A:
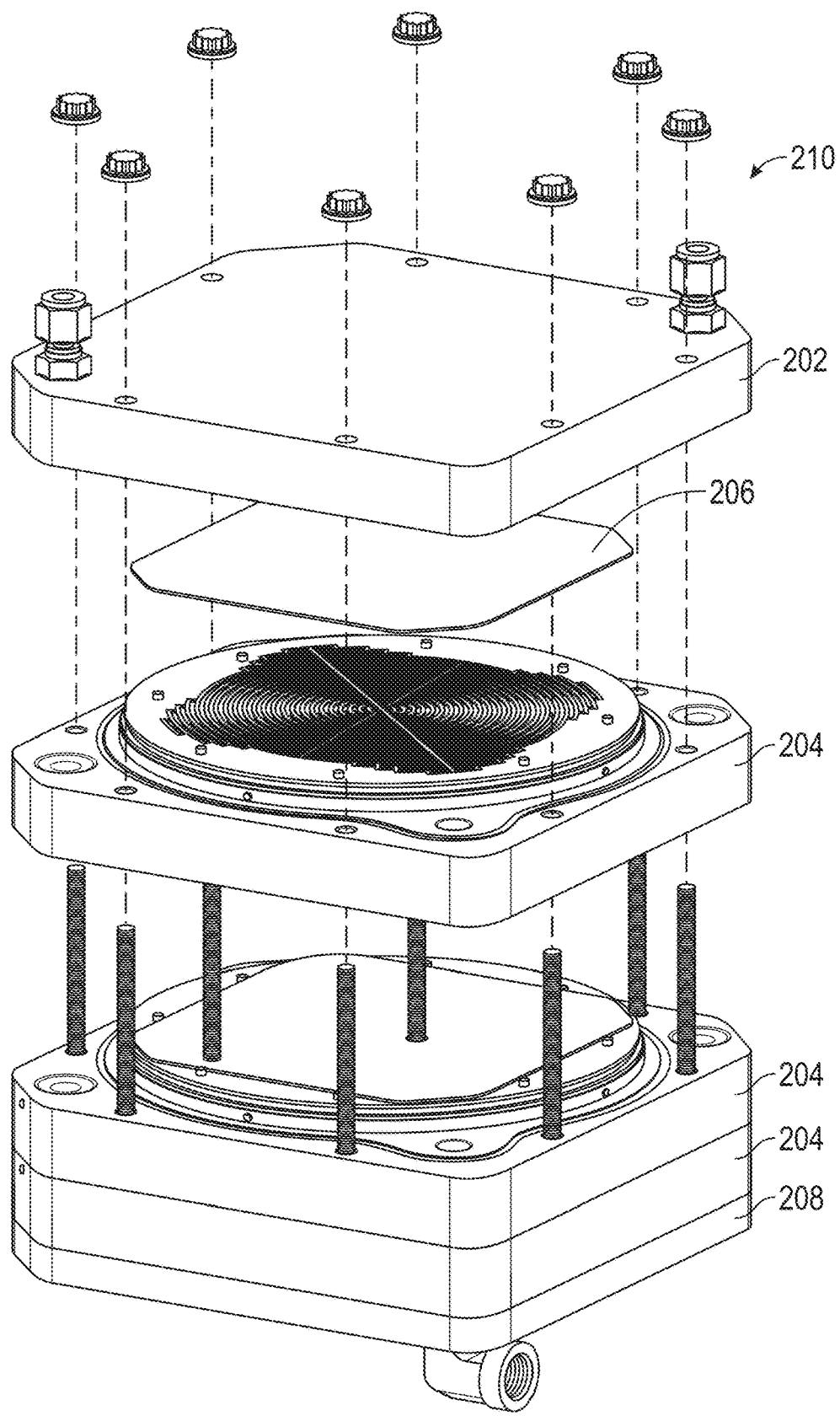
FIG. 6A is an exploded view of an example membrane module.
Figure 6B:
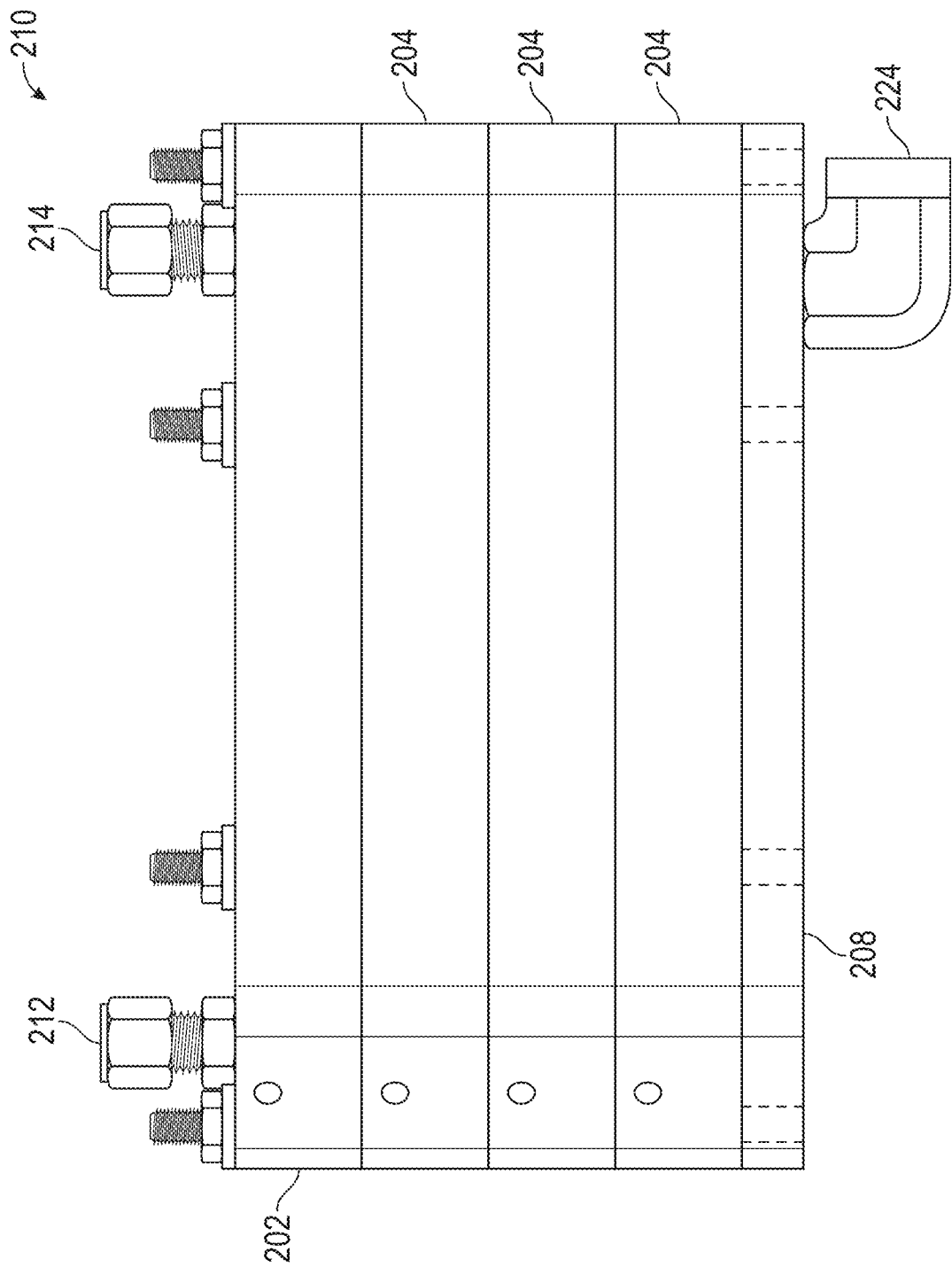
FIG. 6B is an example membrane module with three membrane filter plates.
Figure 6C:
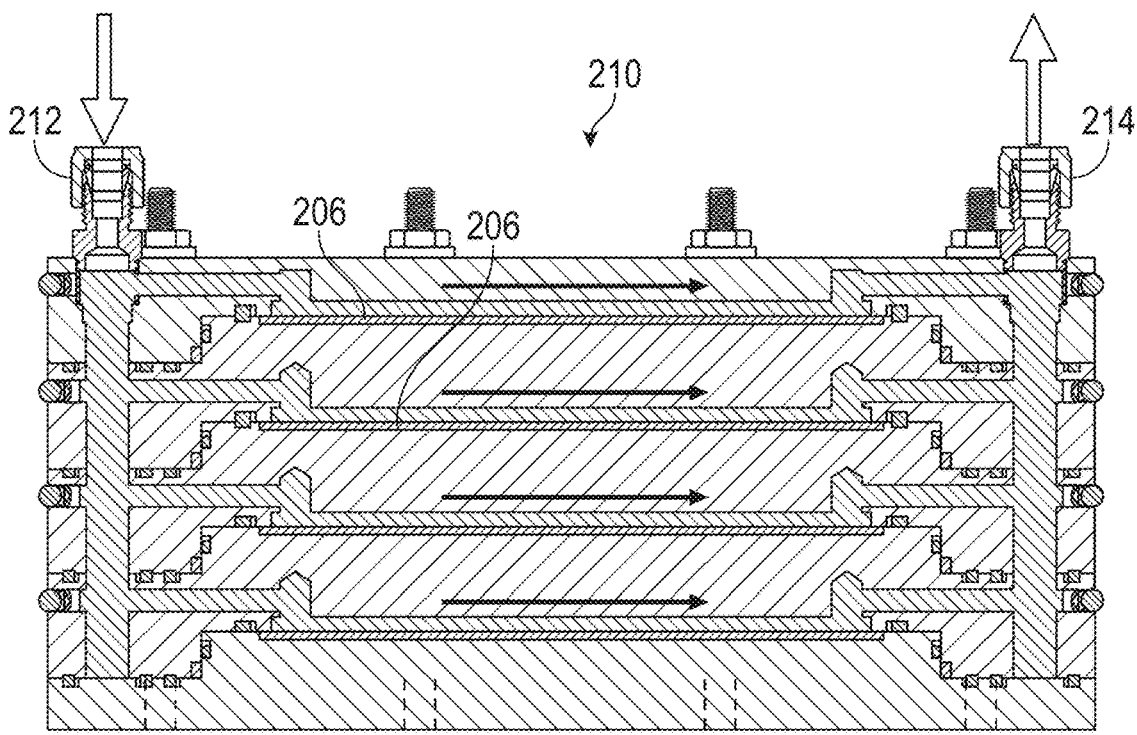
FIG. 6C and FIG. 6D show feed solution pumped into a manifold and distributed across several membrane filters in parallel and then collected into another manifold before being routed out of the module.
Figure 6D:
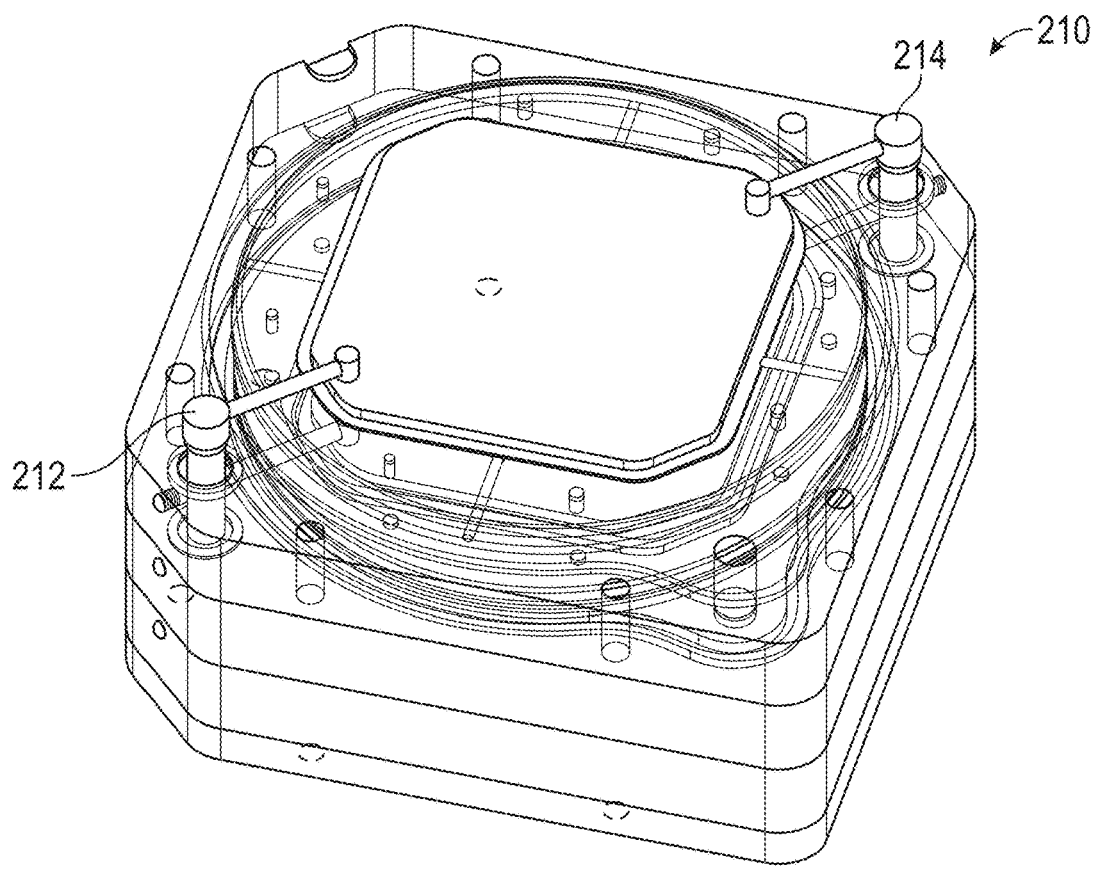
Figure 6E:
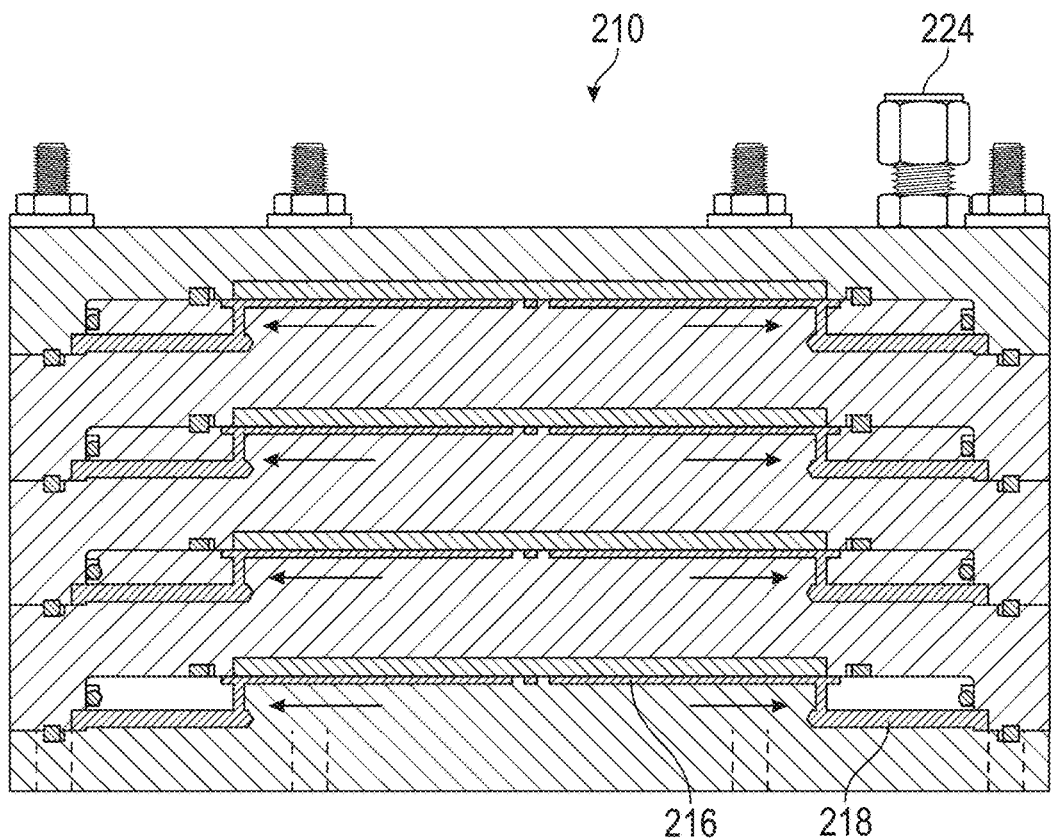
FIG. 6E and FIG. 6F show permeate passing through a membrane filter into channels and traveling outward toward a circumferential groove that collects into a common drain.
Figure 6F:
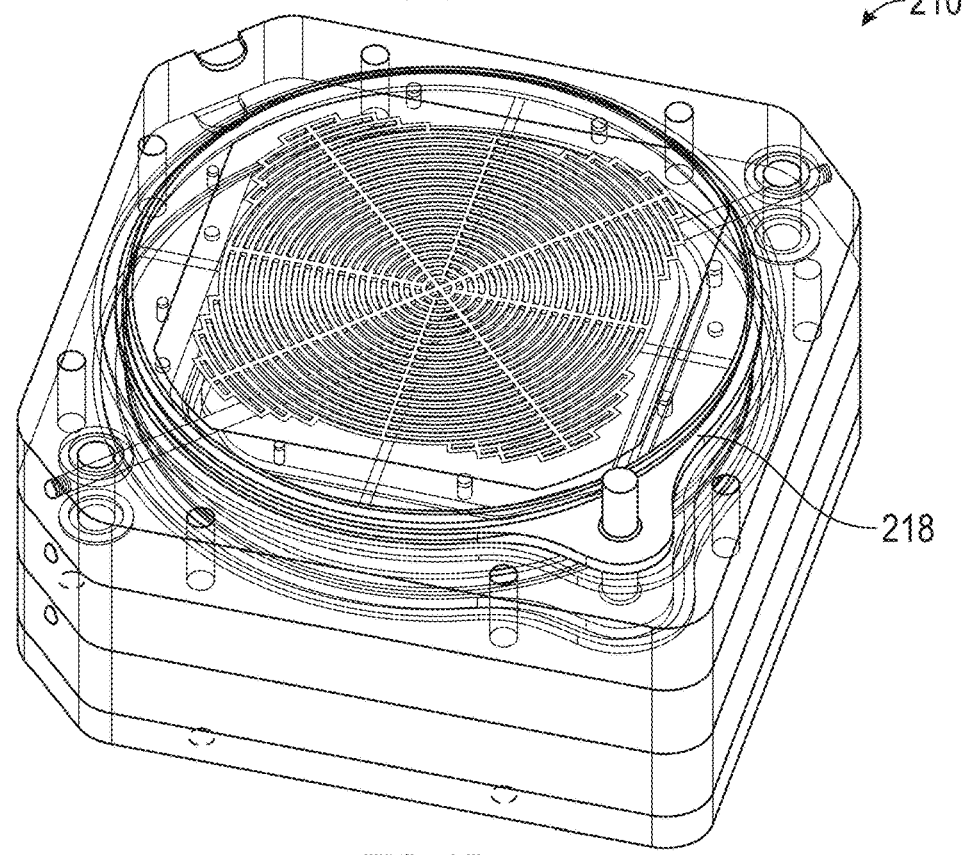

FIG. 6A shows an embodiment of a system having multiple membrane filters in a membrane module. In some embodiments, the membrane module 210 may include a top plate 202, one or more membrane plates 204 operable to support a membrane filter 206, and a base plate 208. In some examples, the base plate may also be operable to support a membrane filter 206. Multiple membrane support plates 204 may be stacked between the top plate 202 and the base plate 208 to form a stacked membrane module 210. The membrane module 210 may include 1, 2, 3, 4, 5, 6, 7, 8, 9, 10, 10 to 50, 50 to 100, or numerous (>100) membrane plates 204 and/or may include 1, 2, 3, 4, 5, 6, 7, 8, 9, 10, 10 to 50, 50 to 100, or numerous (>100) membrane filters 206. FIG. 6B shows an example membrane module 210 with 3 membrane plates and 4 membranes. The membrane module 210 may have ports 212, 214, 224 for the feed, retentate, and permeate lines. FIGS. 6C and 6D show the flow of the mixed solution/concentrate pumped into a manifold/port 212 and distributed across several membrane filters 206 in parallel then collected into another manifold/port 214 before exiting the module. FIGS. 6E and 6F show the flow of permeate passing through the membrane filters 206, into channels 216, and traveling outward toward a circumferential groove 218 that collects into a common drain.

Figure 7A:
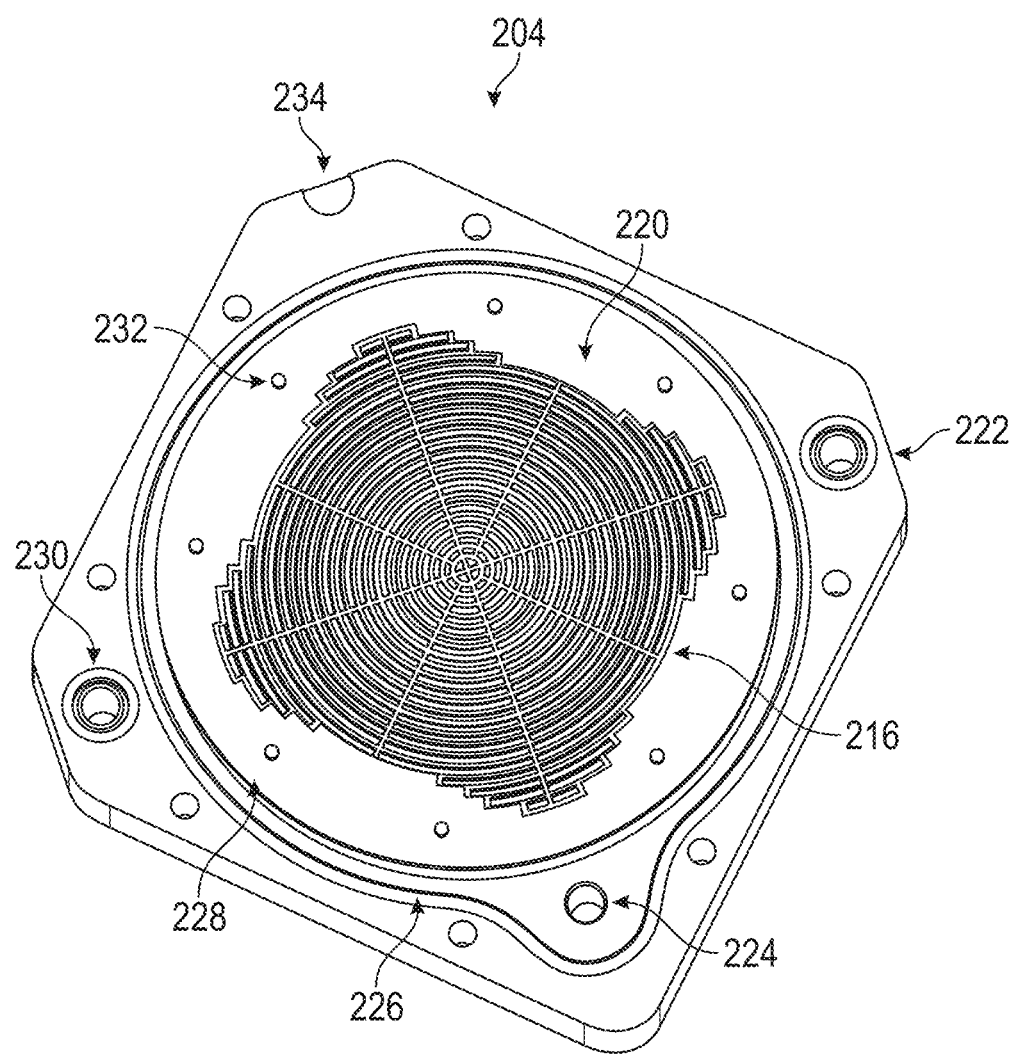
FIG. 7A shows the top side of an example membrane filter plate.
Figure 7B:
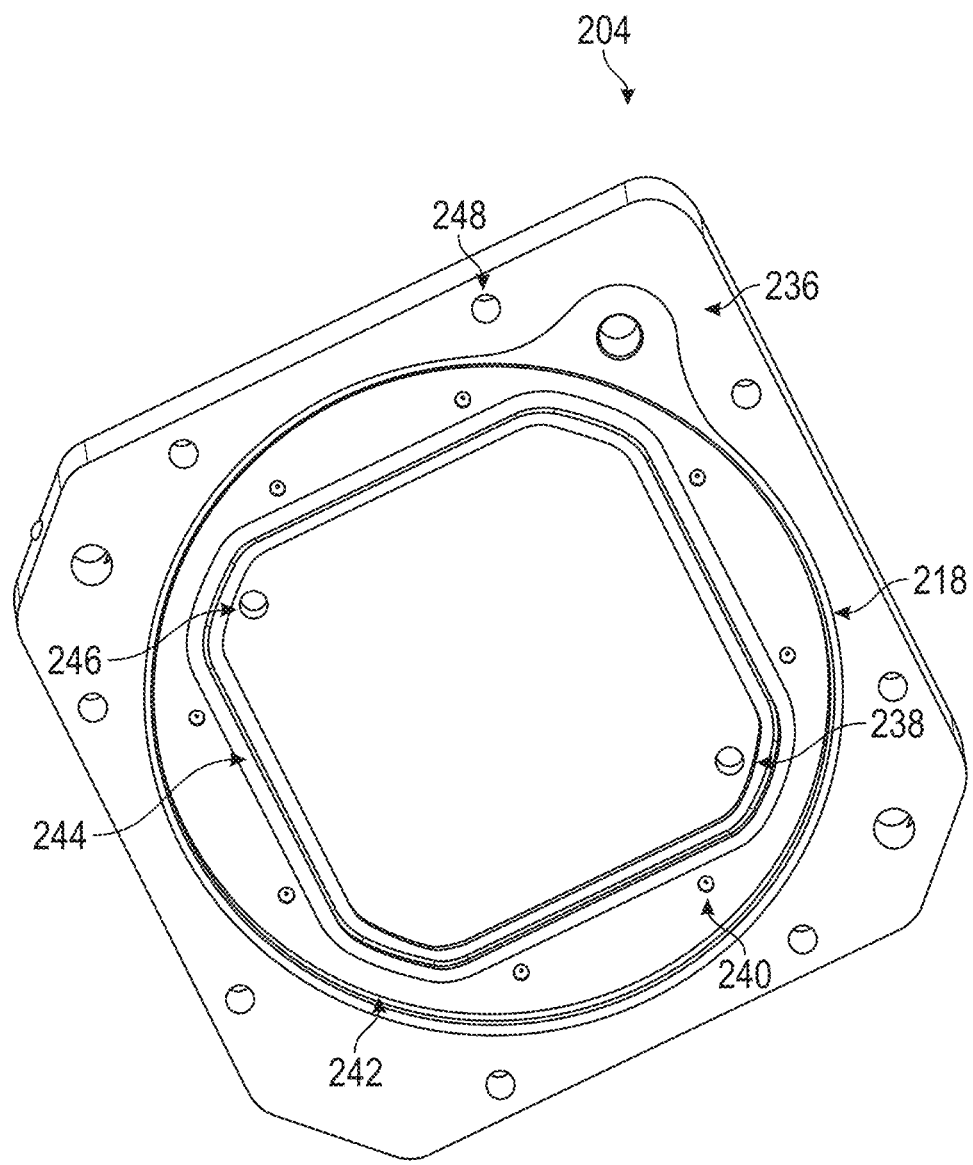
FIG. 7B shows the bottom side of an example membrane filter plate.
Figure 7C:
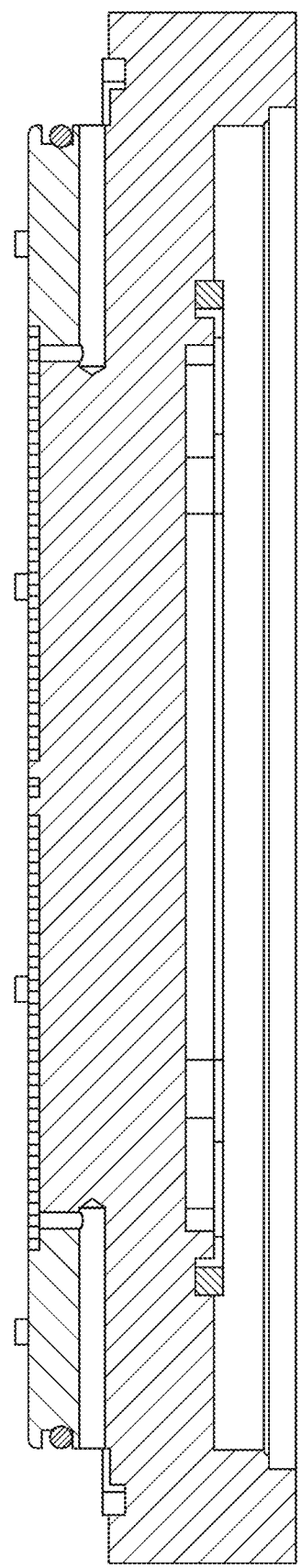
FIG. 7C is a side view of an example membrane filter plate.

FIGS. 7A-7C show views of an example membrane support plate 204. FIG. 7G shows the top side of the membrane support plate 204. In some embodiments, the membrane support plate 204 may include a smooth surface 220 or flat isotopically microporous surface for supporting the membrane filter 206, a face seal 222 around the retentate manifold/port 214, channel 216 permeate holes, a plate drain manifold/port 224, a face seal 226 for permeate, a secondary seal 228 for retentate on a cylindrical boss, a face seal 230 around the feed manifold/port 212, one or more PTFE pins 232 for locating the membrane filter 204 location, and a plate separation groove 234. FIG. 7B shows the bottom side of the membrane support plate 204. In some embodiments, the membrane support plate 204 may further include a smooth surface 236 for face seals, a circumferential permeate collection groove 218, a cross-flow outlet 238, one or more clearance holes 240 operable to receive the one or more PTFE pins 232, a cylindrical bore 242 for the secondary seal 228, a primary face seal 244 for the membrane filter 204, a cross-flow inlet 246, and clearance holes 248 operable to receive a threaded rod 250.

In some embodiments, the height of the membrane support plates 204 may range from 0.5 inches to 1 inch. For example, the height of the membrane support plates 204 may range from 0.5 inches to 0.6 inches, 0.6 inches to 0.7 inches, 0.7 inches to 0.8 inches, 0.8 inches to 0.9 inches, or 0.9 inches to 1 inch. In at least one example, the membrane support plate 204 may have a height of 0.875 inches. In some embodiments, the height of the top plate 202 may range from 0.5 inches to 1 inch. For example, the height of the top plate 202 may range from 0.5 inches to 0.6 inches, 0.6 inches to 0.7 inches, 0.7 inches to 0.8 inches, 0.8 inches to 0.9 inches, or 0.9 inches to 1 inch. In at least one example, the top plate 202 may have a height of about 0.875 inches. In some embodiments, the height of the base plate 208 may range from 0.5 inches to 1 inch. For example, the height of the base plate 208 may range from 0.5 inches to 0.6 inches, 0.6 inches to 0.7 inches, 0.7 inches to 0.8 inches, 0.8 inches to 0.9 inches, or 0.9 inches to 1 inch. In at least one example, the base plate 208 may have a height of about 0.875 inches. A membrane support module 210 may have a height ranging from 1.5 inches to 10 inches, depending on the number of membrane support plates 204 included in the membrane support module 210. In one example, a membrane support module 210 may have a height of about 4 inches when it includes 3 membrane support plates 204 and 4 membrane filters 206. The permeate, retentate, and feed manifolds/ports may be sized to accommodate the desired total flow rate through the system. In some embodiments, the size of the manifold may be increased with the more membrane support plates 204 in a membrane module 210 or a higher flow per membrane filter 206. In some examples, the manifold may be up to 0.5-1.0 meters in diameter and the height would increase with the number of membranes needed.

Analogous to multiple filters with the same, or changing, pore size, other types of membrane filters (e.g., charge/electric current, or membrane binding/coating) may be implemented in the same manner. In another example, multiple membrane filters constructed to conduct electricity are positioned in a series. A voltage may then be passed through the membranes such that multiple, differently charged components are separated such that the majority fraction of each component is spatially separated by the membrane filters.

Additionally or alternatively, the system may include multiple filters of differing type. For example, one system may include one, or more, membrane filters that filter by size and one, or more, membrane filters that interact with the desired compound(s)/ion(s). In one implementation for Li filtering, the system may include a silicon membrane filter that adsorbs and desorbs Li and another membrane filter that filters by pore size.

In some variations the system may include a coating, wherein the coating comprises a functional coating within and around the porous structure and on the surface of the membrane filter. The specific type of coating may be dependent on the system implementation. The coating may function to improve membrane filtration. Additionally, or alternatively, the coating may improve the durability of the membrane filter (e.g., provide the porous structure with increased structural support).

In some variations, the coating may improve membrane filtration. For example, in an implementation to separate Li from a black mass leachate solution using a membrane interaction electro-extraction process, the coating may comprise a compound, or compounds, that catalyze the reduction of Li (or other targeted material) below the reduction potential of water (to avoid hydrogen and oxygen formation). The coating may catalyze a sorption/desorption reaction (which may be a Redox reaction). That is, the coating may catalyze a reaction such that the desired compound and the membrane sorb or desorb from the membrane material surface or bulk. For example, the coating may promote Li absorption by the membrane when the membrane is tuned to a specific charge/polarity and then release of the lithium from the membrane once the charge/polarity is removed or switched. Examples of coating compounds may include: vanadium oxide, titanium oxide, aluminum oxide, and other oxides. These compounds may be applied to the membrane surface and pores by a process such as atomic layer deposition.

In some variations, the coating may comprise a structural coating that improves the structural integrity of the membrane filter. This may be in addition to or an alternative to the functional aspects of the coating discussed previously. The structural coating may include a compound, or compounds, that conformally layer the membrane filter, particularly the porous structure to provide additional structural support and/or durability. Additionally or alternatively, the structural coating may prevent degradation of the porous structure of the membrane filter. Examples of structural coatings may include non-reactable metals and metal alloys (e.g., aluminum, titanium). In variations, wherein the coating may provide a functional aspect, the metallic coating may be metallic oxide (e.g. aluminum oxide, titanium oxide).

In variations where the system includes a coating, the coating may be implemented in any desired method. For nanoscale deposition in the pore structure, atomic layer deposition may be implemented. Alternatively, solution-based electrochemical deposition may be implemented. Nanoscale scale deposition may enable deposition of the coating into and onto the porous structure of the membrane filter.

In various examples, membrane filters with one or more layers or coatings may be prepared as described herein below. In some variations, one or more dielectric surface coatings may be on the membrane to create a dielectric separator. In this variation, the use of a dielectric separator may bring the membrane and counter-electrode very close together, allowing for a much higher electric field strength with a lower applied voltage. FIGS. 17C and 17D show examples where the use of a dielectric coating allows for minimal distance (or no distance, i.e. contact) between the membrane and counter electrode. For example, the electrode/counter-electrode spacing may be as small as less than 1 μm, less than 100 nm, or range from about 100 nm to 500 nm, about 500 nm to 1 μm, about 1 μm to 10 μm, about 10 μm to 100 μm, about 100 μm to 500 μm, about 500 μm to 1 mm, about 1 mm to 5 mm, or about 5 mm to 10 mm. In some examples, the dielectric thickness may be as thin as less than about 1 μm, less than about 1 μm, or less than about 100 nm.

Method

Figure 8:
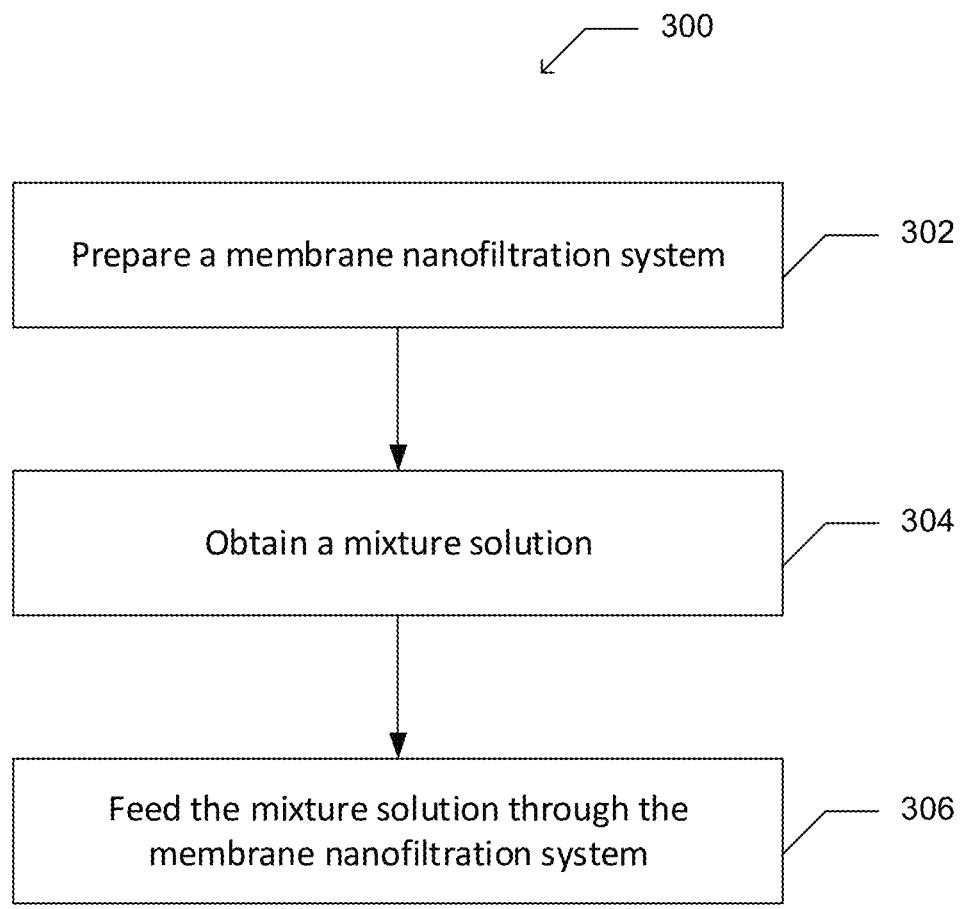
FIG. 8 is a flowchart representation of an example method.

As shown in FIG. 8, a method 300 for material extraction from a mixture via membrane filtration includes: preparing a membrane nanofiltration system 302; obtaining a mixture solution 304, where the mixture solution comprises a solution that includes a desired component for separation; and feeding the mixture solution through a membrane nanofiltration system 306, thereby separating the desired component (e.g. compound(s)/ion(s)) from unwanted components (e.g. compounds) within the mixture solution. The method functions to separate the desired component from other, "undesired" components. The method may implement the material extraction process by leveraging properties of the membrane filtration system to separate by size, charge, membrane/compound interaction, electrochemical oxidation or reduction, sorption, and/or any combination thereof. Additionally or alternatively, the method may leverage other separation properties, such as compound shape(s), polarity, magnetization, conductivity, and/or any other properties or combination of properties.

In some variations, the method functions by feeding all or a portion of the mixture solution through a membrane nanofiltration system (e.g., via pressure-driven flow), whereby the mixture solution is actively filtered such that the desired compound is uniquely blocked passage by the membrane nanofiltration system while other compounds within the mixture are enabled to pass through the membrane nanofiltration system. Alternatively, the desired compound may uniquely pass through the membrane nanofiltration system while other compounds within the mixture are prevented, or hindered, from passing through the nanofiltration system.

In some other variations, the method may function by initially saturating the membrane nanofiltration system with the mixture and then driving the mixture, either passively or actively out of the membrane nanofiltration system. Thus, in these variations, the method may further include saturating the membrane nanofiltration system with the mixture solution. Dependent on implementation, the desired compound may be either separated out of the membrane nanofiltration system, such that undesired compounds remain behind within (or blocked by) the membrane nanofiltration system; or undesired compounds may be filtered out of the membrane nanofiltration system, leaving behind the desired compound.

Figure 9A:
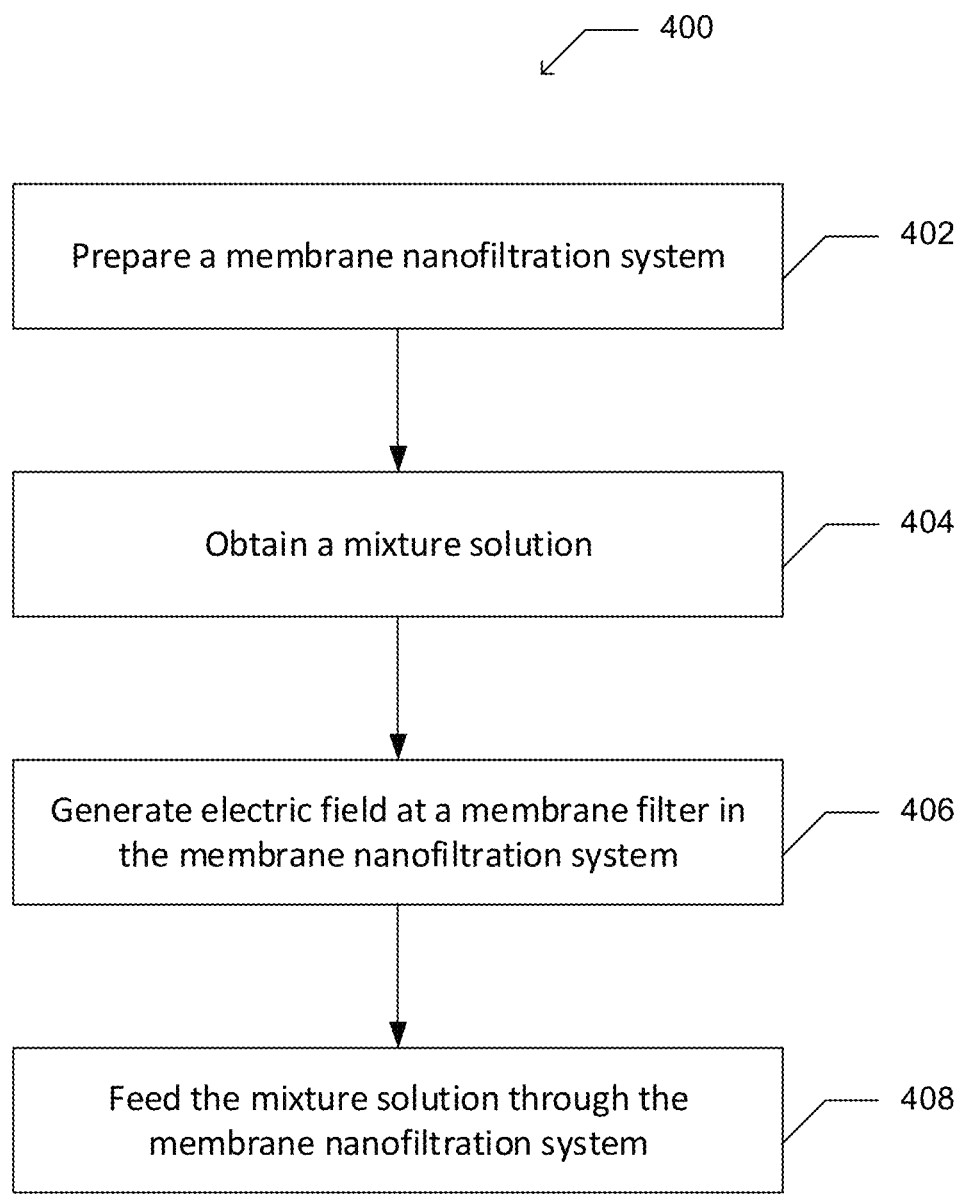
FIG. 9A is a flowchart representation of an alternative example method for electro-filtration.
Figure 9B:
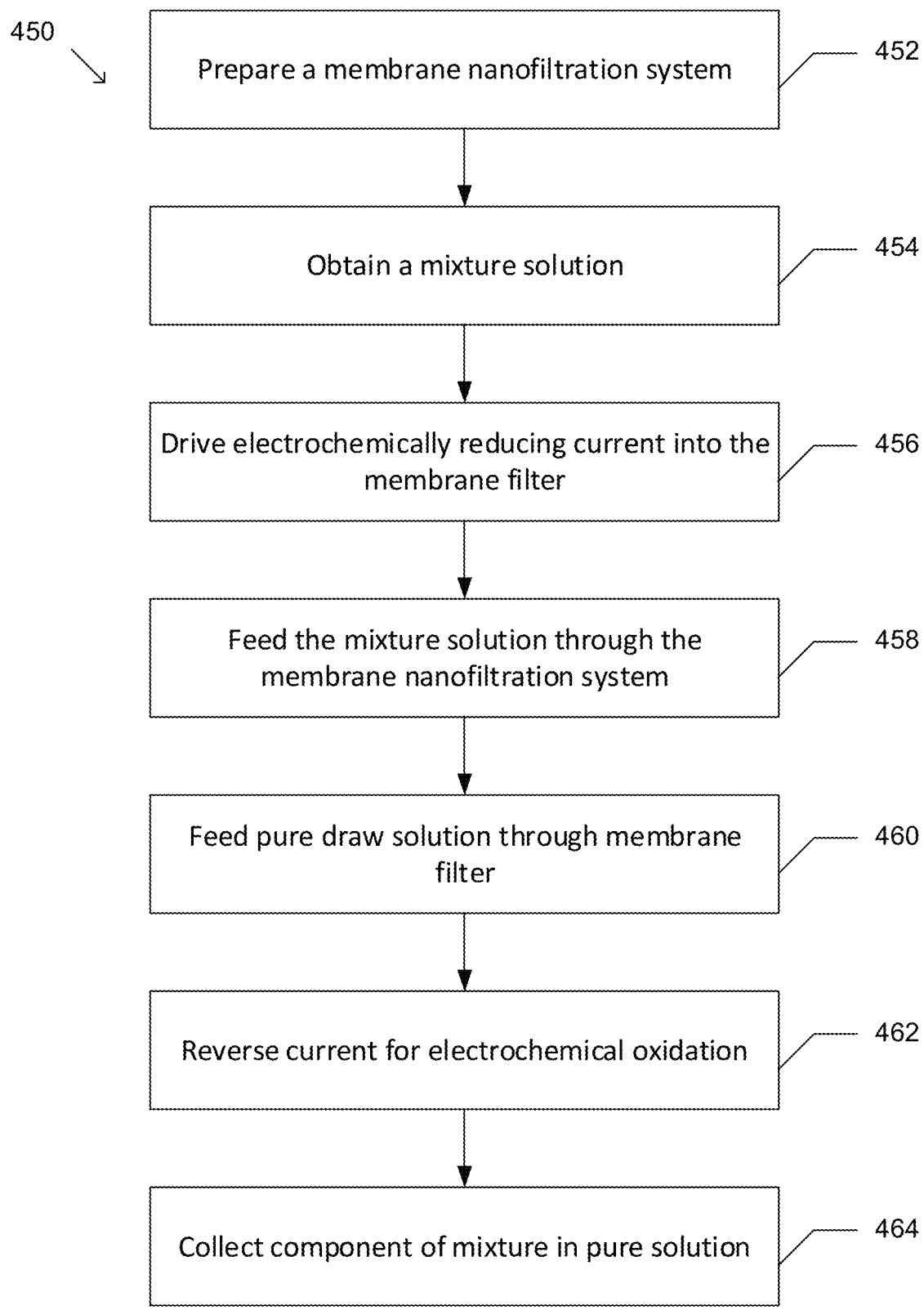
FIG. 9B is a flowchart representation of an alternative example method for electro-extraction.

In other variations, the method may function by generating an electric field at the membrane filter to enable the membrane nanofiltration system to separate components from the mixture solution by charge, as shown in FIGS. 9A and 9B. In an embodiment, the method 400 of FIG. 9A may include: preparing a membrane nanofiltration system 402; obtaining a mixture solution 404; generating an electric field at the membrane filter 406; and feeding the mixture solution through the membrane nanofiltration system 408. In another embodiment, the method 450 of FIG. 9B may include: preparing a membrane nanofiltration system 452; obtaining a mixture solution 454; driving electrochemically reducing a current into the membrane filter 456; feeding the mixture solution through the membrane nanofiltration system 458; feeding a pure draw solution through the membrane filter 460; reversing the current for electrochemical oxidation 462; and collecting a component of the mixture solution in the pure solution 464.

The method may be implemented with the system as described above. Additionally or alternatively, the method may be implemented with any general membrane filtration system, particularly for the extraction of desired materials in a hydrometallurgical process.

Block 402 or 452, which includes preparing a membrane nanofiltration system, functions to enable the desired type of filtration, or filtrations, with the membrane nanofiltration system. Preparing a membrane nanofiltration system 402 or 452 may be dependent on the mixture, desired compound(s) to filter, and desired method of filtration. In some variations, the membrane filter may have been obtained prepared, and so the method may not require block 402 or 452, In some variations, preparing a membrane nanofiltration system 402 or 452 may comprise constructing the membrane nanofiltration system. This may comprise creating the appropriate set of membrane filter, or filters, of the desired size, shape, thickness. Dependent on the type of filtration, constructing the membrane nanofiltration system may additionally include setting the membrane pore size, pore density, charge capacity, conductivity, functional coating chemistry, setting binding sites, etc. In some examples, the membrane filter may be prepared as described in U.S. Pat. Nos. 10,128,341, 10,943,982, or U.S. Pat. No. 11,004,943, the contents of each of which are incorporated herein in their entirety.

Although any general step for constructing the membrane nanofiltration system may be implemented, herein an example for constructing a single body Si-membrane, membrane nanofiltration system is presented. Constructing the Si-membrane may comprise using metal-assisted chemical etching (MACE): obtaining a silicon feedstock (e.g., silicon wafers); depositing metal particles onto the silicon surface (e.g., by using sputtering film deposition); and shaping the silicon feedstock into the Si-membrane (e.g., by chemically etching the silicon feedstock through deposition of the silicon wafers in a chemical etch bath for a period of time).

In some variations, preparing a membrane nanofiltration system 400 may include treating the membrane nanofiltration system. Treating the membrane nanofiltration system may function to improve the functionality. For example, for improved Li/Na separation through a silicon membrane, treating the membrane nanofiltration system may include applying a functional coating. The functional coating may function as a catalyst to electrochemically reduce Lithium to Lithium metal. Lithium reduction or oxidation may be mediated by a voltage applied to the conductive membrane. Once reduced, lithium may diffuse into the silicon lattice, allowing the membrane to act as a reversible lithium sponge. Applying the coating may comprise using atomic layer deposition to apply the coating on nanoscale pore structure, or using an electrochemical deposition technique. Example coatings may include vanadium oxide, titanium oxide, aluminum oxide, and other oxides.

Block 404 or 454, which includes obtaining a mixture solution, functions in obtaining a source material for filtration, wherein the mixture solution includes some desired compound(s) that can be extracted from the mixture and wherein the mixture solution is in the suitable form to use with the membrane nanofiltration system. In some variations, the obtaining a mixture solution 404 or 454 may comprise simply acquiring the mixture (e.g., purchasing, receiving, etc.). In other variations, obtaining a mixture may comprise converting a lithium-ion battery to black mass, and leaching that black mass with a strong acid ($H_2SO_4$ or HCl). An example mixture solution may include black mass components including but not limited to 1-5 wt. % Al, 3-33 wt. % Co, 1-3 wt. % Cu, 0.1-0.3 wt. % Fe, 3.5-4 wt. % Li, 3-11 wt. % Mn, about 35 wt. % graphite, 2-4 wt. % F, and 0.5-1 wt. % P.

For use with the membrane nanofiltration system, the mixture solution may be in the form such that it can be filtered. Dependent on the type of membrane nanofiltration system this may vary. Generally, the mixture may be in some liquid form. In variations where this is not the case, obtaining a mixture solution 404 or 454 may further include converting the mixture solution to a usable form. This will include having the mixture at the appropriate pH and appropriate concentration. The mixture is preferably sufficiently diluted such that it can flow through the membrane nanofiltration system. This may vary significantly dependent on the type of filtration, and mixture content. In one example, approximately 1 kg of black mass powder may be dissolved in approximately 110 kg of sulfuric acid. In another example, approximately 1 kg of black mass powder may be dissolved in approximately 10-20 kg of sulfuric acid. In another example, approximately 1 kg of black mass powder may be dissolved in approximately 20-50 kg of sulfuric acid. In another example, approximately 1 kg of black mass powder may be dissolved in approximately 50-100 kg of sulfuric acid.

Although the pH may vary for each specific implementation, the method may be particularly applicable for use with relatively neutral or low pH (e.g., pH~1-10). In various examples, the pH of the mixture solution may range from −1 to 0, 0 to 5, 0 to 4, 0 to 3, 0 to 1, 0.5 to 5, 0.5 to 4, 0.5 to 3, 0.5 to 2, 0.5 to 1, 0.1 to 5, 0.1 to 4, 0.5 to 3, 0.1 to 2, 0.1 to 1, 1 to 5, 1 to 4, 1 to 3, or 1 to 2. For some variations, the pH may be very acidic. In one acidic example, the pH is approximately 2.0, less than 2.0, or between pH 1.0 and pH 2.0. In another acidic example, the pH is approximately 1.0. In another acidic example the pH is less than 1.0. In one pH<1.0 (e.g., pH~0.1) implementation, the system may be initially implemented with concentrated (98%) sulfuric acid. In some examples, the method may include recycling some of the sulfuric acid. Dependent on desired outcome, the system may be maintained at that pH, or the pH may be raised during activity (e.g., pH may rise to pH~1.0). In other examples, the system may operate at a neutral pH ranging from 6 to 8 or operate at a basic pH ranging from 8 to 14.

Generally, for hydrometallurgical implementations, obtaining a mixture solution 404 or 454 may include digesting solid compounds thereby creating a liquid mixture for filtration. For example, for a battery recycling implementation, obtaining a mixture solution 404 or 454 may include converting the battery into "black mass". This may include: physically pulling apart battery components, grinding the anode and cathode, digesting the ground components using acid, adding neutralizing components, etc.

Block 406 in FIG. 9A includes generating an electric field at a membrane filter in the membrane nanofiltration system. The electric field may be generated orthogonal or perpendicular to the membrane filter. For charge filtration implementations (e.g. electro-filtration), generating an electric field 406 may include generating electric field between the membrane filter and the counter electrode (e.g., through an applying a voltage at the membrane filter via an electrical contact and a counter electrode). A voltage applied to the membrane filter and the counter electrode generates an electric field between them. This electric field may act as a driving force for separating a component from the mixture solution. The electric field strength and/or polarity may be increased, decreased, or even change direction during filtration. For electro-extraction in FIG. 9B, driving electrochemically reducing current into the membrane filter 456 may include electrification of the membrane filter (e.g. the membrane filter is held at a constant electric potential or has a constant current driven through the membrane filter). In some examples, the membrane filter may be held at a constant electric potential or a constant current may flow into the membrane filter. The electrified membrane filter may allow target components to be selectively immobilized within the membrane filter pores via electrochemical reduction or oxidation.

A voltage of 0.1 V to 5 V may be applied to the electrical contact and the counter electrode. In some examples, a voltage of 0.1 V, 0.5 V, 1 V, 1.5 V, 2 V, 2.5 V, 3 V, 3.5 V, 4 V, 4.5 V, or 5 V may be applied to the electrodes to generate the electric field.

In some examples the electric field may be above the top surface of the membrane filter such that the components of the mixture solution have to pass through the electric field before reaching the membrane filter. In this example of electro-filtration (FIG. 9A), some components with higher charges may be retained in the electric filed while other components with lower charges may be capable of passing through the electric field and entering the pores of the membrane filter. In some examples, the membrane filter may be held at a constant potential with little current to apply the electric field.

In other examples, the membrane filter may be charged for an electro-extraction configuration (FIG. 9B). In this configuration, some components may adhere to and be retained within the charged membrane filter while other components may pass through the pores of the membrane filter. In some embodiments, in the electro-extraction configuration, a consistent flow of current at a specific potential may to reduce target component ions.

In other examples, charge may not be applied and the membrane filter may be used to separate components by size or other features of the components without the use of the electric field.

Block 408 or 458, which includes feeding the mixture through the membrane nanofiltration system, functions to implement filtration/separation of the mixture. Block 408 or 458 implementation may be highly dependent on the mixture content, desired compound(s) for filtration, and the type of membrane nanofiltration system that is used. Driving the mixture through the membrane nanofiltration system 408 may comprise either passive (e.g., simple diffusion, or directed diffusion, such as by a concentration gradient) or active driving (e.g., pumps generating flow). In active driving variations, driving the mixture may comprise setting a flow rate (e.g., solution [volume] flow rate or a material [mass] flow rate). In a solution flow rate variation, the solution flow rate through the membrane may be between 0.1-200 [L/(m$^2$ hr)]. In some implementations, the solution flow rate may be lower or greater. In a material flow rate variation, the material flow rate may be between 1.0-1000 [g/(m$^2$ hr)]. In some variations, the material flow rate may be lower or greater.

In some variations, feeding the mixture may include multiple stages. Feeding the mixture solution may be used in combination with the electric field to control the separation of components from the mixture solution. In one example implementation, wherein the Lithium (Li) is filtered through a silicon (Si) based membrane nanofiltration system, an initial driving charge force is initiated to enable Li to pass through the pores in the Si membrane filter while simultaneously attracting other components of the mixture solution to the surface of the Si membrane filter. Once the permeate solution with Li has passed through, the feed will be switched to a pure draw solution (water or sulfuric acid) and the polarity of the membrane filter may change, thus releasing the other components. The components may then diffuse off of the membrane filter and be collected by a pure draw solution (water, pure acid, or dilute acid), or another flow (e.g., a pump) may drive the components out to be collected. In other embodiments, Li may be the component to be retained by the membrane filter and the other components may pass through the membrane filter.

For active filtration type implementations of the method, feeding the mixture solution may include uni-directional flows, wherein the mixture solution is driven through or across the membrane filter. This may not generally be the case for saturation filtration. For saturation filtration, passive forces (e.g., simple or directed diffusion) may be more commonly implemented such as concentration gradients, pH gradients, charge gradients. Generally, active filtration and saturation filtration may incorporate unidirectional, multi-directional, or non-biased diffusion as desired.

In some variations, the mixture solution is not fed through the membrane filter but is instead fed along or only partially against it. That is, the mixture solution may be fed parallel, adjacent to the membrane, or partially askew, such that the mixture is fed against and along the membrane filter. In these "cross-flow" variations, components of the mixture that are capable of crossing the membrane may do so, while the mixture solution itself, containing components that cannot pass the membrane, continue out. Cross-flow variations may implement passive and/or active transport. For purely passive implementations, the membrane nanofiltration system may be pre-saturated with solution, and a counter-flow of draw solution on the permeate side of the membrane may be used to sustain a concentration gradient.

Generally, feeding the mixture 408 or 458 may include any type of driving forces as desired and applicable to the implementation. As mentioned previously, feeding the mixture 408 or 458 may be, at least somewhat, filtration type dependent. For certain types of filtration, some preferred methods for feeding the mixture solution 408 or 458 may exist. For example, feeding the mixture solution 408 or 458 may include generating pH or concentration gradient drive, or pressure driven flows. For membrane interaction (e.g., selective absorption, adsorption, or ion exchange) filtration, feeding the mixture solution 408 or 458 may include chemically driving the flows. In one implementation, for Li interaction with a Si membrane, a Redox reaction may be initiated to drive the flow by improving Li—Si interaction, whereby Li is reduced at the pore wall and absorbed into the bulk Si lattice.

For variations that require the filtration membrane to first be saturated with liquid prior to the separation process, the method may include saturating the membrane nanofiltration system with the mixture. Saturating the membrane nanofiltration system with the mixture functions to set up the saturation filtration process. Saturating the membrane nanofiltration system with the mixture solution, may include allowing the membrane nanofiltration system sit in the mixture or pure solvent (water or pure acid solution) for some allotted time. In another example, pure solvent (water or pure acid solution) is actively driven through the membrane (e.g., via pressure-driven flow) until the membrane is saturated. In another example, in the case where the small pore size within the membrane prevents direct saturation with aqueous solutions due to surface tension, a sequential approach may be used whereby low surface tension organic solvents or supercritical $CO_2$ are used to first saturate the pore structure and are then replaced with pure aqueous solvent. Dependent on implementation, the mixture solution may be heated, mixed, or agitated in some way to improve saturation. An example is the saturation of the membrane with water vapor at temperatures above the boiling point of water, possibly driven into the membrane under pressure, followed by a lowering of temperature to promote precipitation of pure water within the pore structure of the membrane. In some variations, where the membrane nanofiltration system reacts with compounds within the mixture, a charge may be run through the solution to also facilitate membrane saturation.

FIG. 9B further includes feeding a pure draw solution through the membrane filter 460; reversing the current driven into the membrane filter for electrochemical oxidation 462; and collecting a component of the mixture solution in the pure draw solution 464. For example, one or more components retained in the membrane filter may be leached into a pure product stream by the pure draw stream after the current is reversed. In some examples, the pure draw solution includes but is not limited to water or sulfuric acid. The pure draw solution may have a volume that is 1% to 5%, 5% to 10%, 10% to 20%, 20% to 30%, 30% to 40%, or 40% to 50% of the mixture solution volume. This reduced volume of pure draw solution may result in generating a concentrated pure product stream (e.g. a concentration solution of one or more components of the mixture solution).

Figure 10:
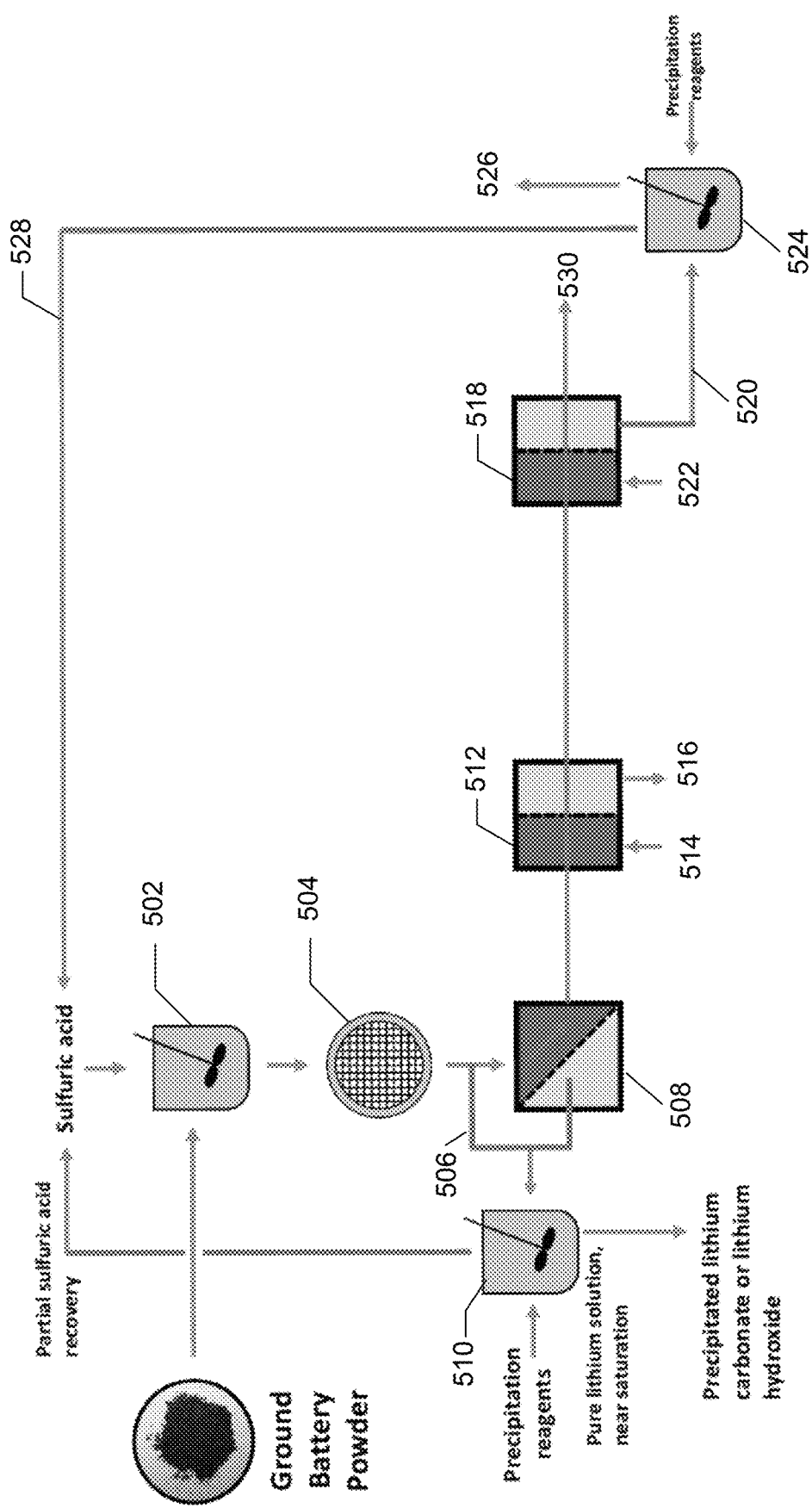
FIG. 10 is a process flowchart of another example method.

FIG. 10 shows an example multi-step process 500 for hydrometallurgical separation from a mixture solution via membrane nanofiltration that includes recycling. The process 500 may utilize multiple membrane filtration modules in various combinations. The membrane filtration modules may utilize electro-filtration, electro-extraction, or combinations thereof.

In this process 500, ground battery powder may be combined with sulfuric acid to obtain the mixture solution 502. The mixture solution is then filtered through a mesh for coarse filtration 504 to remove any solids from the mixture solution. The mixture solution may then enter a concentration loop 506, where the mixture solution may enter an electro-filtration module 508 that contains a lithium permeable membrane. The permeate solution from the electro-filtration module 508 contains lithium that has passed through the membrane filter. The permeate solution may then be mixed with precipitation reagents to precipitate lithium carbonate or lithium hydroxide 510. At least a portion of sulfuric acid remaining after precipitation may be recycled back 511 to the beginning of the process.

The remaining mixture solution not passing through the membrane filter in the electro-filtration module enters one or more electro-extraction module(s) 512 to remove other components of the remaining mixture solution. The electro-extraction module(s) 512 remove any metals that may plate/adhere to the membrane filter by collecting a second permeate solution 514 containing non-plated/non-adhered metals. The components in the second permeate solution may then be purified. Plated metals on the membrane filter may be periodically removed into a draw solution (water or sulfuric acid) 516 after reversing the polarity of the electric field, possibly at a concentration as high as their saturation point in solution. For example, the electro-extraction module(s) may remove any metals that plate below the potential of cobalt and nickel (iron, copper, etc.). In another example, a cascade of electro-extraction modules may be used to separate the mixture into multiple pure draw solutions, where the first contains lower-value Fe, Mn, and Cu, the second contains Co and Ni, and the third contains Li and Al. A pure stream of Li may then be separated via electro-filtration.

The retentate solution (containing the components not removed in the electro-extraction module(s)) may then pass through an additional electro-extraction module 518 configured to remove remaining components from the retentate solution. For example, the additional electro-extraction module may be configured to remove cobalt and nickel and exit the additional electro-extraction module in a third permeate solution 520. Similar to the other electro-extraction module(s), a draw solution may be passed through 522 the electro-extraction module after reversing the polarity of the electric field to periodically remove plated metals. The permeate solution 520 exiting the additional electro-extraction module may then be mixed 524 with precipitation reagents to precipitate out 526 the components in the second permeate solution. For example, cobalt sulfate and nickel sulfate may be precipitated out of the solution. Sulfuric acid remaining after the precipitation may be recycled back 528 to the start of the process. Any remaining mixture solution may exit the system as waste 530.

Figure 11:
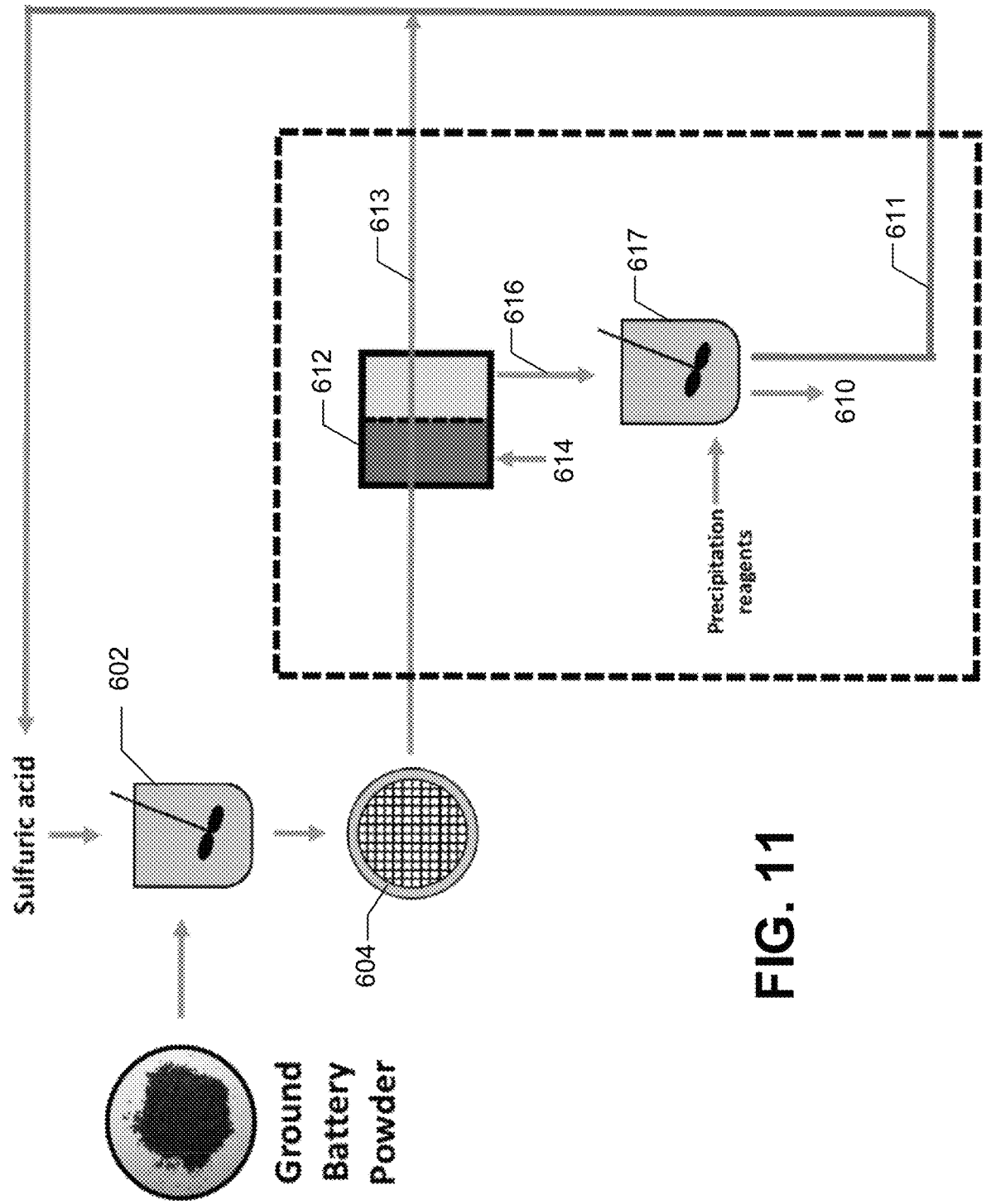
FIG. 11 is a process flowchart of an additional example method.

FIG. 11 shows an example process 600 for electrically conductive membrane filter separation from a mixture solution via membrane nanofiltration that includes recycling. In this process 600, ground battery powder may be combined with sulfuric acid to obtain the mixture solution 602. The mixture solution is then filtered through a mesh for coarse filtration 604 to remove any solids from the mixture solution. The mixture solution may then enter an electro-extraction module 612. The permeate solution of the electro-extraction module 612 contains a component (e.g. desired metal to be extracted) that has passed through the membrane filter. The permeate solution 516 may be a pure solution of the extracted metal, near saturation. The permeate solution may then be mixed 617 with precipitation reagents to precipitate a pure solid product 610. At least a portion of sulfuric acid remaining after precipitation may be recycled back 611 to the beginning of the process. Plated metals on the membrane filter may be periodically removed into a draw solution (water or sulfuric acid) 614 after reversing the polarity of the electric field. Any remaining mixture solution may be recycled back to the beginning of the process 513.

Preparation of Silicon-Based Electrodes

The membranes/electrodes produced by any of the disclosed methods may be used in any of the separation methods disclosed herein.

In some embodiments, the membrane filter may have a nanoporous structure formed using metal-assisted chemical etching (MACE), for example as described herein above and in U.S. Pat. No. 10,943,982, which has been incorporated herein in its entirety.

Figure 13:
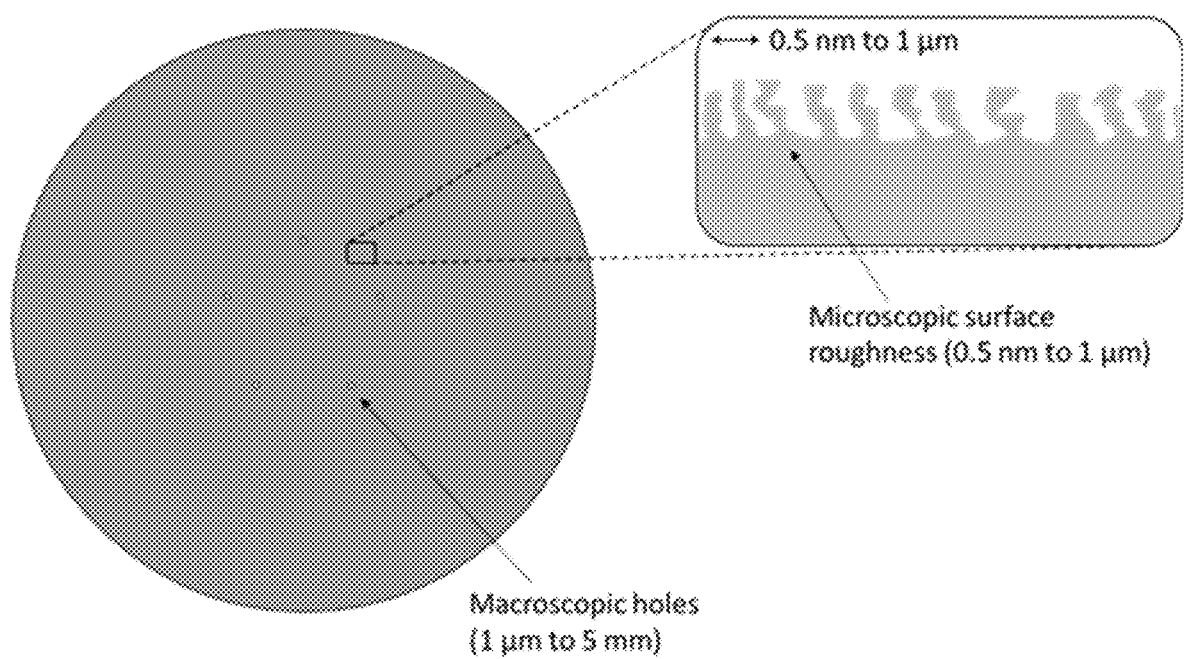
FIG. 13 shows an example disk with macroscopic holes and microscopic surface roughness.

In an embodiment, the membrane filter may be macroscopically porous and microscopically roughened for metal and mineral extraction and recovery. The membrane filter may have a plurality of macroscopic holes and a microscopic surface roughness, as seen in FIG. 13.

Figure 14:
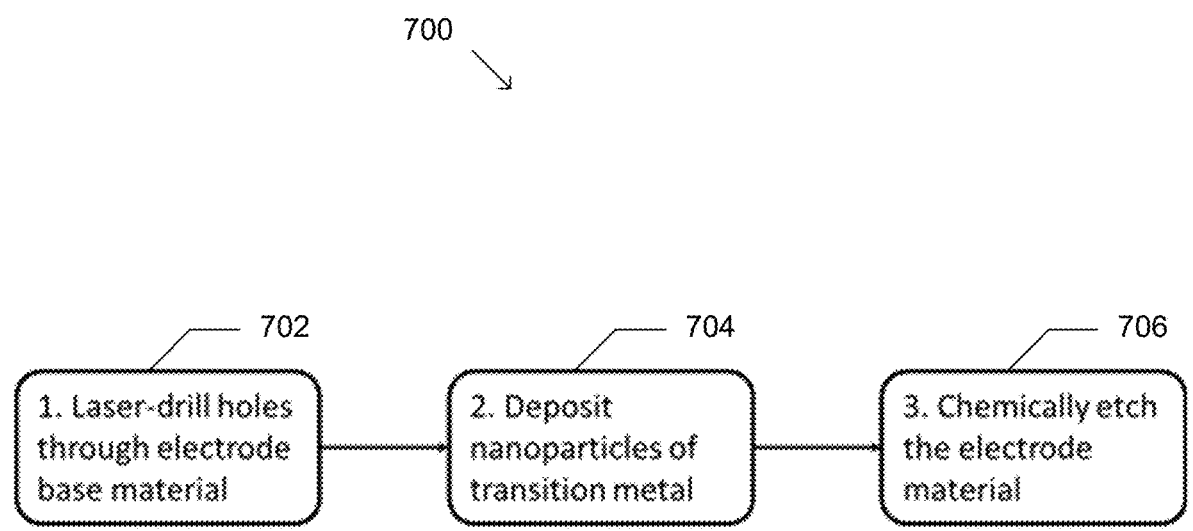
FIG. 14 shows an example process flow diagram for the manufacture of electrodes with macroscopic holes and microscopic surface roughness.

In this embodiment, silicon-based electrodes/membrane filters may be prepared for use for the extraction of minerals and metals from an acidic solution. FIG. 14 provides an example process flow diagram for a method 700 of manufacturing a membrane filter/electrode with macroscopic holes and microscopic surface roughness. This process produces electrodes with enhanced surface area (roughness) and macropores that are resistant to clogging, which allows for the flow of electrolyte through the electrodes in an assembly.

First, at step 702, the silicon base material may be loaded into a laser engraver/cutter, which is used to cut through the silicon and produce a product with the desired size, shape, number, and density of holes/pores.

In some examples, the silicon used for the electrodes may have 0.0001 to 100 ohm-cm resistivity, may be N-type doped with P or As, and/or may be P-type doped with B. The silicon may be in the form of wafers or plates and have a thickness of about 10 µm to 5 mm, about 10 µm to 50 µm, about 50 µm to 100 µm, about 100 µm to 500 µm, about 500 µm to 1 mm, about 1 mm to 2 mm, about 2 mm to 3 mm, about 3 mm to 4 mm, or about 4 mm to 5 mm.

In some examples, a fiber-laser cutter used to cut the holes/pores in the silicon may have a wavelength of about 1064 nm wavelength at about 1 W to 200 W In some aspects, the laser may be used in continuous exposure. In other aspects, the laser may be used in pulsed exposure with 1 fs to 500 ns pulses.

This laser cutting may result in macroscopic holes/pores in the silicon that have a diameter ranging from about 1 µm to about 10 mm, about 1 µm to about 100 µm, about 100 µm to about 500 µm, about 500 µm to about 1 mm, about 1 mm to about 2 mm, about 2 mm to about 3 mm, about 3 mm to about 4 mm, or about 4 mm to about 5 mm.

Next, at step 704, transition or noble metal nanoparticles may be deposited on the surface of the macroscopically-porous silicon. For example, Au, Ag, or Pt nanoparticles may be used as a catalyst. Finally, at step 706, the material may be chemically etched for a desired period of time to roughen the surface that contains the metal nanoparticles.

In some examples, the method may include using Metal-Assisted Chemical Etching (MACE) to deposit the nanoparticles and chemically etch the electrode/membrane. For example, the method may include the sputter deposition of metals including, but not limited to Ag, Au, or Pt. The sputter deposition may be performed using a power ranging from about 5 W to 200 W, a base pressure ranging from about 1 mTorr to 500 mTorr, and/or a time of exposure ranging from about 1 s to 60 s. Then chemical etchant baths may be used to chemically etch the electrode material. The chemical etchant baths may include HF, $H_2O_2$, $HNO_3$, and combinations thereof within $H_2O$, where the summed concentrations are between about 0.1 mol/L and 20 mol/L. The contact time of the electrode with the solution of the chemical etchant bath may range from about 1 s to 72 h.

In some examples, the resulting microscopic surface roughness may have a length or width of about 0.5 nm to 1 µm, about 0.5 nm to 5 nm, 5 nm to 10 nm, 10 nm to 50 nm, 50 nm to 100 nm, 100 nm to 500 nm, or 500 nm to 1 µm.

Figure 15A:
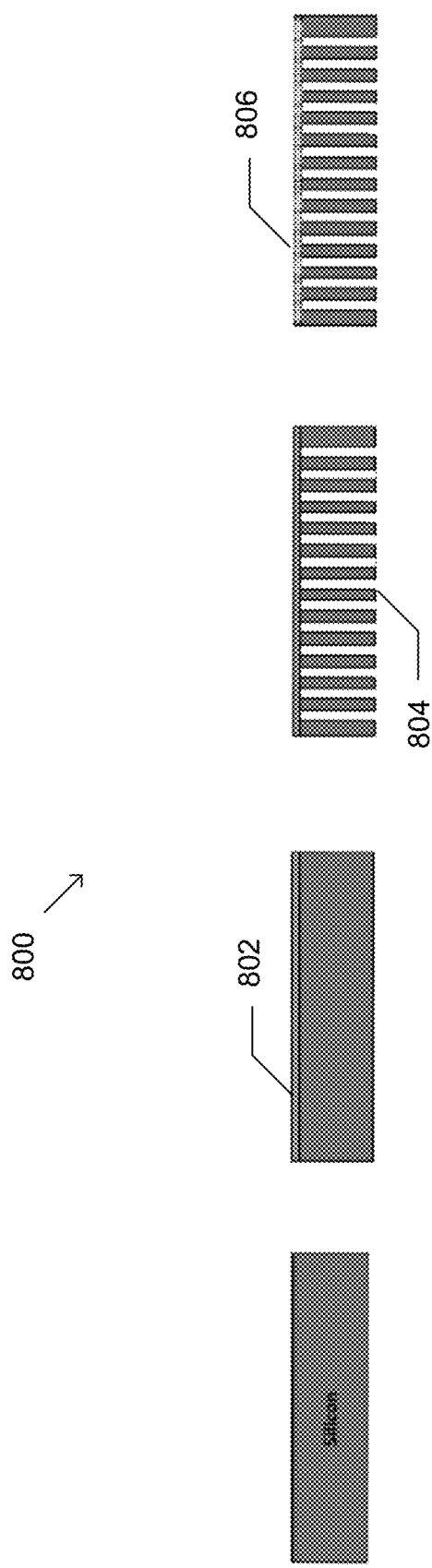
FIG. 15A and FIG. 15B show an example process of preparing membranes for electrofiltration using a PECVD layer.

In another embodiment, the membrane filter may be prepared using plasma-enhanced chemical vapor deposition (PECVD). FIG. 15A shows an example of a process for forming a two-layer silicon membrane via PECVD. This approach targets a composite membrane structure with a thin layer of very small pores directly interfacing with a thick layer with large pores acting as structural support. It leverages different etching behavior of different silicon layers in multiple etching steps. In some examples, method 800 may include depositing a thin layer of silicon on top of a silicon wafer at step 802. In some examples, the thin silicon layer may consist entirely or be some combination of crystalline silicon, amorphous silicon, or polycrystalline silicon. In some examples, the resulting silicon layer may be within the range of about 1 nm to 5 µm, about 1 nm to 50 nm, about 50 nm to 100 nm, about 100 nm to 500 nm, about 500 nm to 1 µm, about 1 µm to 2 µm, about 2 µm to 3 µm, about 3 µm to 4 µm, or about 4 µm to 5 µm in thickness. At step 804, the method may include aggressively etching from the opposite surface, where the deposited layer acts as an etch-stop. As used herein, aggressive etching may refer to etching times greater than 1 hr, about 1 hr to 72 hrs, about 1 hr to 6 hrs, about 6 hrs to 12 hrs, about 12 hrs to 24 hrs, about 24 hrs to 30 hrs, about 30 hrs to 36 hrs, about 36 hrs to 42 hrs, about 42 hrs to 48 hrs, or about 48 hrs to 72 hrs. In additional examples, aggressive etching may use elevated concentrations of hydrofluoric acid and/or hydrogen peroxide in the etching solution. At step 806, the method may include fine etching through the deposited silicon layer to create a small pore layer. In some examples, fine etching may refer to etching times less than about 1 hr, less than 30 min, less than 15 min, or less than 1 min. Any of the methods described below may be used for both steps 804 and 806.

Figure 15B:
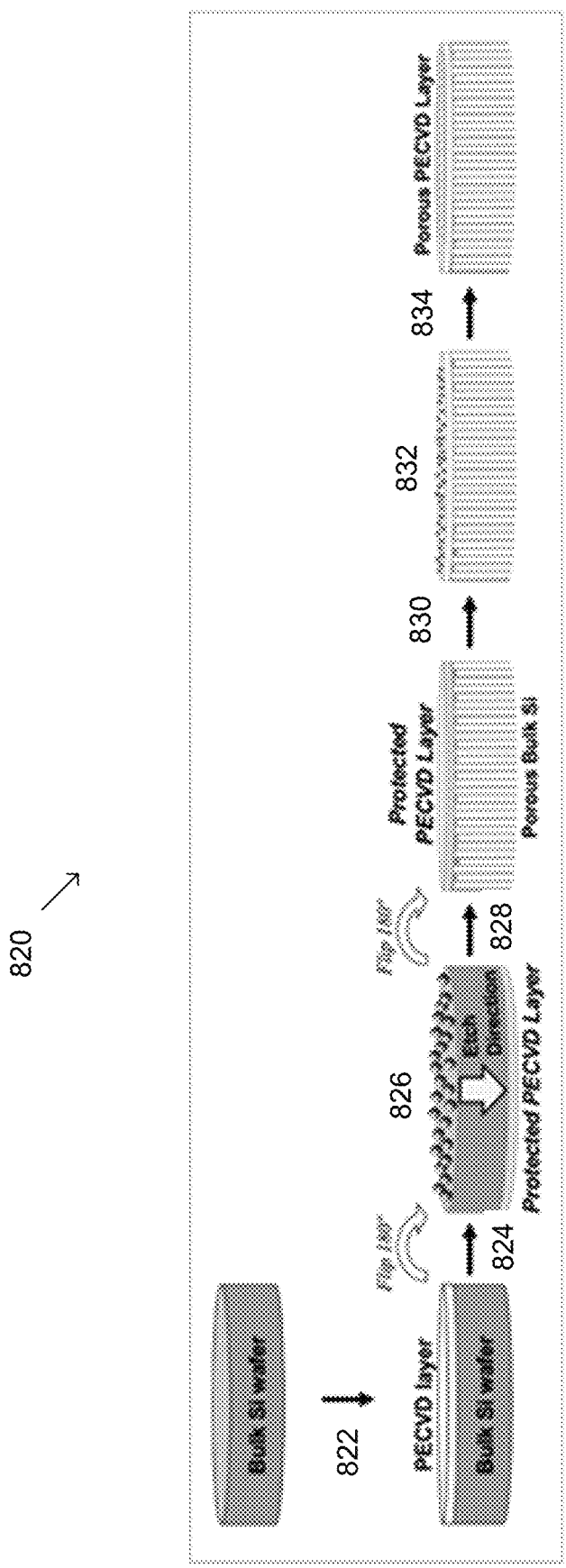

FIG. 15B is another example of a process using PECVD. This method leverages non-intuitive properties of an added PECVD layer to both block MACE in the first etch stage, then enable MACE in the second etch stage with a different etch solution chemistry, forming a two-layer silicon structure that combines mechanical stability, high liquid flux, and fine filtration capability.

FIG. 15B illustrates the example method 820 using PECVD with MACE to produce a membrane/electrode with a porous PECVD silicon layer. Prior to starting, the surface of the silicon wafers may be prepared. In some examples, silicon wafers of about 200 µm to 4 mm in thickness may be placed in a bath of hydrofluoric acid (HF) and deionized (D.I.) water. The wafers may then be rinsed with D.I. water and subsequently dried using nitrogen ($N_2$) gas. The cleaned wafers may then be immediately placed into a PECVD chamber, which is evacuated prior to deposition.

At step 822, a PECVD layer may be deposited on a surface of the silicon wafer. In some examples, a layer of polycrystalline or amorphous silicon may be deposited via plasma-enhanced chemical vapor deposition using a high frequency shower head (e.g. 13.56 MHz). Power may be maintained at about 60 W to 120 W, about 60 W to 80 W, about 80 W to 100 W, or about 100 W to 120 W Process deposition pressure may be maintained in the range of about 200 mTorr or less. Stage and shower head temperatures may be maintained at about 150 to 300 Celsius. Deposition rate overall may be approximately 300 Å/min or less. Gas flow rates may be controlled by mass flow controllers and maintained at setpoint ranges of about 20 to 250 sccm, about 20 sccm to 50 sccm, about 50 sccm to 100 sccm, about 100 sccm to 150 sccm, about 150 sccm to 200 sccm, or about 200 sccm to 250 sccm during the silicon deposition for doped silicon, silane ($SiH_4$) and dopant phosphene ($PH_3$) or diborane ($B_2H_6$).

In some examples, the resulting silicon layer may be within the range of about 1 nm to 5 µm, about 1 nm to 50 nm, about 50 nm to 100 nm, about 100 nm to 500 nm, about 500 nm to 1 µm, about 1 µm to 2 µm, about 2 µm to 3 µm, about 3 µm to 4 µm, or about 4 µm to 5 µm in thickness.

At step 824, the PECVD layer may be protected. For protection during the MACE process, a layer of etch protectant (e.g. AllResist) may be added on top of the PECVD silicon layer by spin coating and subsequent annealing on a hot plate at about 80° C. to 150° C.

At step 826, the method may include sputtering of catalyst nanoparticles. After the PECVD silicon layer is coated for protection, the silicon wafer may be flipped 180°. The wafers may then be sputtered on the side of the bulk silicon with metal nanoparticles, including but not limited to one of the following: silver (Ag), gold (Au), platinum (Pt), or nickel (Ni). In some examples, the base pressure in the PECVD chamber may be at about $6\times10^{-4}$ Torr. Argon (Ar) gas may be introduced into the PECVD chamber after approximately 5 minutes of vacuum pump-down, then increased from about 5 sccm to 12 sccm, about 5 sccm to 8 sccm, about 7 sccm to 10 sccm, or about 9 sccm to 12 sccm before power is supplied to the sputter target. During sputtering, the chamber pressure may be maintained at about 5 mTorr to 30 mTorr. Power applied to the sputter target may range from about 20 W to 120 W, about 20 W to 40 W, about 40 W to 60 W, about 60 W to 80 W, about 80 W to 100 W, about 100 W to 120 W, or about 120 W to 300 W In some examples, sputter deposition times may range from about 1 s to 30 s, about 1 s to 5 s, about 5 s to 10 s, about 10 s to 20 s, about 20 s to 30 s, or about 30 s to 300 s.

At step 828, the method may include etching the bulk silicon. In some examples, the chemical etch baths may include D.I. water, HF, and hydrogen peroxide ($H_2O_2$) at room temperature. The sum of the concentrations of HF and $H_2O_2$ may range from about 1 mol/L to 20 mol/L, about 1 mol/L to 5 mol/L, about 5 mol/L to 10 mol/L, about 10 mol/L to 15 mol/L, or about 15 mol/L to 20 mol/L. The rho value of the etch bath (concentration of HF divided by the concentration of HF+$H_2O_2$) may range from about 20% to 50%, 50% to 80%, 80% to 99%, about 80% to 85%, about 85% to 90%, about 90% to 95%, or about 95% to 99%. Etch times may be decided based on rho and wafer thickness. In some examples, etch times for bulk silicon etching range from about 1 hr to 5 hrs, 5 hrs to 10 hrs, 10 hrs to 16 hrs, 16 hrs to 72 hrs, about 16 hrs to 20 hrs, about 20 hrs to 30 hrs, about 30 hrs to 40 hrs, about 40 hrs to 50 hrs, about 50 hrs to 60 hrs, or about 60 hrs to 72 hrs. In some examples, after the etching, the silicon wafer may again be flipped 180° and etched a second time from the opposite surface.

At step 830, the method may further include removing the protective layer. In some examples, the layer of etch protectant may be removed by soaking it in butane solvent for up to 60 seconds. The wafer may then be rinsed with isopropanol, and then blow-dried with $N_2$ gas.

At step 832, the method may further include catalyst particle deposition. Metal catalyst nanoparticles may be sputtered onto the PECVD silicon layer using the process described in step 806.

At step 834, the method may then include etching the PECVD layer. The PECVD layer may be etched using the process described in step 838. Etch times and rho may be adjusted for layer thickness and to accommodate the difference in etching between crystalline (bulk) silicon and the PECVD silicon layer, which is amorphous or polycrystalline. For this step, rho may be about 20% to 50%, 50% to 80%, 80% to 99%, about 80% to 85%, about 85% to 90%, about 90% to 95%, or about 95% to 99%. Etch times may range from about 30 s to 4 hrs, about 30 s to 1 min, about 1 min to 15 min, about 15 min to 30 min, about 30 min to 1 hr, about 1 hr to 2 hrs, about 2 hrs to 3 hrs, or about 3 hrs to 4 hrs.

In an additional embodiment, the membrane/electrode may be produced using deep reactive ion etching (DRIE) methods to create hierarchical porosity for the silicon membranes. In this embodiment, the final structure of the membrane is monolithic from the same initial sheet of material. It was unexpected that this method allows for membranes to be produced using very conductive silicon (0.001 ohm·cm and below), which is not possible by just using MACE. This is because the chemical etching cannot penetrate deeply into highly conductive silicon, but it can penetrate a shallow depth to reach the channels produced by reactive ion etching from the opposite surface of the silicon substrate. In some examples, the range of silicon resistivities for both the wafer and optional PECVD layer may be about 0.0001 ohm-cm to 100 ohm-cm, about 0.0001 ohm-cm to 0.001 ohm-cm, about 0.001 ohm-cm to 0.01 ohm-cm, about 0.01 ohm-cm to 0.1 ohm-cm, about 0.1 ohm-cm to 1 ohm-cm, about 1 ohm-cm to 10 ohm-cm, about 10 ohm-cm to 50 ohm-cm, or about 50 ohm-cm to 100 ohm-cm.

The methods described herein convert monolithic silicon (Si) into a hierarchical structure consisting of large voids with suspended silicon membrane sections, where these sections include nanoporous Si. This enables a monolithic support and selective membrane layer, where, unlike previous embodiments, the selective silicon porous layer may be on the order of about 0.1 µm to 10 µm, about 0.1 µm to 1 µm, about 1 µm to 3 µm, about 2 µm to 4 µm, about 3 µm to 5 µm, about 4 µm to 6 µm, about 5 µm to 7 µm, about 6 µm to 8 µm, about 7 µm to 9 µm, or about 8 µm to 10 µm while being supported contiguously by thick and mechanically-stable silicon structures. Whereas MACE can be used to generate through pores on the order of about 1 nm to 50 nm in diameter with relatively short MACE times.

Figure 16A:
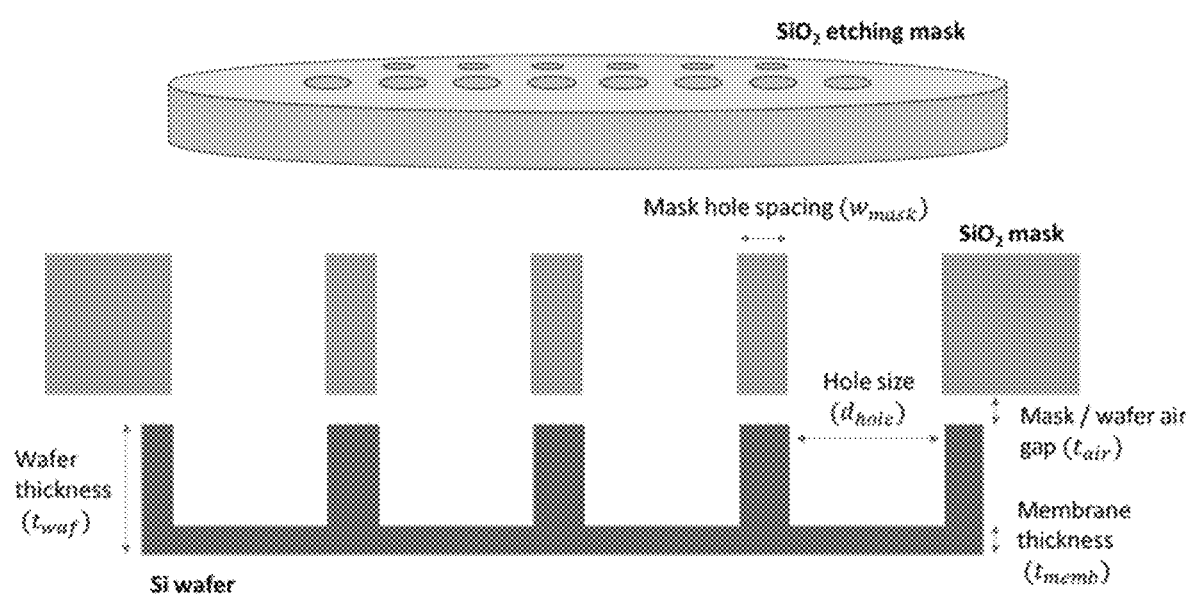
FIG. 16A shows an example dry etching technique, where an $SiO_2$ mask is used for the Bosch process in a DRIE.

The present embodiment may include the use of an $SiO_2$ shadow mask (e.g. made from either quartz or fused silica) for deep-reactive ion etching, which may obviate the use of photolithography on the Si structure, thereby improving scalability via reusability of the mask structure. In other examples, the shadow mask may be made using photolithography. Such a mask, or the Si structure itself, can be fabricated through pulsed-laser cutting (i.e. via a fiber laser, or femtosecond laser) to generate features on the order of about 0.01 mm to 10 mm, about 0.01 mm to 0.1 mm, about 0.1 mm to 1 mm, about 1 mm to 3 mm, about 2 mm to 4 mm, about 4 mm to 6 mm, about 6 mm to 8 mm, or about 8 mm to 10 mm. Alternatively, the $SiO_2$ mask can be prepared using photolithographic patterning with dry plasma etching. For the DRIE process to etch silicon, a conventional Bosch process (i.e. SF6 and C4F8) process may be used to perform a fast, anisotropic etch at rates ranging from about 1 µm/min to 30 µm/min, about 1 µm/min to 5 µm/min, about 5 µm/min to 10 µm/min, about 10 µm/min to 20 µm/min, or about 20 µm/min to 30 µm/min. FIG. 16A shows an example dry etching technique, where an $SiO_2$ mask is used for the Bosch process in a DRIE. The gap between the mask and the silicon wafer may range from about 0 µm to 1 mm, about 1 µm to 1 mm, about 1 µm to about 10 µm, about 10 µm to 50 µm, about 50 µm to 100 µm, about 100 µm to 500 µm, or about 500 µm to 1 mm In some aspects, the resulting silicon voids/holes may have a size ($d_{hole}$) ranging from about 0.1 mm to 10 mm, about 0.1 mm to 1 mm, about 1 mm to 5 mm, or about 5 mm to 10 mm. The membrane area ratio (i.e. ratio of DRIE or laser-etched membrane versus total wafer area) may range from about 1% to 99%, about 1% to 10%, about 10% to 20%, about 20% to 30%, about 30% to 40%, about 40% to 50%, about 50% to 60%, about 60% to 70%, about 70% to 80%, about 80% to 90%, or about 90% to 99%. In some examples, the membrane section thickness ($t_{memb}$) may range from about 0.01 µm to 50 µm, about 0.01 µm to 0.1 µm, about 0.1 µm to 1 µm, about 1 µm to 10 µm, about 10 µm to 20 µm, about 20 µm to 30 µm, about 30 µm to 40 µm, or about 40 µm to 50 µm.

One or more steps of methods 800 or 820 described herein above may be used in this embodiment. For example, additional layers deposited through PECVD may be deployed on the selective membrane layer. These may be included in the membrane thickness value, where high resistivity Si (lightly doped) can be deposited on top of the membrane support side to improve MACE etching anisotropy. The process for deposition of a PECVD layer may generally follow steps 802/822 and 806/826. DRIE or Laser etched wafers may be placed in a bath of hydrofluoric acid (HF) and deionized (D.I.) water. The wafers may then be rinsed with D.I. water and subsequently dried using nitrogen ($N_2$) gas. The cleaned wafers may then be immediately placed into the PECVD chamber, which is evacuated prior to deposition.

A layer of polycrystalline or amorphous silicon may be deposited via plasma-enhanced chemical vapor deposition using a high frequency shower head (e.g. 13.56 MHz). Power may be maintained at about 60 W to 120 W, about 60 W to 80 W, about 80 W to 100 W, or about 100 W to 120 W Process deposition pressure may be maintained in the range of 200 mTorr or less. Stage and shower head temperatures are maintained at about 150 to 300 Celsius. Deposition rate overall may be approximately 300 Å/min or less. Gas flow rates may be controlled by mass flow controllers and maintained at the following setpoint ranges of about 20 sccm to 250 sccm, about 20 sccm to 50 sccm, about 50 sccm to 100 sccm, about 100 sccm to 150 sccm, about 150 sccm to 200 sccm, or about 200 sccm to 250 sccm during the silicon deposition for doped silicon, silane ($SiH_4$) and dopant phosphene ($PH_3$) or diborane ($B_2H_6$).

In some examples, the resulting silicon layer may be within the range of about 1 nm to 5 µm, about 1 nm to 50 nm, about 50 nm to 100 nm, about 100 nm to 500 nm, about 500 nm to 1µ, about 1 µm to 2 µm, about 2 µm to 3 µm, about 3 µm to 4 µm, or about 4 µm to 5 µm in thickness.

Figure 16B:
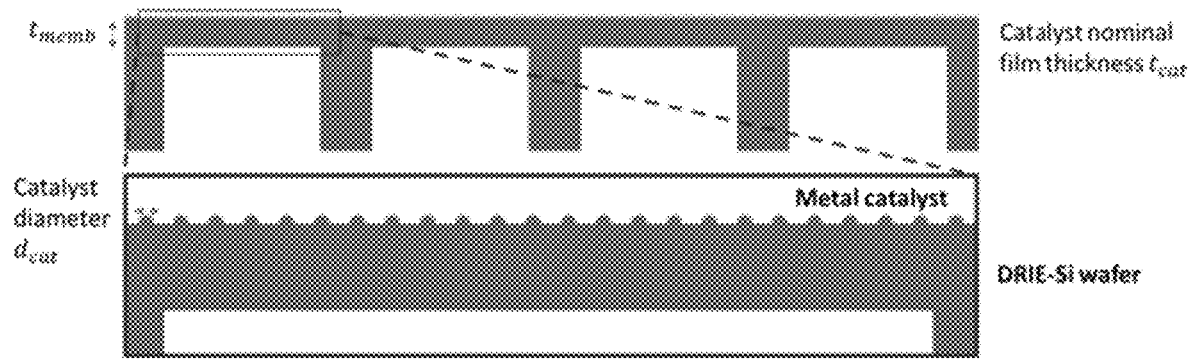
FIG. 16B illustrates a flipped wafer, showing a cross-section of the morphology of a membrane. The flat membrane side may be covered with sputtered catalysts.
Figure 16C:
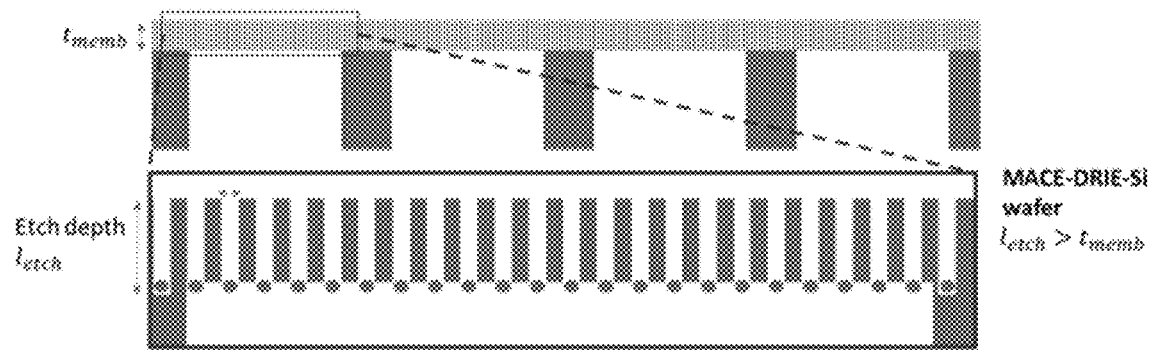
FIG. 16C shows a schematic of wafer after MACE process, showing etch depth exceeding the thickness of the membrane, where the final structure is a selective porous layer supported by thick Si structures contiguously.

Once prepared, the membrane may be flipped 180°, such that the pristine side of the Si wafer may be prepared using MACE, as seen in FIGS. 16B and 16C. For example, the Si wafers may then be sputtered with metal catalyst nanoparticles including but not limited to one of the following: silver (Ag), gold (Au), platinum (Pt), nickel (Ni). In some examples, these catalyst metal nanoparticles may range in size ($d_{cat}$) from about 1 nm to 20 nm, about 1 nm to 5 nm, about 5 nm to 10 nm, about 10 nm to 15 nm, or about 15 nm to 20 nm. In some examples, the base pressure may be at about $6 \times 10^{-4}$ Torr. Argon (Ar) gas may be introduced into the chamber after approximately 5 minutes of vacuum pump-down, then increased from about 5 to 12 sccm, about 5 sccm to 8 sccm, about 7 sccm to 10 sccm, or about 9 sccm to 12 sccm before power is supplied to the sputter target. During sputtering, chamber pressure is maintained at about 5 mTorr to 30 mTorr, about 5 mTorr to 10 mTorr, about 10 mTorr to 15 mTorr, about 15 mTorr to 20 mTorr, about 20 mTorr to 25 mTorr, or about 25 mTorr to 30 mTorr. Power applied to the sputter target may range from about 20 W to 120 W, about 20 W to 40 W, about 40 W to 60 W, about 60 W to 80 W, about 80 W to 100 W, about 100 W to 120 W, or about 120 W to 300 W In some examples, sputter deposition times may range from about 1 s to 30 s, about 1 s to 5 s, about 5 s to 10 s, about 10 s to 20 s, about 20 s to 30 s, or about 30 s to 300 s.

In some examples, the chemical etch baths may include D.I. water, HF, and hydrogen peroxide ($H_2O_2$) at room temperature. The sum of the concentrations of HF and $H_2O_2$ may range from about 1 mol/L to 20 mol/L, about 1 mol/L to 5 mol/L, about 5 mol/L to 10 mol/L, about 10 mol/L to 15 mol/L, or about 15 mol/L to 20 mol/L. The rho value of the etch bath (concentration of HF divided by the concentration of HF+$H_2O_2$) may range from about 20% to 50%, 50% to 80%, about 80% to 99%, about 80% to 85%, about 85% to 90%, about 90% to 95%, or about 95% to 99%. Etch times may be decided based on rho and wafer thickness. In some examples, etch times for bulk silicon etching range from about 30 s to 4 hrs, about 30 s to 1 min, about 1 min to 30 min, about 30 min to 1 hr, about 1 hr to 2 hrs, about 2 hrs to 3 hrs, or about 3 hrs to 4 hrs.

In some examples, the etch depth ($l_{etch}$) may be the same or greater than the membrane section thickness ($t_{memb}$) may range from about 0.01 µm to 50 µm, about 0.01 µm to 0.1 µm, about 0.1 µm to 1 µm, about 1 µm to 10 µm, about 10 µm to 20 µm, about 20 µm to 30 µm, about 30 µm to 40 µm, or about 40 µm to 50 µm.

Figure 17A:
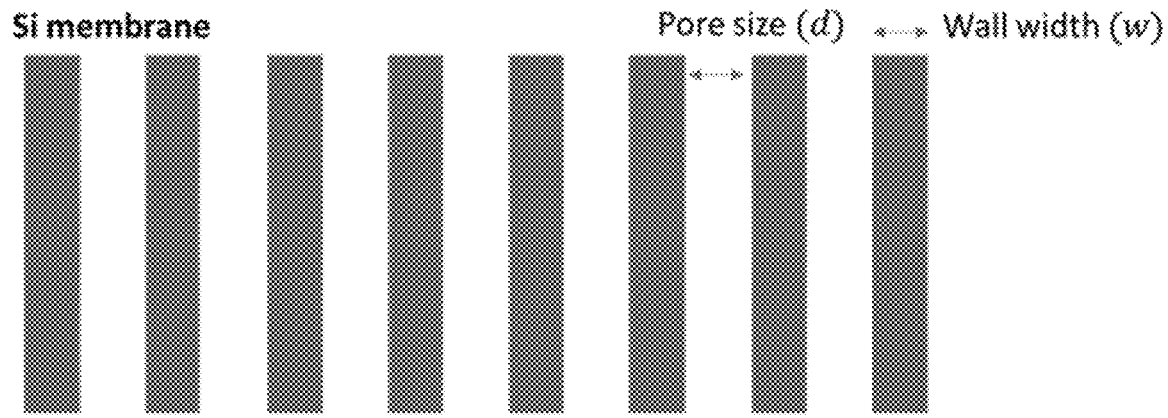
FIG. 17A shows schematic of an example silicon membrane architecture prior to thin film deposition.
Figure 17B:
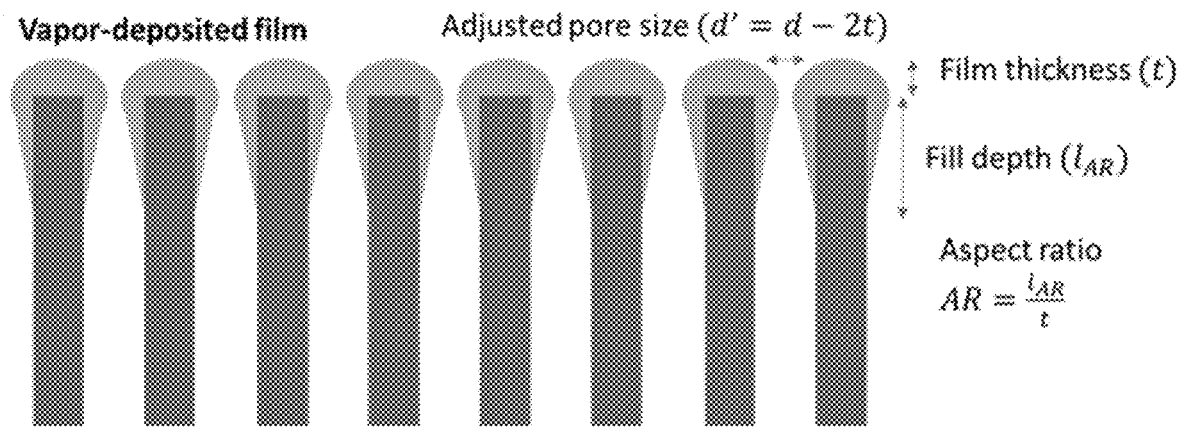
FIG. 17B shows an example silicon membrane including a metal and/or dielectric layer.
Figure 17C:
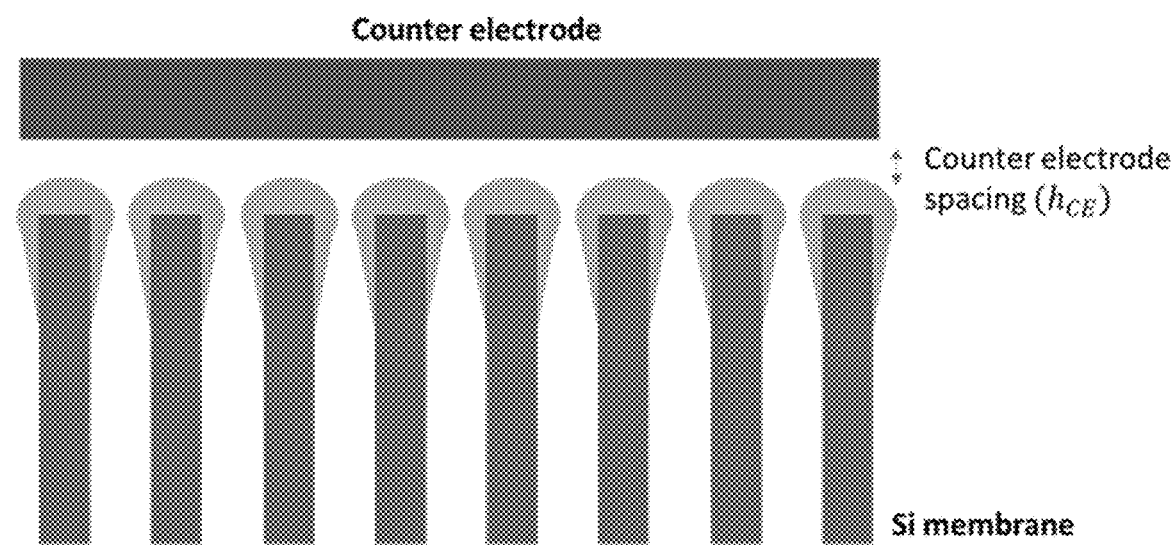
FIG. 17C shows an example hybrid structure and counter electrode schematic, showing the counter-electrode spacing $h_{CE}$.
Figure 17D:
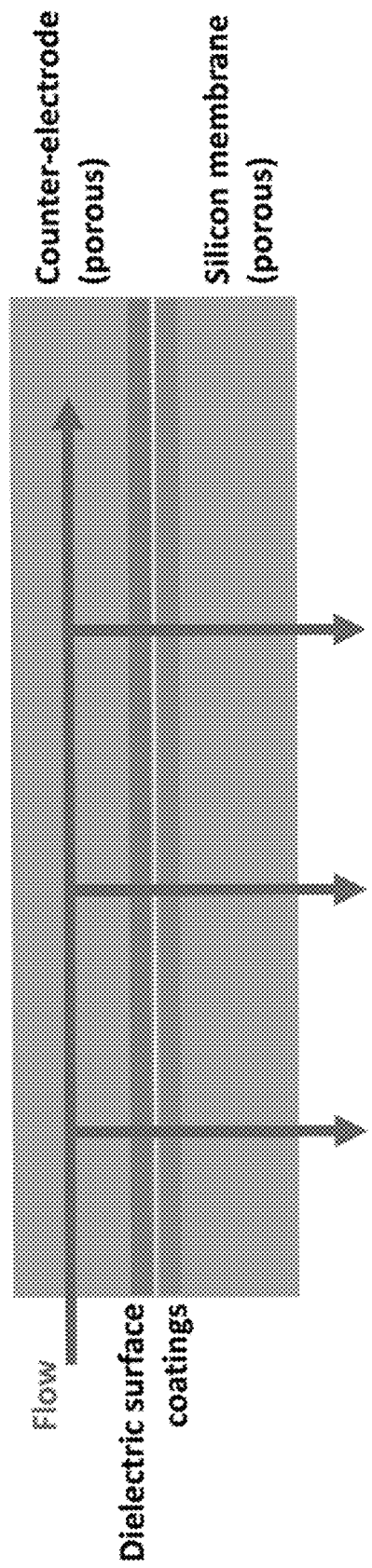
FIG. 17D shows an example of a membrane and counter-electrode very close together using a dielectric separator.

In an additional embodiment, the membrane/electrode may be modified using vapor-deposited coatings or atomic layer deposition (ALD) for improved membrane electrical and electrostatic functionality, as seen in FIGS. 17A-17C.

This method produces a membrane structure with a thin layer of material grown around the openings of larger pores, creating a finer porosity at the membrane surface. FIG. 17A shows an example silicon membrane with an aggressive etch to form high porosity. High porosity may include volumetric porosity or surface porosity. In an example, high porosity may be a volumetric porosity greater than 1%, or a surface porosity greater than 1% on both surfaces of the membrane. FIG. 17B shows controlled iterative deposition of materials to narrow the pores to the desired diameter.

This method may be used for fine tuning pore structure, and simultaneously improving membrane design to facilitate electrofiltration, by enabling the counter electrode to be very close, or even touching the dielectric coating surface without electrical shorting between the counter electrode and the silicon membrane. In this embodiment, metal and dielectric coatings may be added to silicon membranes to impart electrical functionality to enable high electric fields on the surface and within the porous structures. The over-layer of film may include the following stack: (1) [porous Si/Dielectric]; or (2) [porous Si/Metal/Dielectric]. These coatings may be used to improve the electrical conductivity across the silicon wafer, and in some cases, suppress charge transfer into the solution, thereby maximizing use of dielectric and electrostatic effects to enable separations based on charge.

In motif (1), the Si is used as a conductive working electrode (WE), where a dielectric is added to suppress charge transfer while maintaining a tunable surface charge in solution. Charge transfer is possible below the dielectric layer, but is suppressed due to the high solution resistance within porous structures. In motif (2), a metal may be deposited to reduce series resistance in the electrochemical cell, while the dielectric serves the same function as in motif (1). In both cases, due to the dielectric nature of the topmost coating, the counter electrode (CE) may be placed close to the WE with a small gap, or may be contacted with the top surface. A sufficiently thick dielectric layer prevents electrical shorting between the WE and CE. As such, the physical gap between the WE and CE ($h_{CE}$) can effectively be reduced to about 0 nm to 1 nm (i.e. contacting the top surface), 1 nm to 1 µm, about 1 nm to 10 nm, about 10 nm to 50 nm, about 50 nm to 100 nm, about 100 nm to 500 nm, or about 500 nm to 1 µm, depending on the thickness of the dielectric layer.

The dielectric layer may include, but is not limited to Al oxides, Si oxides, Ti oxides, Hf oxides, Sn oxides, Fe oxides, or combinations thereof. In alternative embodiments, oxides can be chosen for their chemical reactivity or photoreactivity, such as Fe and Ti, where the membrane is imparted with additional catalytic functionality. Non-limiting examples of metals include Ti, Ag, Si, Pt, Pd, Au, W, Al, and combinations thereof.

The pore sizes in the silicon membrane may range from about 0.5 nm to 500 µm, about 0.5 nm to 1 nm, about 1 nm to 10 nm, about 10 nm to 50 nm, about 50 nm to 100 nm, about 100 nm to 500 nm, about 500 nm to 1 µm, about 1 µm to 10 µm, about 10 µm to 50 µm, about 50 µm to 100 µm, about 100 µm to 200 µm, about 200 µm to 300 µm, about 300 µm to 400 µm, about 400 µm to 500 µm, or combinations thereof. Moreover, by leveraging tunable conformality of coatings depending on the specific techniques and parameters used, selective deposition and pore narrowing may be achieved at the surface of the membrane, as opposed to throughout the membrane, allowing for an effectively asymmetric membrane architecture. In some aspects, only the top about 10 nm to 100 nm of the membrane may be selective with a small pore size, where below the deposited layer, larger pores are preserved to act as a support and thus maximize water permeability through the stack beyond the selective layer. For example, the membrane may have pores with a pore size of 100 nm or greater and a coating on the surface of the membrane with a pore size of 100 nm or less. In various examples, the coating/deposited layer may have a thickness ranging from 1 nm to 100 µm, about 1 nm to 10 nm, about 10 nm to 50 nm, about 50 nm to 100 nm, about 100 nm to 500 nm, about 500 nm to 1 µm, about 1 µm to 10 µm, about 10 µm to 50 µm, or about 50 µm to 100 µm.

To enable such coatings, a variety of techniques can be used. Non-limiting examples of coating methods include magnetron sputtering, atomic layer deposition (ALD), CVD, PECVD, thermal evaporation, or electron-beam evaporation. Atop porous structures, the term "AR"—which indicates the aspect ratio of film filling into the pores, is used. For example, sputtering imparts a low AR—which is desirable for high permeability membranes, and to maximize the electric field between the WE and CE. Atomic layer deposition has a high AR, which minimizes charge transfer and improves conformality of dielectric film deposition. For example, FIG. 17B shows the adjusted pore size (d') depends on the initial pore size (d), deposited film thickness (t), and the effective AR depends on the technique used for deposition of the films. In some examples, the AR may range from about 0.1 to 10,000, about 0.1 to 1, about 1 to 10, about 10 to 50, about 50 to 100, about 100 to 1,000, about 1,000 to 5,000, or about 5,000 to 10,000.

Definitions

As used herein, the term "about" is used to provide flexibility to a numerical range endpoint by providing that a given value may be "a little above" or "a little below" the endpoint. For example, the endpoint may be within 10%, 8%, 5%, 3%, 2%, or 1% of the listed value. Further, for the sake of convenience and brevity, a numerical range of "about 50 mg/mL to about 80 mg/mL" should also be understood to provide support for the range of "50 mg/mL to 80 mg/mL" The endpoint may also be based on the variability allowed by an appropriate regulatory body, such as the FDA, USP, etc.

As used herein, "comprises," "comprising," "containing," and "having" and the like can have the meaning ascribed to them in U.S. Patent Law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. In this specification when using an open ended term, like "comprising" or "including," it is understood that direct support should be afforded also to "consisting essentially of" language as well as "consisting of" language as if stated explicitly and vice versa.

As used herein, first, second, third, etc. are used to characterize and distinguish various elements, components, regions, layers and/or sections. These elements, components, regions, layers and/or sections should not be limited by these terms. Use of numerical terms may be used to distinguish one element, component, region, layer and/or section from another element, component, region, layer and/or section. Use of such numerical terms does not imply a sequence or order unless clearly indicated by the context. Such numerical references may be used interchangeably without departing from the teaching of the embodiments and variations herein.

As used herein, the terms "membrane filter", "electrode", and "wafer" may be used interchangeably to mean a nanoporous or macroscopically porous membrane filter as described herein.

As used herein, the terms "battery leachate solution," "black mass leachate," "mixture solution" and "feed solution" may be used interchangeably to refer to the solution entering the membrane filtration system.

As used herein, the terms "compound" and "component" are used to refer to any type of material, without any loss of generality of the material in question. That is, compound may refer to any element, ion, molecule, complex structure(s), or combinations thereof (e.g. metal oxides, metal sulfides).

As used herein, the term "monolithic" means a single, continuous piece of material. In some examples, a "single body" membrane may be a "monolithic" membrane. For example, a membrane consisting of monolithic silicon only includes a single, continuous piece of silicon. In addition, the morphology of monolithic silicon is continuous, i.e. all single crystalline with no internal interfaces, for example with an amorphous silicon layer. In other examples, the membrane can consist of monolithic silicon with one or more layers or coatings.

As used herein, "layer" may refer to a region or section of a monolithic silicon membrane. For example, the layer may be a region or section of a monolithic membrane with a smaller pore size than the rest of the monolithic membrane.

EXAMPLES

Figure 5H:
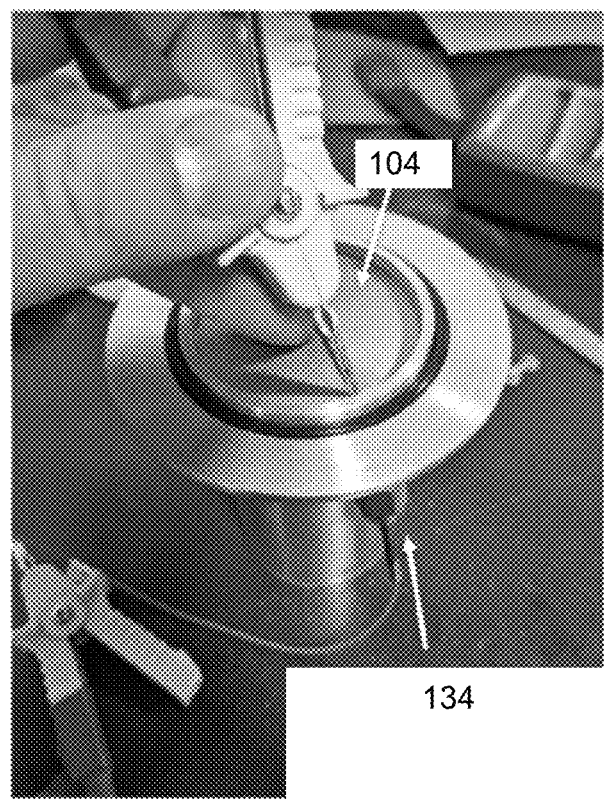
FIG. 5H shows testing of the example membrane filtration system of FIGS. 5A-5F.

An example system with a silicon membrane filter in a pressure cell was tested for validation of electrical current passing into the membrane filter from the electrical contact. FIG. 5H shows the pogo pin was inserted through a port in the pressure cell to form an electrical contact with the interior surface of the silicon membrane, mounted in the cell and a meter probe was placed on the unpolished back side of the silicon membrane. It was assumed that contact resistance on the unpolished side was low. The membrane filter was compressed into the pogo pin down to the O-ring. Resistance was measured at 23-130 Ohms for a 0.4' max compression pin and at 1103-1771 Ohms for a 0.25' max compression pin.

In another example, the resistance of the electrical contact was about 1000 Ohms. The pressure cell was pressurized to 700 psi and held the pressure for 45 minutes without significant leakage or cracking of the wafer. The pressurization was repeated with the same wafer and then 3 more times with different wafers. The pressure was held for about 5 minutes for the repeat tests.

Figure 12:
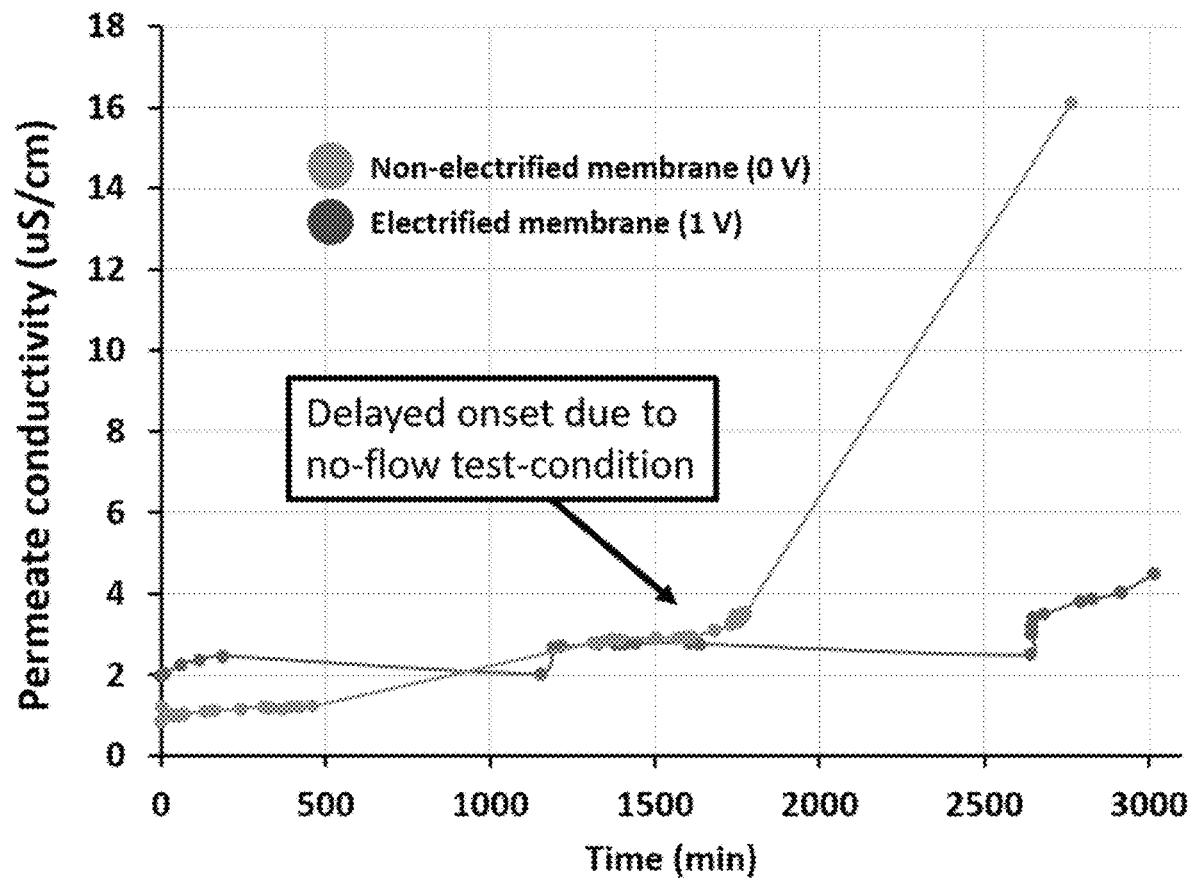
FIG. 12 shows the difference in the transport of an ionic species through an example membrane filter when the membrane is electrified (1 V) and not electrified (0 V).

FIG. 12 shows results from an example electrified filtration. Water was placed in a filtration cell with a silicon membrane filter with a pore size of about 100 nm and a low pressure (50 psi). Once a liquid bridge was formed on both sides of the membrane, the pressure was turned off and $MgSO_4$ was added on one side of the membrane to evaluate diffusive transport in a no-flow condition. The diffusion of $MgSO_4$ across the membrane was then measured. FIG. 12 shows the difference in the flow through of $MgSO_4$ through the membrane via conductivity measurement over time, when the membrane is electrified (1 V) and not electrified (0 V). The diffusion based (non-pressurized flow) filtration experiment with $MgSO_4$ showed a significantly reduced ability of salt to flow through the membrane once an electric field was applied.

As a person skilled in the art will recognize from the previous detailed description and from the figures and claims, modifications and changes can be made to the embodiments of the invention without departing from the scope of this invention as defined in the following claims.

What is claimed is:

1. A membrane nanofiltration system for electrically conductive membrane separation comprising:
   a conductive membrane filter comprising a silicon wafer, wherein the silicon wafer comprises a first region having pores with pore sizes ranging from 1 μm to 10 mm and a second region having pores with pore sizes ranging from 1 nm to 5 μm;
   an electrical contact in contact with the membrane filter, wherein electrical current can flow from the electrical contact to the conductive membrane filter; and
   a counter electrode above a top surface of the membrane electrode,
   wherein the membrane filter, via the electrical contact, and the counter electrode are configured to:
      generate an electric field between the membrane filter and the counter electrode;
      hold the membrane filter at a constant electric potential; or
      flow constant current into the membrane filter, and
   wherein the membrane filter is configured to separate a component from a mixture solution, and
   wherein the pore size of the pores in the first region are different from the pore size of the pores in the second region, and
   wherein the silicon wafer is monolithic silicon and is not bound to a support.

2. The system of claim 1, wherein the component of the mixture solution is selected from the group consisting of Co, Ni, Al, Mn, Fe, Li, Cu, Ag, Zn, Pt, Au, Pd, U, La, Ce, Pr, Nd, Pm, Sm, Eu, Gd, Tb, Dy, Ho, Er, Tm, Yb, Lu, Sc, Y, ions thereof, or mixtures thereof.

3. A membrane nanofiltration system for electrically conductive membrane separation comprising:
   a conductive membrane filter comprising a silicon wafer, wherein the silicon wafer comprises pores with pore sizes ranging from 1 nm to 1 mm;
   an electrical contact in contact with the membrane filter, wherein electrical current can flow from the electrical contact to the conductive membrane filter; and
   a counter electrode above a top surface of the membrane electrode,
   wherein the membrane filter, via the electrical contact, and the counter electrode are configured to:
      generate an electric field between the membrane filter and the counter electrode;
      hold the membrane filter at a constant electric potential; or
      flow constant current into the membrane filter, and
   wherein the membrane filter is configured to separate a component from a mixture solution, wherein the conductive membrane filter further comprises a dielectric, wherein the dielectric is deposited on a surface of the silicon wafer to narrow the pores of the silicon wafer to 1 nm to 5 µm.

4. The system of claim 3, wherein the silicon wafer is monolithic silicon and is not bound to a support.

5. The system of claim 4, wherein the dielectric comprises Al oxides, Si oxides, Ti oxides, Hf oxides, Sn oxides, Fe oxides, or combinations thereof.

6. The system of claim 3, wherein the counter electrode is 0 nm to 1 mm from the conductive membrane filter.

7. The system of claim 6, wherein the counter electrode is 1 nm to 1 µm from the conductive membrane filter.

8. The system of claim 6, wherein the counter electrode is 1 µm to 100 µm from the conductive membrane filter.

9. The system of claim 6, wherein the counter electrode is 500 µm to 1 mm from the conductive membrane filter.

10. The system of claim 4, wherein the dielectric has a thickness of less than about 10 µm.

11. The system of claim 4, wherein the dielectric has a thickness of less than about 1 µm.

12. The system of claim 4, wherein the dielectric has a thickness of less than about 100 nm.

13. The system of claim 3, wherein the pore sizes of the silicon wafer range from 1 nm to 5 µm.

14. The system of claim 3, wherein the pore sizes of the silicon wafer range from 1 µm to 500 µm.

15. The system of claim 3, wherein the pore sizes of the silicon wafer range from 5 µm to 1 mm.

16. The system of claim 3, wherein the component of the mixture solution is selected from the group consisting of Co, Ni, Al, Mn, Fe, Li, Cu, Ag, Zn, Pt, Au, Pd, U, La, Ce, Pr, Nd, Pm, Sm, Eu, Gd, Tb, Dy, Ho, Er, Tm, Yb, Lu, Sc, Y, ions thereof, or mixtures thereof.

17. The system of claim 1, wherein the pore sizes of the first region range from 1 µm to 1 mm.

18. The system of claim 1, wherein the pore sizes of the first region range from 1 mm to 5 mm.

19. The system of claim 1, wherein the pore sizes of the first region range from 5 mm to 10 mm.

* * * * *